US012087589B2

(12) United States Patent
Sekiya

(10) Patent No.: US 12,087,589 B2
(45) Date of Patent: Sep. 10, 2024

(54) METHOD OF MANUFACTURING WAFER AND METHOD OF MANUFACTURING STACKED DEVICE CHIP

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 410 days.

(21) Appl. No.: 17/652,371

(22) Filed: Feb. 24, 2022

(65) Prior Publication Data
US 2022/0293424 A1 Sep. 15, 2022

(30) Foreign Application Priority Data
Mar. 9, 2021 (JP) .................................. 2021-037483

(51) Int. Cl.
*H01L 21/304* (2006.01)
*H01L 21/67* (2006.01)
*H01L 21/683* (2006.01)
*H01L 21/78* (2006.01)

(52) U.S. Cl.
CPC ...... *H01L 21/304* (2013.01); *H01L 21/67011* (2013.01); *H01L 21/6835* (2013.01); *H01L 21/78* (2013.01)

(58) Field of Classification Search
CPC ............. H01L 21/304; H01L 21/67011; H01L 21/6835; H01L 21/78; H01L 21/67092; H01L 25/0657; H01L 25/50; H01L 2221/68327; H01L 2225/06541; H01L 21/30608; H01L 21/3065
See application file for complete search history.

(56) References Cited

U.S. PATENT DOCUMENTS

| | | | |
|---|---|---|---|
| 7,378,288 B2 | 5/2008 | Tran et al. | |
| 7,952,184 B2 | 5/2011 | Farrar et al. | |
| 8,045,132 B2 | 10/2011 | Kawada et al. | |
| 8,470,642 B2 * | 6/2013 | Farrar | H01L 23/473 257/E21.705 |
| 8,883,565 B2 | 11/2014 | Vaupel et al. | |
| 2005/0221728 A1 | 10/2005 | Cheong | |
| 2010/0202126 A1 | 8/2010 | Nakamura et al. | |
| 2012/0315710 A1 | 12/2012 | Hozawa et al. | |
| 2013/0062800 A1 | 3/2013 | Arai | |

(Continued)

FOREIGN PATENT DOCUMENTS

JP 2012134334 A 7/2012
JP 2020194936 A 12/2020

*Primary Examiner* — Yasser A Abdelaziez
(74) *Attorney, Agent, or Firm* — GREER BURNS & CRAIN, LTD.

(57) ABSTRACT

A method of manufacturing a wafer includes a wafer preparing step of preparing a wafer having semiconductor devices formed in a plurality of respective areas demarcated thereon by a plurality of intersecting streets, a removing step of removing from the wafer a defective device region including a semiconductor device determined as a defective product among the semiconductor devices formed on the wafer, an enlarging step of enlarging a removed region formed in the wafer by removing the defective device region from the wafer, and an inlaying step of inlaying a device chip including a non-defective semiconductor device that is functionally identical to the semiconductor device determined as the defective product, in the enlarged removed region.

5 Claims, 38 Drawing Sheets

(56) References Cited

U.S. PATENT DOCUMENTS

| | | |
|---|---|---|
| 2017/0186730 A1 | 6/2017 | Shen et al. |
| 2018/0233410 A1* | 8/2018 | James ............... H01L 21/78 |
| 2019/0311952 A1 | 10/2019 | Nishida et al. |
| 2020/0068709 A1 | 2/2020 | Schulze et al. |
| 2020/0279835 A1 | 9/2020 | Sasaki et al. |
| 2021/0005520 A1 | 1/2021 | Ishio et al. |
| 2022/0157658 A1 | 5/2022 | Kim et al. |
| 2022/0157659 A1 | 5/2022 | Kim et al. |
| 2022/0157660 A1 | 5/2022 | Kim et al. |
| 2022/0157667 A1 | 5/2022 | Kim et al. |
| 2022/0157668 A1 | 5/2022 | Kim et al. |
| 2022/0157669 A1 | 5/2022 | Kim et al. |

* cited by examiner

FIG. 1 1 A
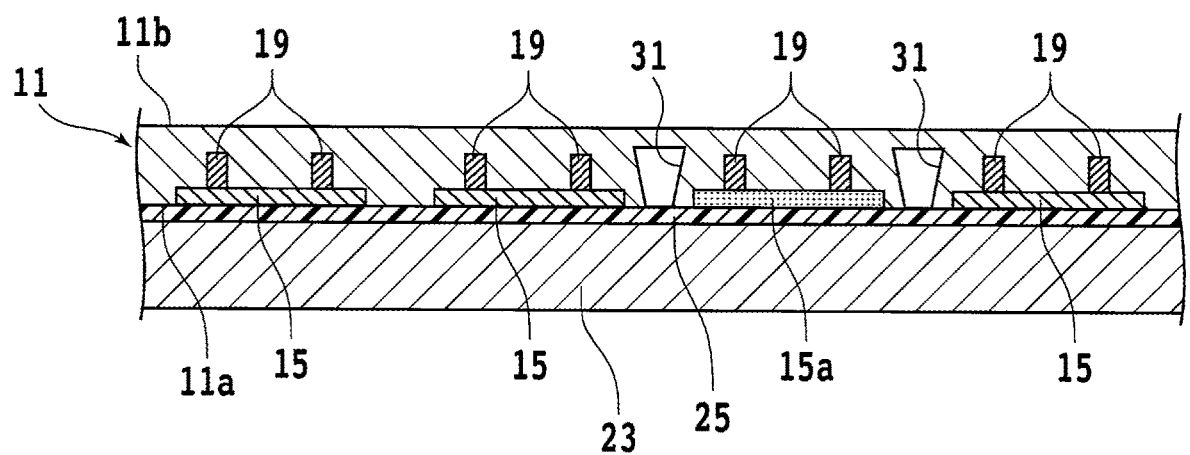
FIG. 1 1 B
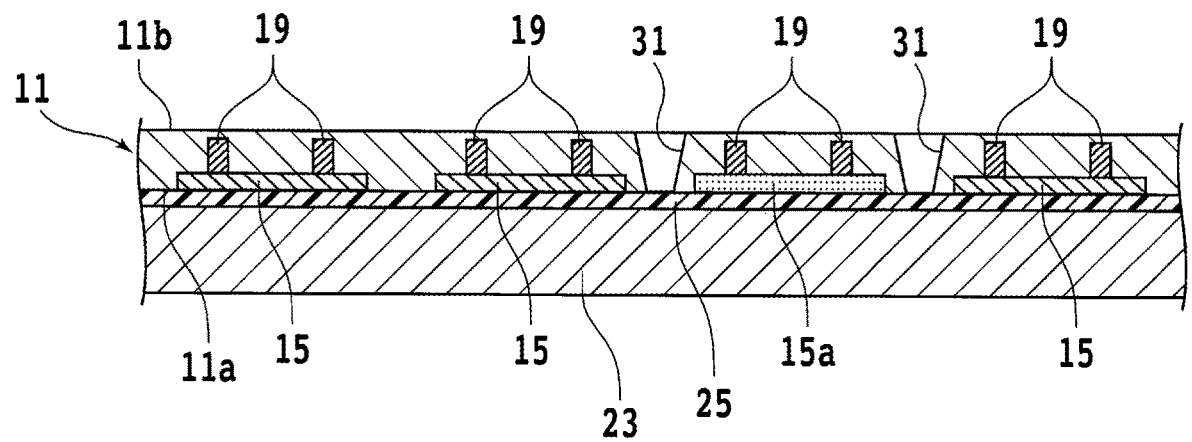

METHOD OF MANUFACTURING WAFER AND METHOD OF MANUFACTURING STACKED DEVICE CHIP

BACKGROUND OF THE INVENTION

Field of the Invention

The present invention relates to a method of manufacturing a wafer including a plurality of semiconductor devices and a method of manufacturing a stacked device chip including a plurality of stacked semiconductor devices.

Description of the Related Art

According to processes of manufacturing device chips, a wafer including a plurality of semiconductor devices formed in respective areas demarcated on the wafer by a grid of streets or projected dicing lines is processed. The wafer is divided along the streets into the device chips having the respective semiconductor devices. The device chips will be incorporated in various electronic appliances such as mobile phones and personal computers.

Recent years have seen a technology for manufacturing device chips each including a plurality of stacked semiconductor devices, i.e., stacked device chips. For example, a stacked device chip is produced by stacking a plurality of device chips and interconnecting semiconductor devices therein with through-silicon vias (TSV) that extend transversely through the device chips. Since the through-silicon vias make interconnects that interconnect semiconductor devices shorter than wire bonding or the like, they are conducive to smaller stacked device chips and higher processing rates.

A process referred to as "Wafer on Wafer" (WoW) has been proposed as a process of manufacturing stacked device chips. According to the proposed process, a plurality of wafers are stacked, and semiconductor devices on the wafers are interconnected by electrodes extending through the stacked wafers, thereby producing a stacked wafer. The stacked wafer is then divided along streets thereon into stacked device chips.

Some wafers to be used for manufacturing stacked device chips may include defective semiconductor devices, i.e., defective devices. When a stacked wafer produced by stacking wafers including defective devices is divided, stacked device chips including those defective devices are produced from the stacked wafer. If some semiconductor devices included in stacked device chips are defective, then the stacked device chips are determined as defective products, i.e., defective chips, even though other semiconductor devices included therein are non-defective. Accordingly, the fabrication of stacked device chips is strongly affected by a reduction of the yield due to defective devices.

Therefore, prior to stacking a plurality of wafers, an inspection is carried out to determine whether each of the semiconductor devices included in each wafer is non-defective or defective. Then, an optimum combination of wafers to be used to manufacture stacked device chips is determined on the basis of the number, layout, etc. of defective devices included in the wafers (see JP2012-134334A). In this manner, the number of stacked device chips including defective devices is held to a minimum, restraining a drop in the yield.

However, as long as wafers including defective devices are used, at least a certain number of defective device chips are inevitably fabricated, and hence there is a limitation on efforts to reduce the number of fabricated defective device chips. In view of these drawbacks, there has been proposed a process of cutting out areas including defective devices, i.e., defective device regions, from a wafer, and inlaying device chips including non-defective semiconductor devices into the spaces left in the wafer after the defective device regions have been cut out (see JP2020-194936A). According to the proposed process, the wafer is free of defective devices, resulting in an increase in the yield of stacked device chips.

SUMMARY OF THE INVENTION

As described above, a wafer that does not include defective devices can be manufactured by cutting out defective device regions and inlaying device chips in the spaces left in the wafer after the defective device regions have been cut out. However, semiconductor devices formed on a wafer are microscopic in size and are often arrayed in a highly packed layout. Therefore, although it is possible to cut out defective device regions from the wafer, it may be difficult in some cases to control in a rigorous manner the size of the spaces left in the wafer after the defective device regions have been cut out. If the spaces left in the wafer are not of a desired size and the dimensions of the spaces in the wafer and the dimensions of the device chips to be inlaid therein do not match each other, the device chips may not be properly inlaid in the spaces in the wafer. In such a case, it is necessary to perform processes of finely adjusting the dimensions of the device chips, remaking the device chips, etc., thereby increasing an expenditure of labor and cost required to produce wafers free of defective devices.

The present invention has been made in view of the above problems. It is an object of the present invention to provide a method of efficiently manufacturing a wafer free of defective devices and a method of manufacturing a stacked device chip from a wafer manufactured by such a method.

In accordance with an aspect of the present invention, there is provided a method of manufacturing a wafer, including a wafer preparing step of preparing a wafer having semiconductor devices formed in a plurality of respective areas demarcated thereon by a plurality of intersecting streets, a removing step of removing from the wafer a defective device region including a semiconductor device determined as a defective product among the semiconductor devices formed on the wafer, an enlarging step of enlarging a removed region formed in the wafer by removing the defective device region from the wafer, and an inlaying step of inlaying a device chip including a non-defective semiconductor device that is functionally identical to the semiconductor device determined as the defective product, in the enlarged removed region.

Preferably, the enlarging step includes a step of enlarging the removed region by heating the wafer.

In accordance with another aspect of the present invention, there is provided a method of manufacturing a stacked device chip, including a wafer preparing step of preparing a first wafer and a second wafer, each having semiconductor devices formed in a plurality of respective areas demarcated thereon by a plurality of intersecting streets, a removing step of removing from the first wafer a defective device region including a semiconductor device determined as a defective product among the semiconductor devices formed on the first wafer, an enlarging step of enlarging a removed region formed in the first wafer by removing the defective device region from the first wafer, an inlaying step of inlaying a device chip including a non-defective semiconductor device that is functionally identical to the semiconductor device determined as the defective product, in the enlarged removed region, a wafer stacking step of stacking the second wafer on the first wafer, thereby forming a stacked wafer, and a dividing step of dividing the stacked wafer along the streets to form stacked device chips including a plurality of stacked semiconductor devices.

Preferably, the enlarging step includes a step of enlarging the removed region by heating the first wafer. Preferably, the wafer stacking step includes the removing step, the enlarging step, and the inlaying step that are carried out on the second wafer stacked on the first wafer.

In the method of manufacturing a wafer according to the aspect of the present invention, a defective device region including a semiconductor device determined as a defective product is removed from a wafer, and a device chip including a non-defective semiconductor device is inlaid in a removed region formed in the wafer by the removal of the defective device region therefrom. In this fashion, a wafer free of defective devices is manufactured. Wafers free of defective devices are stacked into a stacked wafer, and the stacked wafer is divided into stacked device chips that are free of defective devices. As a result, the yield of stacked device chips is prevented from being reduced.

In the method of manufacturing a wafer according to the aspect of the present invention, furthermore, before the device chip is inlaid in the removed region left in the wafer by the removal of the defective device region, the removed region is enlarged. Therefore, even in the case where the removed region is not sufficiently large at the time the defective device region is removed, the device chip can reliably be inlaid in the removed region. Therefore, it is not necessary to adjust the dimensions of the device chip and remake the device chip, making it possible to efficiently manufacture a wafer free of defective devices.

The above and other objects, features and advantages of the present invention and the manner of realizing them will become more apparent, and the invention itself will best be understood from a study of the following description and appended claims with reference to the attached drawings showing preferred embodiments of the invention.

BRIEF DESCRIPTION OF THE DRAWINGS

FIG. 11A is a fragmentary cross-sectional view of the wafer that has been fixed to a support board;
FIG. 11B is a fragmentary cross-sectional view of the wafer after it has been ground.

DETAILED DESCRIPTION OF THE PREFERRED EMBODIMENTS

First Embodiment

Figure 1A:
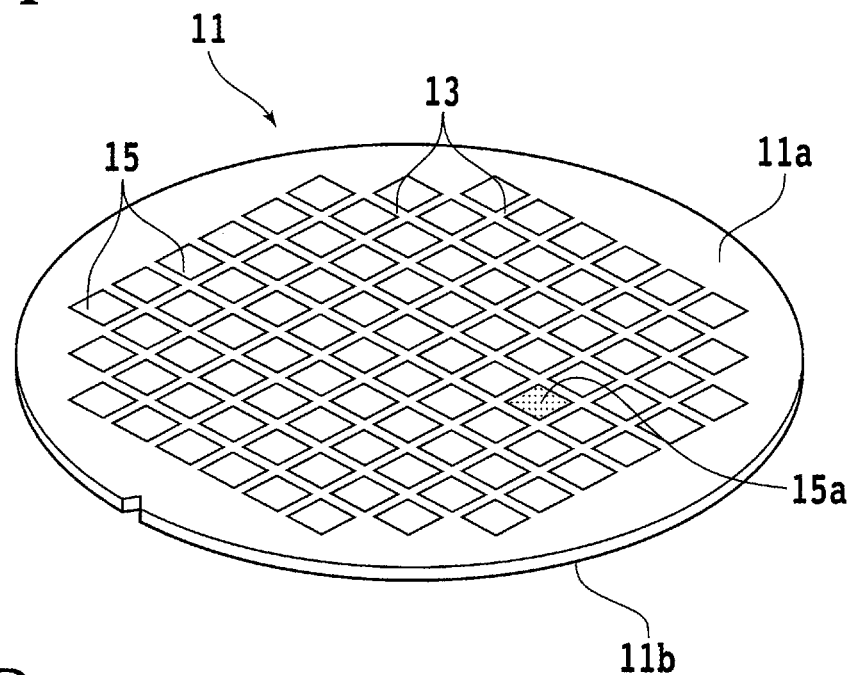
FIG. 1A is a perspective view of a wafer.
Figure 1B:
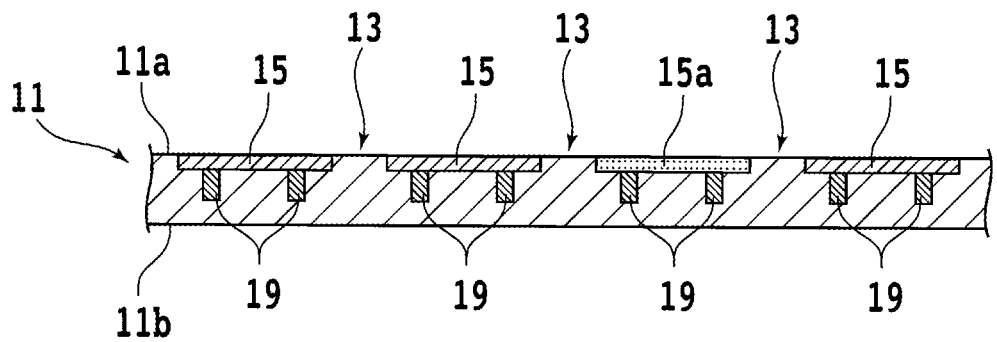
FIG. 1B is a fragmentary cross-sectional view of the wafer.

A preferred embodiment of the present invention will be described hereinbelow with reference to the accompanying drawings. First, a structural example of a wafer that can be used in the present embodiment will be described below. FIG. 1A illustrates a wafer 11 in perspective, and FIG. 1B illustrates the wafer 11 in fragmentary cross section.

For example, the wafer 11 is a disk-shaped silicon wafer having a face side, i.e., a first surface, 11a and a reverse side, i.e., a second surface, 11b that is opposite the face side 11a. The face side 11a and the reverse side 11b lie generally parallel to each other.

The wafer 11 has a plurality of rectangular areas demarcated on the face side 11a by a plurality of streets or projected dicing lines 13 arranged in a grid pattern where two groups of streets 13 intersect with each other. The areas demarcated on the face side 11a by the streets 13 include respective semiconductor devices 15, such as integrated circuits (ICs), large-scale-integration (LSI) circuits, light-emitting diodes (LEDs), or microelectromechanical systems (MEMS), formed therein.

The wafer 11 is not limited to any particular materials, shapes, structures, sizes, etc. For example, the wafer 11 may be made of a semiconductor such as GaAs, InP, GaN, or SiC other than silicon, glass, ceramic, resin, metal, and so on. The semiconductor devices 15 are not limited to particular kinds, quantities, shapes, structures, sizes, etc.

Figure 1C:
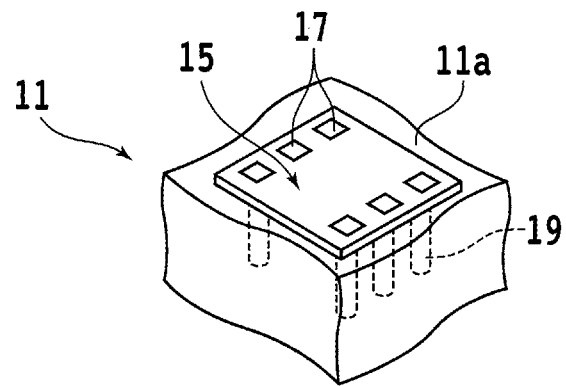
FIG. 1C is a perspective view of a semiconductor device.

FIG. 1C illustrates one of the semiconductor devices 15 in perspective. As the semiconductor devices 15 are identical in structure to each other, only one of them will be described below. The semiconductor device 15 includes, for example, a plurality of electrodes 17 exposed on an upper surface thereof for connection to other interconnects, electrodes, semiconductor devices, etc. Connection electrodes such as bumps or the like may be formed on exposed surfaces of the electrodes 17.

A plurality of electrodes 19 such as via electrodes or through electrodes are embedded in each of the areas demarcated on the face side 11a by the streets 13. The electrodes 19 extend like columns along thicknesswise directions across the wafer 11 and are connected to the electrodes 17 of the semiconductor devices 15. The electrodes 19 are not limited to any particular materials, and may be made of metal such as copper, tungsten, or aluminum, for example.

Each of the electrodes 19 extends from the semiconductor devices 15 toward the reverse side 11b of the wafer 11, and has a length or height smaller than the thickness of the wafer 11. Therefore, the electrodes 19 are not exposed on the reverse side 11b of the wafer 11, and are embedded within the wafer 11. Insulating layers, not illustrated, for insulating the wafer 11 and the electrodes 19 are disposed between the wafer 11 and the electrodes 19.

When the reverse side 11b of the wafer 11 is ground, etched, or otherwise processed to thin down the wafer 11, the electrodes 19 are eventually exposed on the reverse side 11b.

If a plurality of wafers 11 each having electrodes 19 exposed on the reverse side 11b are stacked one on another, then a stacked wafer that includes a plurality of semiconductor devices 15 stacked one on another is obtained. The stacked semiconductor devices 15 are interconnected by the electrodes 19.

The stacked wafer is then divided along the streets 13 by a cutting process, a laser beam process, or the like, producing a plurality of device chips each including a plurality of stacked semiconductor devices 15, i.e., stacked device chips.

The wafer 11 may include defective products as semiconductor devices 15, i.e., defective devices. FIGS. 1A and 1B illustrate the wafer 11 that includes a defective device 15a. The defective device 15a is a semiconductor device 15 that does not fulfil predetermined standards for electric characteristics thereof, for example.

If a plurality of wafers 11, at least one of which includes the defective device 15a, are stacked into a stacked wafer and the stacked wafer is divided, then a stacked device chip including the defective device 15a is produced. The stacked device chip including the defective device 15a is assessed as a whole as a defective product, i.e., a defective chip, even though the other semiconductor devices 15 included therein are non-defective.

In a method of manufacturing a wafer according to the present embodiment, the defective device 15a is removed from the wafer 11. Then, a non-defective semiconductor device 15 is inlaid in a region or space that has been left in the wafer 11 by the removal of the defective device 15a therefrom. In this manner, the wafer 11 that is free of the defective device 15a is produced. A specific example of the method of manufacturing a wafer according to the present embodiment will be described hereinbelow.

First, the wafer 11 (see FIGS. 1A and 1B) including the semiconductor devices 15 formed in the respective areas demarcated on the face side 11a by the intersecting streets 13 is prepared (wafer preparing step). Since a plurality of wafers will be stacked into a stacked wafer in a subsequent step, it is preferable to prepare at least two wafers in the wafer preparing step.

Figure 2:
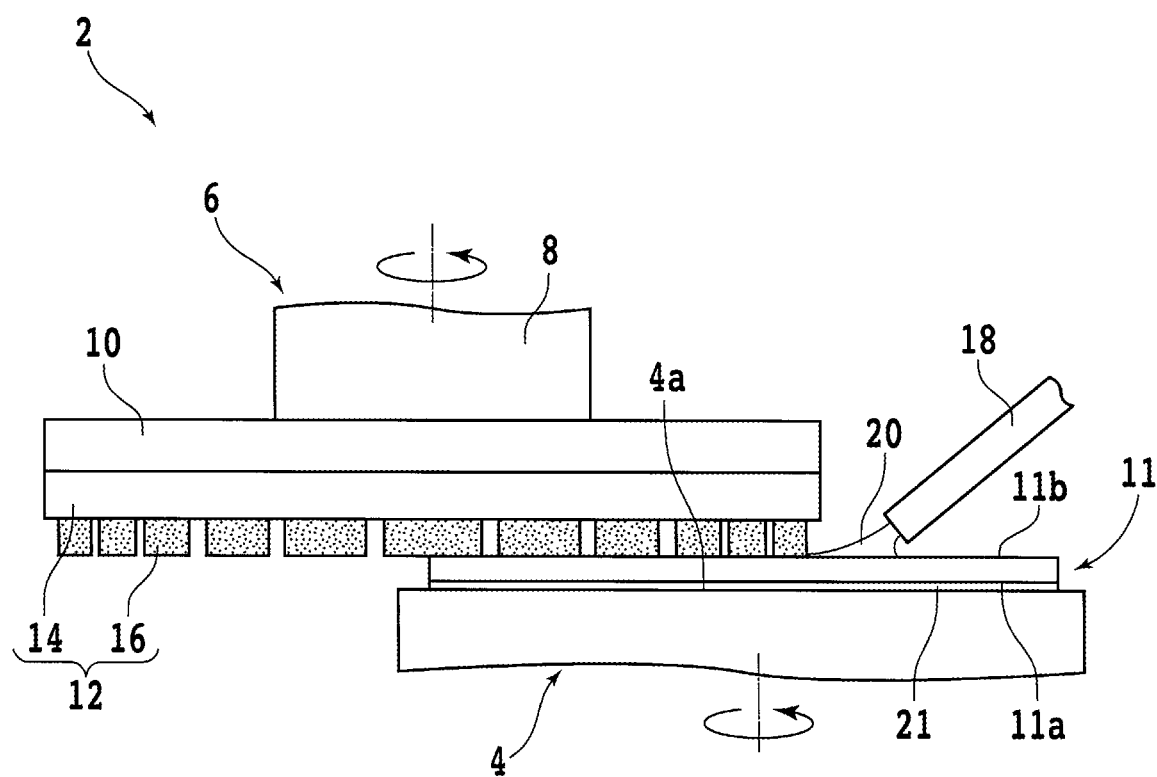
FIG. 2 is a fragmentary front elevational view of a grinding apparatus.

Then, the wafer 11 is ground to be thinned down (grinding step). The wafer 11 is ground using a grinding apparatus, for example. FIG. 2 illustrates the grinding apparatus, denoted by 2, in plan. The grinding apparatus 2 includes a chuck table 4 for holding the wafer 11 thereon and a grinding unit 6 for grinding the wafer 11 on the chuck table 4.

The chuck table 4 has an upper surface that provides a flat holding surface 4a for holding the wafer 11 thereon. The holding surface 4a is held in fluid communication with a suction source, not illustrated, such as an ejector through a fluid channel, not illustrated, defined in the chuck table 4. The chuck table 4 is connected to a moving mechanism, not illustrated, for moving the chuck table 4 along horizontal directions. The moving mechanism may be a ball-screw-type moving mechanism, a turntable for supporting and rotating the chuck table 4 about its central axis, or the like. The chuck table 4 is also coupled to a rotary actuator, not illustrated, such as an electric motor for rotating the chuck table 4 about its central axis generally parallel to vertical directions.

The grinding unit 6 is disposed above the chuck table 4. The grinding unit 6 includes a hollow cylindrical spindle 8 extending vertically. A disk-shaped mount 10 made of metal or the like is fixed to a distal end, i.e., a lower end, of the spindle 8. A rotary actuator, not illustrated, such as an electric motor for rotating the spindle 8 about its central axis is connected to a proximal end, i.e., an upper end, of the spindle 8.

A grinding wheel 12 for grinding the wafer 11 is mounted on a lower surface of the mount 10. The grinding wheel 12 includes an annular base 14 made of metal such as stainless steel or aluminum and having generally the same diameter as the mount 10. A plurality of grindstones 16 are fixed to a lower surface of the base 14. The grindstones 16, each shaped as a rectangular parallelepiped, are spaced at substantially equal intervals and arranged as an annular array along an outer circumferential edge of the base 14. The base 14 and the grindstones 16 jointly make up the grinding wheel 12.

The grinding wheel 12 is rotatable about a rotational axis generally parallel to the vertical directions by power transmitted from the rotary actuator connected to the spindle 8 through the spindle 8 and the mount 10. A ball-screw-type moving mechanism, not illustrated, for lifting and lowering the grinding unit 6 along the vertical directions is coupled to the grinding unit 6. A nozzle 18 for supplying a grinding fluid 20 such as pure water to the wafer 11 held on the chuck table 4 and the grindstones 16 is disposed in the vicinity of the grinding unit 6.

The grinding apparatus 2 grinds the reverse side 11b of the wafer 11, for example. In this case, a protective member 21 is affixed to the face side 11a of the wafer 11 where the semiconductor devices 15 are disposed. The semiconductor devices 15 are thus covered and protected by the protective member 21.

The protective member 21 may be a circular protective tape including a film-shaped base and an adhesive layer, i.e., a glue layer, on the base. For example, the base is made of a resin such as polyolefin, polyvinyl chloride, or polyethylene terephthalate, whereas the adhesive layer is made of an epoxy-based adhesive, an acrylic-based adhesive, or a rubber-based adhesive. Alternatively, the adhesive layer may be made of an ultraviolet-curable resin that can be cured upon exposure to ultraviolet rays.

The wafer 11 is held on the chuck table 4. Specifically, the wafer 11 is placed on the chuck table 4 such that the face side 11a, i.e., the protective member 21 thereon, faces the holding surface 4a and the reverse side 11b is exposed upwardly. Then, when a negative pressure generated by the suction source is applied to the holding surface 4a, the face side 11a of the wafer 11 is attracted to and held under suction on the chuck table 4 with the protective member 21 interposed therebetween.

Then, the chuck table 4 is moved to a position below the grinding unit 6. While the chuck table 4 and the grinding wheel 12 are being rotated about their central axes in respective predetermined directions at predetermined rotational speeds, the grinding wheel 12 is lowered toward the chuck table 4 to bring the grindstones 16 into abrasive contact with the wafer 11. At this time, the speed at which the grinding wheel 12 is lowered is adjusted to press the grindstones 16 against the wafer 11 under an appropriate force.

When the grindstones 16 contact with the reverse side 11b of the wafer 11, the grindstones 16 start to scrape wafer material particles off the reverse side 11b. The grindstones 16 thus grind the reverse side 11b, thinning down the wafer 11. When the wafer 11 is thinned down to a predetermined thickness, the grinding unit 6 stops grinding the wafer 11. Thereafter, the ground wafer 11 is removed from the chuck table 4, and the protective member 21 is peeled off from the wafer 11.

Before or after the grinding step, an inspection is conducted to determine whether each of the semiconductor devices 15 included in the wafer 11 is non-defective or defective. In the inspection, for example, a metal probe is applied to the electrode 17 exposed on the surface of each of the semiconductor devices 15 and measures or probes the electric characteristics of the semiconductor device 15. Then, it is determined whether the semiconductor device 15 is non-defective or defective on the basis of whether the measured electric characteristics fulfil predetermined standards for the electric characteristics or not.

If the wafer 11 includes a defective semiconductor device 15, i.e., a defective device 15a, then the inspection assesses the defective semiconductor device 15 as a defective product. Then, the position of the defective semiconductor device 15 assessed as a defective product in the wafer 11 is recorded.

Figure 3A:
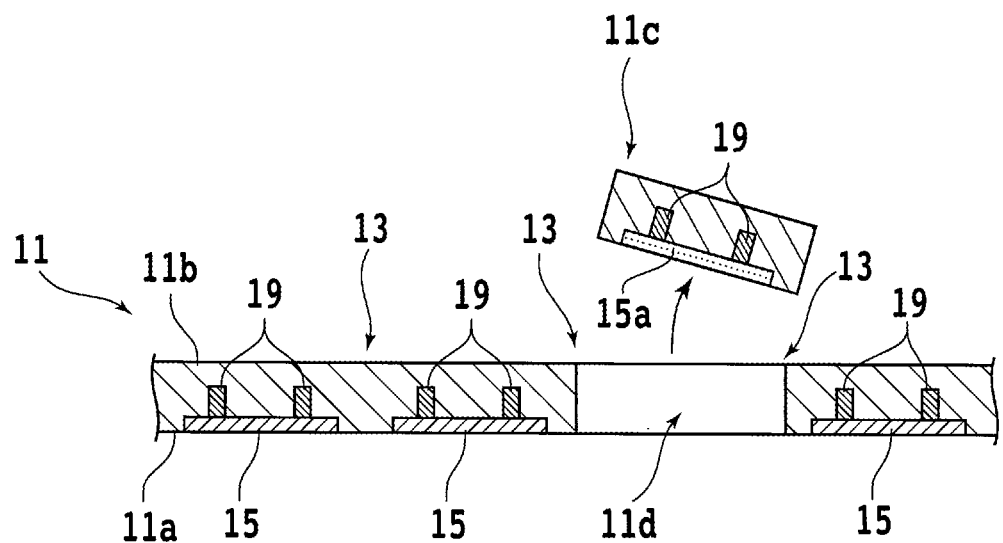
FIG. 3A is a fragmentary cross-sectional view of the wafer in a removing step.

Next, a defective device region that contains the defective semiconductor device 15 assessed as a defective product, i.e., the defective device 15a, among the semiconductor devices 15 in the wafer 11 is removed from the wafer 11 (removing step). FIG. 3A illustrates the wafer 11 in the removing step in fragmentary cross section.

In the removing step, for example, the wafer 11 is cut along four streets 13 that surround the defective device 15a. Specifically, the defective device region, denoted by 11c, which is shaped as a rectangular parallelepiped, containing the defective device 15a is cut out of the wafer 11. When the defective device region 11c is separated from the wafer 11, it leaves a through hole, i.e., a post-removal void, 11d shaped as a rectangular parallelepiped extending from the face side 11a to the reverse side 11b of the wafer 11.

Figure 3B:
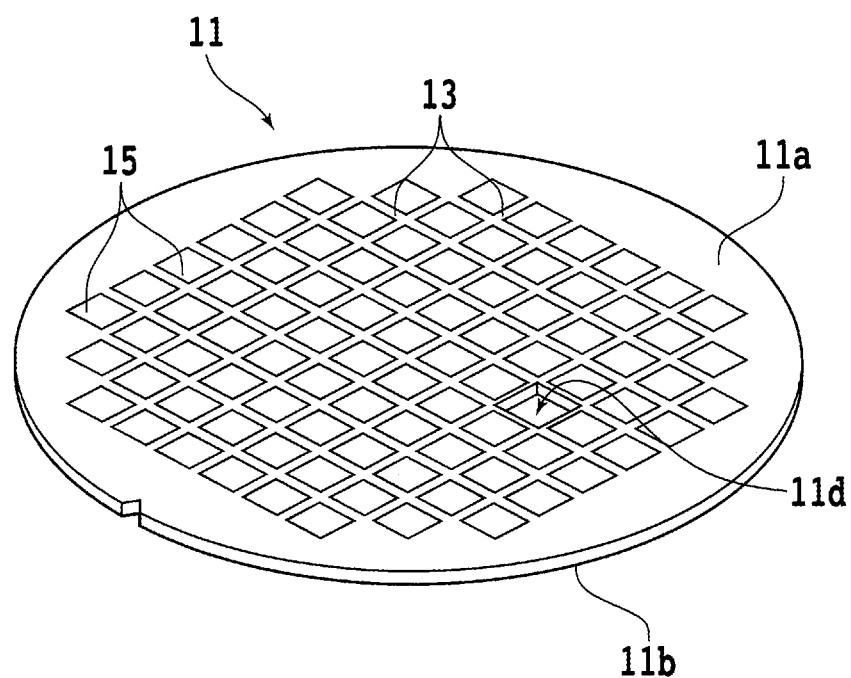
FIG. 3B is a perspective view of the wafer with a through hole formed therein.

FIG. 3B illustrates the wafer 11 with the through hole 11d formed therein in perspective. The wafer 11 becomes free of the defective device 15a when the defective device region 11c has been removed from the wafer 11. If the grinding step (see FIG. 2) described above is carried out prior to the removing step, then since the wafer 11 has been thinned down before the removing step, it is easier to remove the defective device region 11c from the wafer 11. However, the grinding step prior to the removing step may be omitted insofar as the omission of the grinding step is not disruptive to the removal of the defective device region 11c.

Various processes may be used to remove the defective device region 11c. For example, a laser beam is applied to the wafer 11 along those streets 13 that surround the defective device 15a to separate the defective device region 11c from the wafer 11. An example in which laser processing is performed on the wafer 11 in the removing step will be described below.

Figure 4A:
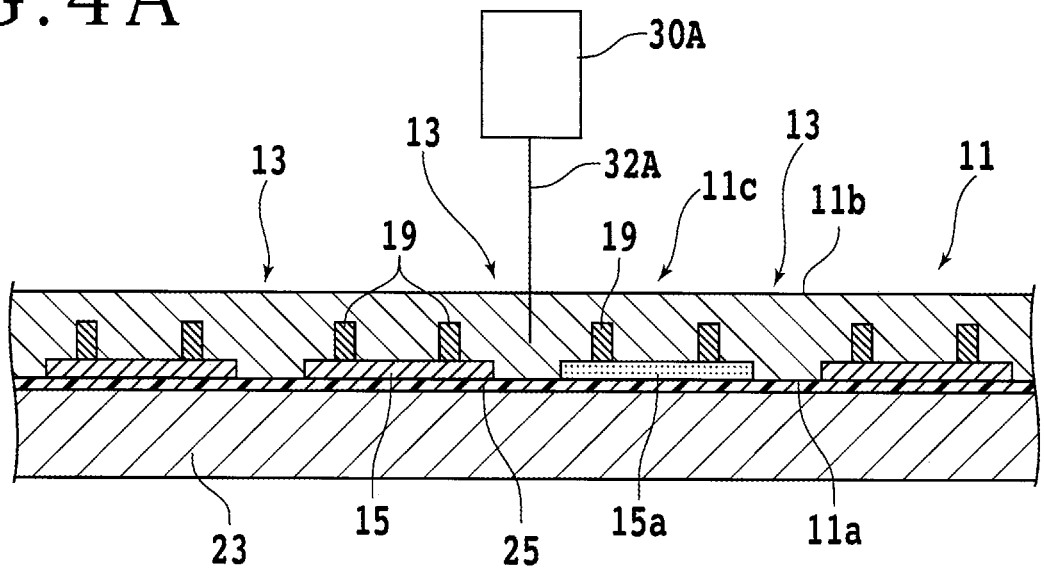
FIG. 4A is a fragmentary cross-sectional view of the wafer to which a laser beam is applied.

FIG. 4A illustrates in fragmentary cross section the wafer 11 to which a laser beam 32A is applied. In the removing step, the face side 11a of the wafer 11 is fixed to a support board 23 that supports the wafer 11 thereon. For example, the support board 23 is a plate-shaped member made of silicon, glass, ceramic, or the like. The face side 11a of the wafer 11 is fixed to the support board 23 with an adhesive layer 25 interposed therebetween. The wafer 11 is thus supported on the support board 23 with the reverse side 11b exposed upwardly.

The adhesive layer 25 is not limited to any particular materials. The material of the adhesive layer 25 is appropriately selected depending on the materials of the wafer 11 and the support board 23. For example, the adhesive layer 25 may be made of an adhesive including a thermosetting resin that can be cured when heated, an adhesive including a thermoplastic resin that can be softened when heated, an adhesive including an ultraviolet-curable resin that can be cured when exposed to ultraviolet radiation, or the like.

Alternatively, the adhesive layer 25 may be a sheet that can be fixed to the wafer 11 and the support board 23 when heated and pressed, i.e., a thermocompression bonding sheet. For example, the adhesive layer 25 is a pliable sheet made of a thermoplastic resin whose melting point is lower than those of the wafer 11 and the support board 23, and does not contain an adhesive, i.e., a glue layer. When the wafer 11 is pressed against the support board 23 with the thermocompression bonding sheet interposed therebetween while the thermocompression bonding sheet is being heated, the thermocompression bonding sheet is brought into intimate contact with the wafer 11 and the support board 23. The wafer 11 is thus fixed to the support board 23. Specific examples of the sheet include a polyolefin (PO) sheet and a polyester (PE) sheet.

The polyolefin sheet is a sheet made of a polymer synthesized with alkene as a monomer. The polyolefin sheet may be, for example, a polyethylene sheet, a polypropylene sheet, a polystyrene sheet, or the like. A sheet made of a copolymer of propylene and ethylene or a sheet made of an olefin elastomer may also be used as the polyolefin sheet.

The polyester sheet is a sheet made of a polymer synthesized with dicarboxylic acid, i.e., a compound having two carboxyl groups, and diol, i.e., a compound having two hydroxyl groups, as a monomer. The polyester sheet may be, for example, a polyethylene terephthalate sheet, a polyethylene naphthalate sheet, or the like. A polytrimethylene terephthalate sheet, a polybutylene terephthalate sheet, or a polybutylene naphthalate sheet may also be used as the polyester sheet.

When the wafer 11 is to be fixed to the support board 23 with the adhesive layer 25 interposed therebetween, it is preferable not to firmly bond the adhesive layer 25 to the wafer 11 and the support board 23, but to keep the wafer 11 secured temporarily to the support board 23 by the adhesive layer 25. This allows the defective device region 11c to be peeled off easily from the adhesive layer 25 when the defective device region 11c is to be separated from the wafer 11 in a subsequent step (see FIG. 8B).

In the case where the adhesive layer 25 is an adhesive made of a thermosetting resin, for example, the thermosetting resin is heated at a lower temperature or for a shorter period of time than if the thermosetting resin would otherwise be fully secured to the wafer 11 and the support board 23, thereby fixing the wafer 11 to the support board 23. In the case where the adhesive layer 25 is an adhesive made of a thermoplastic resin, the wafer 11 fixed to the support board 23 while the thermoplastic resin is being heated and softened at a predetermined temperature.

In the case where the adhesive layer 25 is an adhesive made of an ultraviolet-curable resin, the wafer 11 is fixed to the support board 23 without heating the ultraviolet-curable resin. In the case where the adhesive layer 25 is a thermocompression bonding sheet, the thermocompression bonding sheet is heated at a lower temperature or for a shorter period of time than if the thermocompression bonding sheet would otherwise be fully secured to the wafer 11 and the support board 23, thereby fixing the wafer 11 to the support board 23.

Instead of the support board 23, a tape made of a resin or the like may be affixed to the face side 11a of the wafer 11. The structure and material of the tape may be, for example, similar to those of the protective member 21 (see FIG. 2).

Next, laser processing is performed on the wafer 11 by a laser processing apparatus. The laser processing apparatus includes a chuck table, not illustrated, for holding the wafer 11 thereon and a laser applying unit 30A for applying the laser beam 32A to the wafer 11. The laser applying unit 30A includes a laser oscillator for oscillating laser at a predetermined wavelength and a condenser, i.e., a condensing lens, for focusing a laser beam emitted from the laser oscillator.

The laser beam 32A is applied to a region of the wafer 11 under beam applying conditions that are established to modify the region of the wafer 11 by way of multiphoton absorption. Specifically, the laser beam 32A has a wavelength that is selected such that at least part of the laser beam 32A can be transmitted through the wafer 11. In other words, the laser applying unit 30A applies the laser beam 32A whose wavelength is transmittable through the wafer 11. Other beam applying conditions, which include an output level, a pulse duration, a beam spot diameter, a repetitive frequency, etc. under which the laser beam 32A is applied to the wafer 11 are also established to modify the wafer 11 appropriately.

While a focused spot of the laser beam 32A is being positioned within the wafer 11, the laser beam 32A is applied to the wafer 11 and scanned along four streets 13 that surround the defective device 15a. As long as the laser beam 32A is applied and swept around the defective device 15a, the laser beam 32A may be scanned along a scanning route that is established appropriately.

Figure 5A:
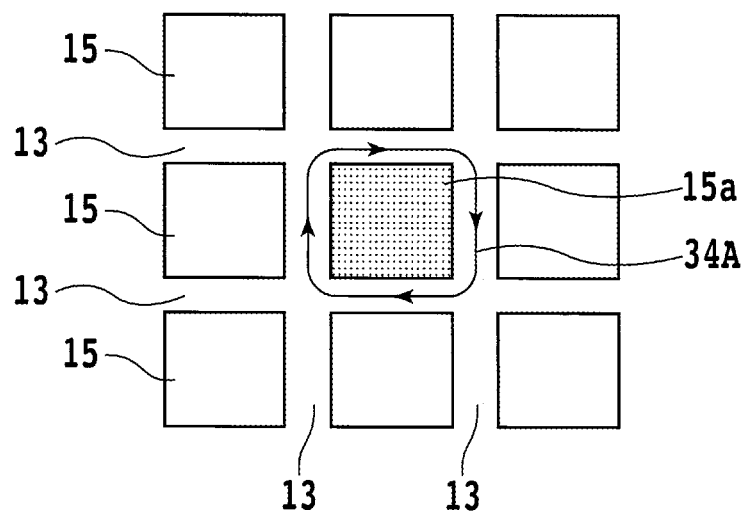
FIG. 5A is a plan view illustrating a scanning route shaped as a quadrangle with rounded corners.
Figure 5B:
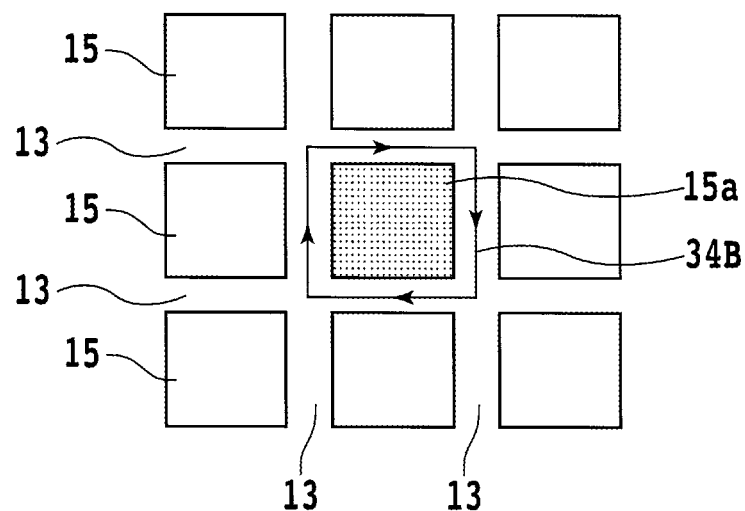
FIG. 5B is a plan view illustrating a scanning route shaped as a rectangle.
Figure 5C:
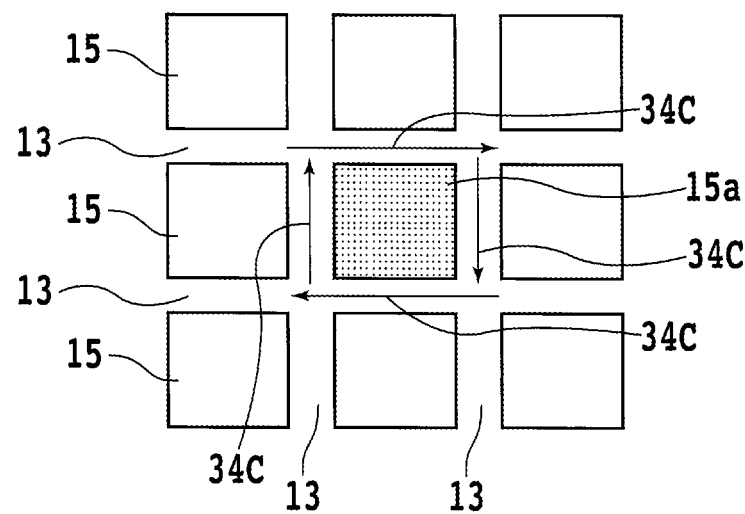
FIG. 5C is a plan view illustrating scanning routes shaped as a plurality of straight lines.

FIGS. 5A through 5C illustrate examples of scanning routes along which the laser beam 32A is scanned. FIG. 5A illustrates in plan a scanning route 34A shaped as a quadrangle with rounded corners. FIG. 5B illustrates in plan a scanning route 34B shaped as a rectangle. FIG. 5C illustrates in plan scanning routes 34C shaped as a plurality of straight lines. The scanning route 34A, the scanning route 34B, and the scanning routes 34C are established in such a manner as to overlap the streets 13.

For example, the laser beam 32A scans the wafer 11 along the substantially rectangular scanning route 34A with arcuate four corners in such a manner as to surround the defective device 15a, as illustrated in FIG. 5A. The laser beam 32A may scan the wafer 11 along the rectangular scanning route 34B surrounding the defective device 15a, as illustrated in FIG. 5B. When the laser beam 32A is scanned along the scanning route 34A or the scanning route 34B, the laser beam 32A is continuously applied to the wafer 11 and swept around the defective device 15a along a unicursal curve.

The laser beam 32A may alternatively scan the wafer 11 along the four straight scanning routes 34C along the four streets 13 surrounding the defective device 15a, as illustrated in FIG. 5C. The scanning routes 34C are not joined to each other, and the laser beam 32A is intermittently applied to the wafer 11 and swept around the defective device 15a.

Figure 4B:
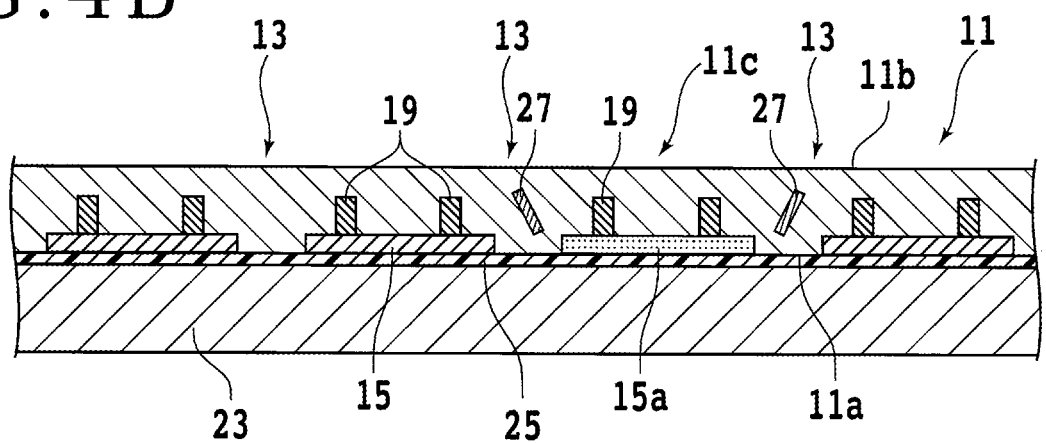
FIG. 4B is a fragmentary cross-sectional view of the wafer with modified layers formed therein.

FIG. 4B illustrates in fragmentary cross section the wafer 11 with modified layers, i.e., altered layers, 27 formed therein. When the laser beam 32A is applied to the wafer 11 and swept along the streets 13 surrounding the defective device 15a, the wafer 11 is modified by way of multiphoton absorption, forming modified layers 27 within the wafer 11 along the streets 13. The area of the wafer 11 where the modified layers 27 are formed becomes more brittle than the other area of the wafer 11. Therefore, when an external force is applied to the wafer 11 with the modified layers 27 formed therein, for example, the wafer 11 is broken along the modified layers 27. In other words, the modified layers 27 function as a separation initiation point for starting, i.e., triggering, to separate the defective device region 11c from the wafer 11.

It has been confirmed that, when the laser beam 32A is applied to the wafer 11 and swept along the scanning route 34A illustrated in FIG. 5A or the scanning routes 34C illustrated in FIG. 5C, unwanted irregular cracks are effectively prevented from occurring in the four corners of the scanning routes 34A and 34C. Accordingly, the modified layers 27 formed in the four corners of the scanning routes 34A and 34C properly function as the separation initiation point to separate the defective device region 11c accurately from the wafer 11.

The modified layers 27 may be formed in the wafer 11 by applying and sweeping the laser beam 32A a plurality of times repeatedly along each of the streets 13 while at the same time keeping the focused spot of the laser beam 32A at a different heightwise position in the wafer 11 in each stroke of the scanning movement of the laser beam 32A along the streets 13. The modified layers 27 thus formed are positioned in a plurality of modified areas disposed at a plurality of stages arrayed in thicknesswise directions of the wafer 11.

Figure 4C:
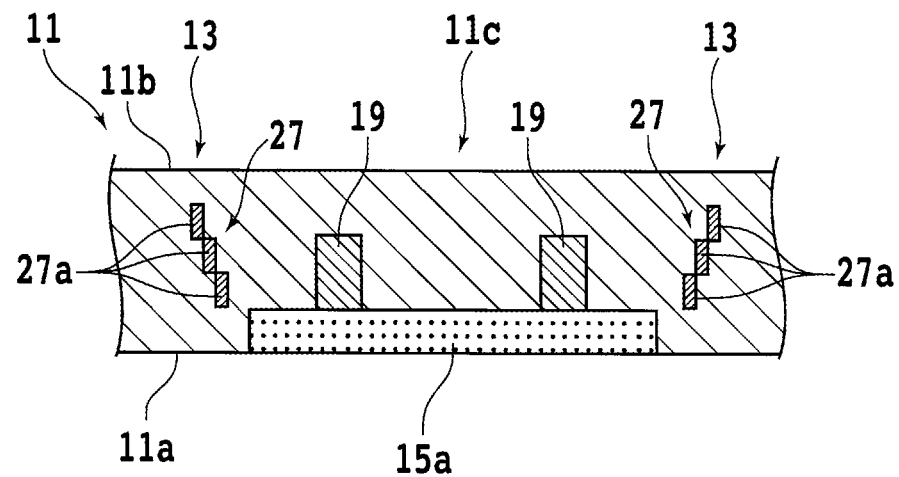
FIG. 4C is a fragmentary cross-sectional view illustrating modified layers each including a plurality of modified areas in the wafer.

FIG. 4C illustrates in fragmentary cross section modified layers 27 each including a plurality of modified areas, i.e., altered areas, 27a. Each of the modified layers 27 include a plurality of modified areas 27a disposed at a plurality of stages in the wafer 11 along one of the streets 13 and situated at different depthwise positions in the thicknesswise directions of the wafer 11.

The modified areas 27a may be formed so as not to overlap each other as viewed in plan. Specifically, as illustrated in FIG. 4C, the modified areas 27a are formed in the wafer 11 at positions spaced progressively more from the defective device 15a in horizontal directions, i.e., directions perpendicular to the thicknesswise directions of the wafer 11, as the modified areas 27a are closer to the reverse side 11b of the wafer 11. The modified areas 27a thus formed make the modified layers 27 slanted with respect to the thicknesswise directions of the wafer 11 (see FIG. 4B), allowing the defective device region 11c to be separated easily from the wafer 11 in the subsequent step (see FIG. 8B). Though the modified layers 27 are illustrated as slanted with respect to the thicknesswise directions of the wafer 11, the modified layers 27 are not limited to any particular shapes, and may extend parallel to the thicknesswise directions of the wafer 11.

Then, the reverse side 11b of the wafer 11 is ground until the processed area, i.e., the modified layers 27, produced by the application of the laser beam 32A or cracks developed from the processed area, i.e., the modified layers 27, are exposed on the ground reverse side 11b of the wafer 11. The wafer 11 is ground by the grinding apparatus 2 illustrated in FIG. 2, for example.

The grinding apparatus 2 grinds the reverse side 11b of the wafer 11 by holding the grindstones 16 in abrasive contact with the reverse side 11b of the wafer 11 that is held on the chuck table 4. The wafer 11 is ground and thinned down until the modified layers 27 are exposed on the ground reverse side 11b of the wafer 11, for example.

Figure 6:
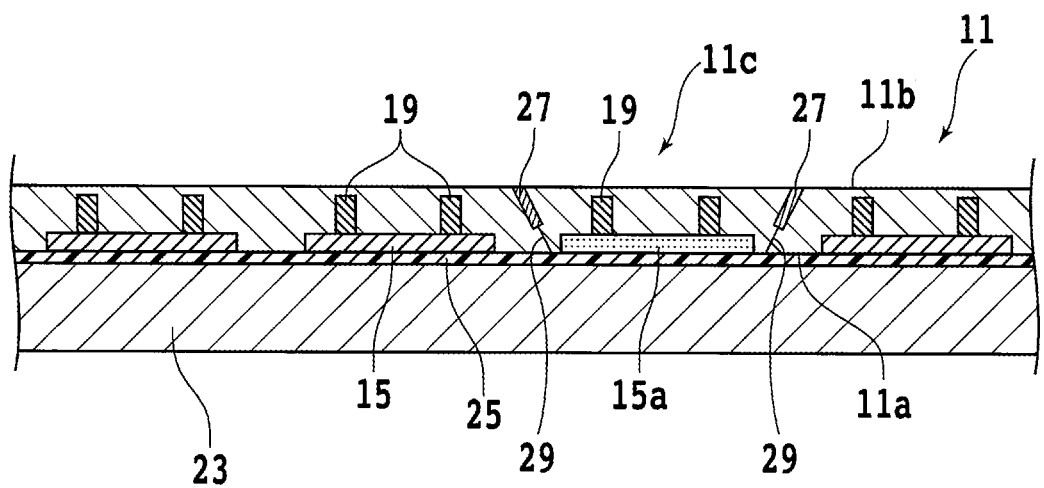
FIG. 6 is a fragmentary cross-sectional view of the wafer after it has been ground.

FIG. 6 illustrates the wafer 11 after it has been ground in fragmentary cross section. When the grindstones 16 (see FIG. 2) are pressed against the wafer 11 to grind the wafer 11, an external force, i.e., a pressure, is applied to the wafer 11, breaking the wafer 11 along the modified layers 27. Cracks 29 produced in the modified layers 27 are developed therefrom and reach the face side 11a of the wafer 11. As a result, the defective device region 11c is divided from the wafer 11.

When the modified layers 27 (see FIGS. 4A and 4B) are formed in the wafer 11 by the applied laser beam 32A, cracks 29 may also be developed from the modified layers 27 and reach the face side 11a of the wafer 11. Specifically, by appropriately setting beam applying conditions for applying the laser beam 32A and a position where the modified layers 27 are to be formed, cracks 29 may be formed at the same time as the modified layers 27 and caused to reach the face side 11a of the wafer 11.

Furthermore, after the wafer 11 has been ground, it is preferable to perform an etching process on the wafer 11. For example, plasma etching is performed on the wafer 11 using a plasma processing apparatus. The plasma processing apparatus includes a chuck table having a holding surface for holding the wafer 11 thereon and a chamber, i.e., a processing chamber, which houses the chuck table therein.

Figure 7A:
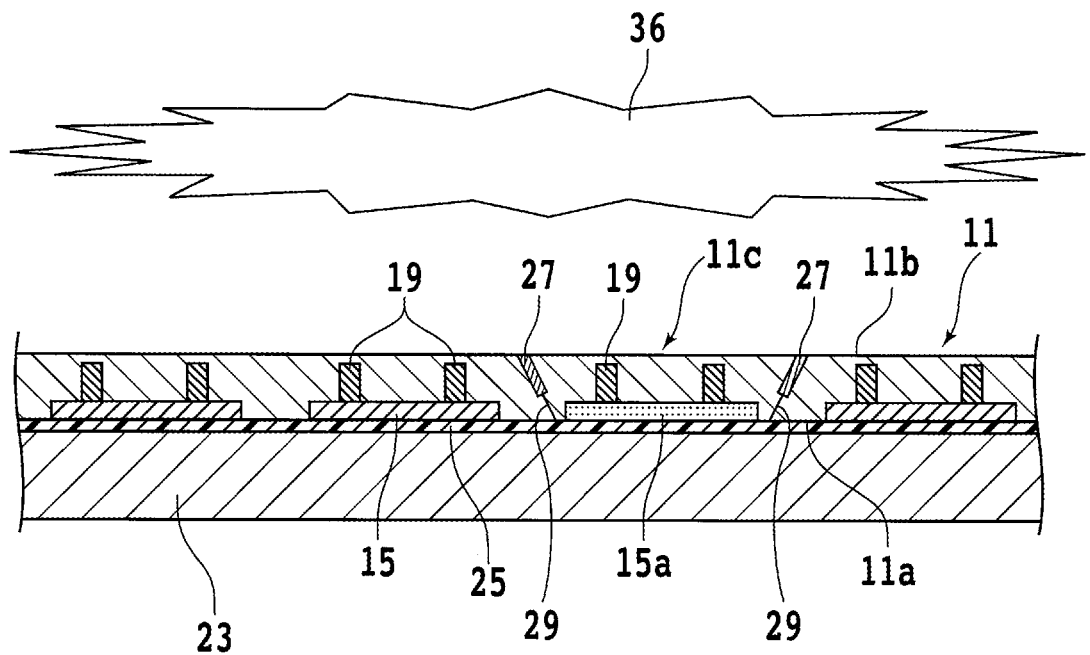
FIG. 7A is a fragmentary cross-sectional view of the wafer when it is processed by plasma etching.

FIG. 7A illustrates in fragmentary cross section the wafer 11 when it is processed by plasma etching. For performing plasma etching, the wafer 11 is held on the chuck table, and the chamber is hermetically sealed and then supplied with an etching gas 36. The plasma processing apparatus then turns the gas 36 within the chamber into a plasma containing ions and radicals by applying a high-frequency voltage. The plasmatized gas 36 is thus supplied to the wafer 11.

For example, if the wafer 11 is a silicon wafer, then a fluorine gas such as $CF_4$ or $SF_6$ is used as the gas 36. The gas 36 has its components selected depending on the material of the wafer 11. The plasmatized gas 36 acts on the wafer 11, thereby performing plasma etching on the wafer 11.

Figure 7B:
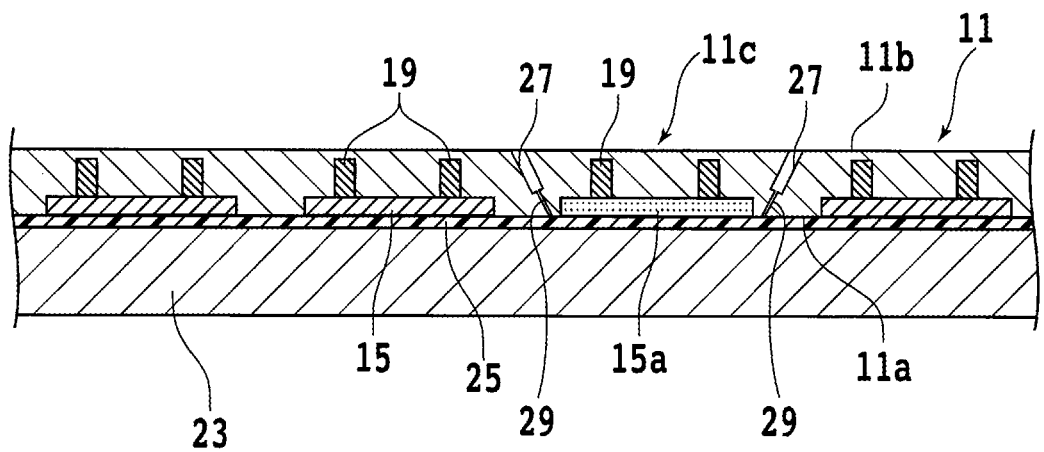
FIG. 7B is a fragmentary cross-sectional view of the wafer after it has been processed by plasma etching.

FIG. 7B illustrates in fragmentary cross section the wafer 11 after it has been processed by plasma etching. When the plasmatized gas 36 is supplied to the reverse side 11b of the wafer 11, the plasmatized gas 36 enters the modified layers 27 and the cracks 29, performing etching in the modified layers 27 and the cracks 29. As a result, gaps provided by the modified layers 27 and the cracks 29 between the wafer 11 and the defective device region 11c are enlarged, reliably dividing the defective device region 11c from the wafer 11.

However, the gas 36 may be plasmatized outside of the chamber and then supplied through a metal supply pipe to the chamber. In this case, when the plasmatized gas 36 flows through the metal supply pipe, ions contained in the plasmatized gas 36 are adsorbed to an inner wall surface of the metal supply pipe and become less likely to reach the chamber. As a consequence, the plasmatized gas 36 that has an increased proportion of radicals is introduced into the chamber and supplied to the wafer 11. Since the plasmatized gas 36 with the higher proportion of radicals is more likely to enter interstices in the wafer 11, the plasmatized gas 36 is liable to perform more etching in the modified layers 27 and the cracks 29.

The etching process to be performed on the wafer 11 is not limited to plasma etching. For example, an etching solution may be supplied to the reverse side 11b of the wafer 11 to perform wet etching on the wafer 11. Specifically, if the wafer 11 is a silicon wafer, then an etching solution containing potassium hydroxide (KOH), tetramethylammonium hydroxide (TMAH), or the like is supplied to the wafer 11. When the etching solution enters the modified layers 27 and the cracks 29, etching is performed in the modified layers 27 and the cracks 29, enlarging gaps provided by the modified layers 27 and the cracks 29 between the wafer 11 and the defective device region 11c.

If the modified layers 27 (see FIG. 4B) formed in the wafer 11 by the applied laser beam 32A exist in a position closer to the reverse side 11b of the wafer 11 than the electrodes 19, then it is preferable to grind and thin down the wafer 11 until all the modified layers 27 are removed from the wafer 11. In this case, the wafer 11 becomes free of the modified layers 27, but contains the cracks 29 that have been developed from the modified layers 27. With the modified layers 27 thus removed from the wafer 11, the flexural strength, i.e., the bending strength, of device chips finally obtained from the wafer 11 by dividing the wafer 11 is prevented from being lowered.

In the case where the modified layers 27 are removed from the wafer 11 as described above, the cracks 29 are exposed on the reverse side 11b of the wafer 11 that has been ground, dividing the defective device region 11c from the wafer 11. The cracks 29 are then enlarged when the plasmatized gas 36 or the etching solution enters the cracks 29.

When the modified layers 27 are formed in the wafer 11 by the applied laser beam 32A (see FIGS. 4A and 4B) or when the reverse side 11b of the wafer 11 is ground (see FIG. 6), cracks may be developed from the modified layers 27 toward the reverse side 11b of the wafer 11. In this case, when the cracks are exposed on the reverse side 11b of the wafer 11 that has been ground, the defective device region 11c is divided from the wafer 11.

Next, the defective device region 11c is separated from the wafer 11. Specifically, when the defective device region 11c is peeled off from the adhesive layer 25 and picked up, the defective device region 11c is separated from the wafer 11.

For separating the defective device region 11c from the wafer 11, it is preferable to perform a process, i.e., a pretreatment process, for partially lowering the adhesive power of the adhesive layer 25. For example, a chemical solution is supplied to the adhesive layer 25 through the modified layers 27 and the cracks 29, thereby partially lowering the adhesive power of the adhesive layer 25 or partially removing the adhesive layer 25.

If the adhesive layer 25 is made of a material whose adhesive power can be reduced by the application of a certain energy, e.g., heat, electromagnetic radiation, or the like, thereto, then the adhesive power of the adhesive layer 25 may be lowered by applying the energy to the adhesive layer 25. If the adhesive layer 25 is an adhesive made of a thermoplastic resin, then the adhesive power of the adhesive layer 25 may be lowered by heating the adhesive layer 25. If the adhesive layer 25 is an adhesive made of an ultraviolet-curable resin, the adhesive power of the adhesive layer 25 may be lowered by applying ultraviolet rays to the adhesive layer 25.

The adhesive layer 25 may be a tape including a film-shaped base, a thermally foamable layer deposited on one side of the base, and a sticky layer deposited on the other side of the base. The thermally foamable layer of the tape is formed by adding an expanding agent that can be expanded when heated to an adhesive.

The adhesive of the thermally foamable layer may be an acryl adhesive, a rubber adhesive, a vinyl alkyl ether adhesive, a silicone adhesive, a polyester adhesive, a polyamide adhesive, a urethane adhesive, or the like. The expanding agent of the thermally foamable layer may include microspheres that can be expanded by heat, i.e., thermally expandable microspheres, a foaming material that can be foamed by heat, or the like.

The thermally expandable microspheres have elastic microcapsules containing a thermally expandable material. The thermally expandable material may be propane, propylene, butene, or the like. An example of a commercially available tape including thermally expandable microspheres is "REVALPHA" (registered trademark) manufactured by Nitto Denko Corporation. The foaming material that can be foamed by heat may be, for example, an inorganic foaming agent such as ammonium carbonate, ammonium hydrogen carbonate, sodium, ammonium nitrite, sodium borohydride, or azide, or any of various types of organic foaming agent.

The tape referred to above is affixed to the wafer 11 and the support board 23 such that the thermally foamable layer is held in contact with the wafer 11 and the sticky layer is held in contact with the support board 23. When a region of the tape is heated, the expanding agent of the thermally foamable layer is expanded in the heated region, producing surface irregularities that tend to lower the adhesive power of the tape with respect to the wafer 11.

Figure 8A:
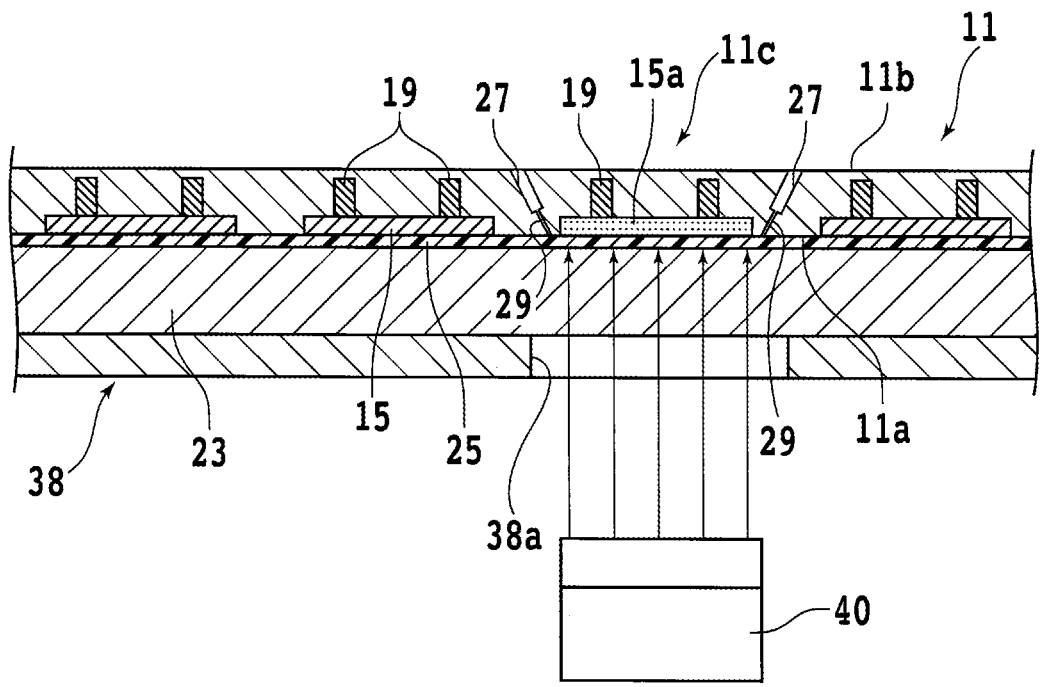
FIG. 8A is a fragmentary cross-sectional view of the wafer in which an adhesive layer is pretreated.

FIG. 8A illustrates in fragmentary cross section the wafer 11 in which the adhesive layer 25 is pretreated. A mask 38 is fixed to a surface, i.e., a lower surface, of the support board 23 opposite a surface thereof, i.e., an upper surface, to which the wafer 11 is fixed, for example. The mask 38 has an opening 38a defined therein that extends vertically therethrough. The mask 38 is fixed to the support board 23 such that the opening 38a underlies the defective device region 11c in alignment therewith.

An energy applying unit 40 for applying an energy to the adhesive layer 25 is disposed below the support board 23. The energy applying unit 40 applies an energy to the adhesive layer 25 through the opening 38a in the mask 38. The kind of an energy applied from the energy applying unit 40 to the adhesive layer 25 is selected depending on the properties of the adhesive layer 25.

If the adhesive layer 25 is a tape including an adhesive made of a thermoplastic resin and a thermally foamable layer, then a heater is used as the energy applying unit 40. The mask 38 is a thermally insulative member. The energy applying unit 40 applies heat to the region of the support board 23 that overlaps the opening 38a in the mask 38. The heat applied to the support board 23 is transferred to the adhesive layer 25, thereby locally heating the region of the adhesive layer 25 that overlaps the opening 38a in the mask 38.

If the adhesive layer 25 is an adhesive made of an ultraviolet-curable resin, then a light source, i.e., a lamp, for emitting ultraviolet rays is used as the energy applying unit 40. The support board 23 is made of a material that transmits ultraviolet rays therethrough. The mask 38 is made of a material that blocks ultraviolet rays. The energy applying unit 40 applies ultraviolet rays to the adhesive layer 25 through the opening 38a in the mask 38 and the support board 23, thereby locally applying the ultraviolet rays to the region of the adhesive layer 25 that overlaps the opening 38a in the mask 38.

When the energy is applied from the energy applying unit 40 to the adhesive layer 25, the adhesive power of the region of the adhesive layer 25 that underlies the defective device region 11c is locally lowered. The defective device region 11c can thus be peeled off easily from the adhesive layer 25.

Figure 8B:
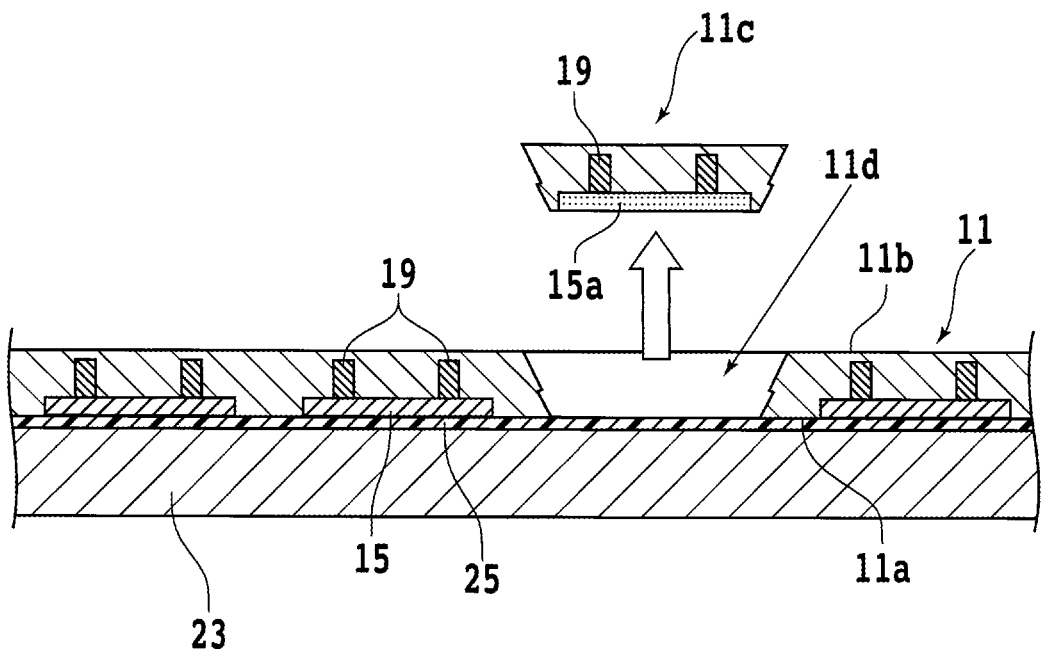
FIG. 8B is a fragmentary cross-sectional view of the wafer when a defective device region is separated therefrom.

FIG. 8B illustrates in fragmentary cross section the wafer 11 when the defective device region 11c is separated therefrom. If necessary, the wafer 11 is pretreated, and thereafter the defective device region 11c is held and spaced apart from the wafer 11. The defective device region 11c is thus peeled off from the adhesive layer 25 and cut out of the wafer 11.

Figure 9:
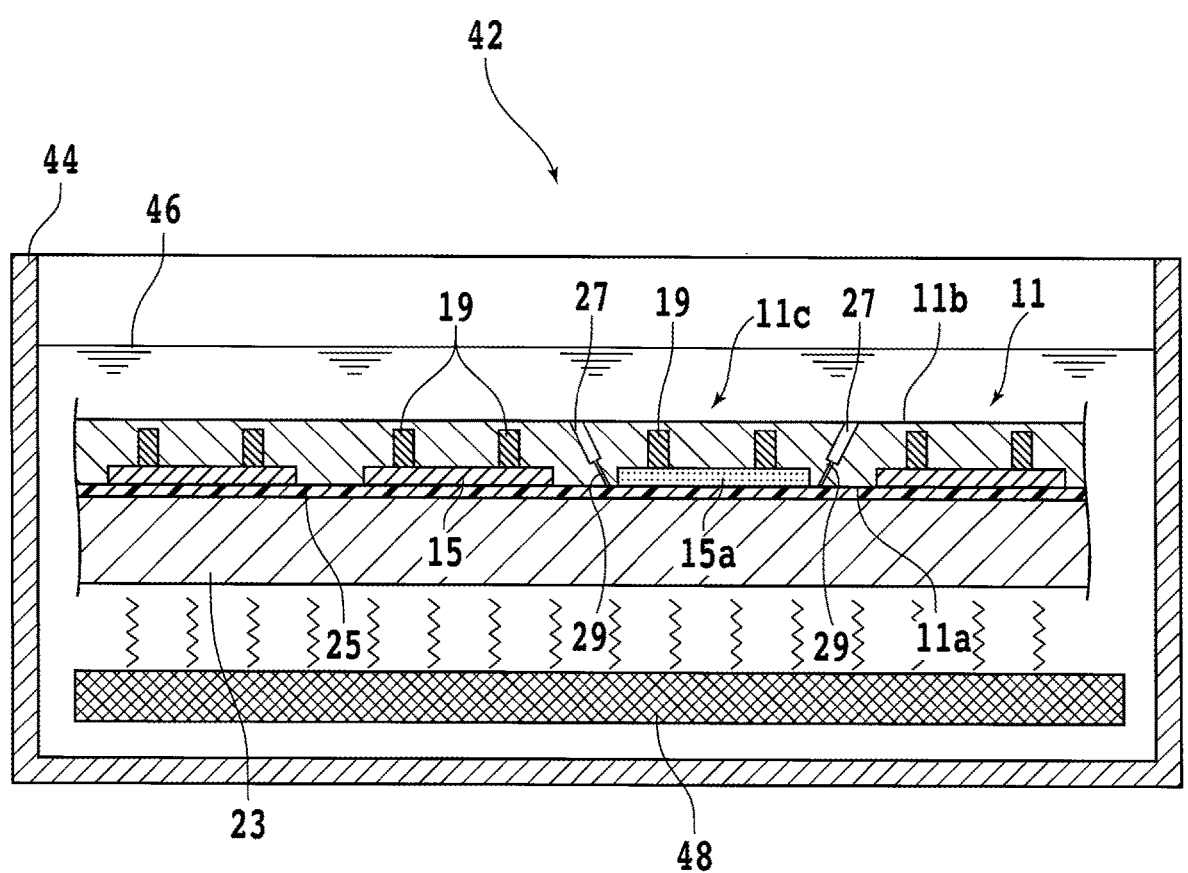
FIG. 9 is a cross-sectional view of an ultrasonic wave applying unit.

When the defective device region 11c is to be separated from the wafer 11, ultrasonic waves may be applied to the wafer 11 or the support board 23 to assist in separating the defective device region 11c from the wafer 11. FIG. 9 illustrates in cross section an ultrasonic wave applying unit 42.

The ultrasonic wave applying unit 42 includes a box-shaped container 44 shaped as a rectangular parallelepiped. The container 44 contains a liquid 46 such as pure water or the like. The container 44 houses therein an ultrasonic generator 48 for generating ultrasonic waves.

The wafer 11 with the modified layers 27 and the cracks 29 formed therein is placed in the container 44 and immersed in the liquid 46. At this time, the wafer 11 is placed in the container 44 such that the support board 23 faces the ultrasonic generator 48. Then, the ultrasonic generator 48 is energized to generate ultrasonic waves that are propagated through the liquid 46 acting as a medium to the support board 23, imparting vibrations to the support board 23 at a frequency in the ultrasonic frequency range, i.e., imparting ultrasonic vibrations to the support board 23.

Even if the wafer 11 has not sufficiently fractured along the modified layers 27 and the cracks 29, when ultrasonic vibrations are imparted to the support board 23, the fracture of the wafer 11 is accelerated by the vibrations of the support board 23. The vibrations of the support board 23 are also effective to weaken the bonding between the defective device region 11c and the adhesive layer 25. As a result, the defective device region 11c can easily be separated from the wafer 11. Ultrasonic waves may be applied locally to the region of the support board 23 that underlies the defective device region 11c.

In this manner, the defective device region 11c is separated from the wafer 11, leaving the through hole 11d (see FIG. 8B) in the region of the wafer 11 where the defective device region 11c was present. The through hole 11d extends thicknesswise through the wafer 11.

The process of fracturing the wafer 11 along the modified layers 27 and the cracks 29 formed in the wafer 11 by the laser beam 32A applied thereto has been described by way of example above. However, the content of laser processing that is performed on the wafer 11 is not limited to the formation of the modified layers 27 and the cracks 29. In the removing step, for example, laser processing may be performed on the wafer 11 to carry out ablation on the wafer 11 to separate the defective device region 11c from the wafer 11.

Figure 10A:
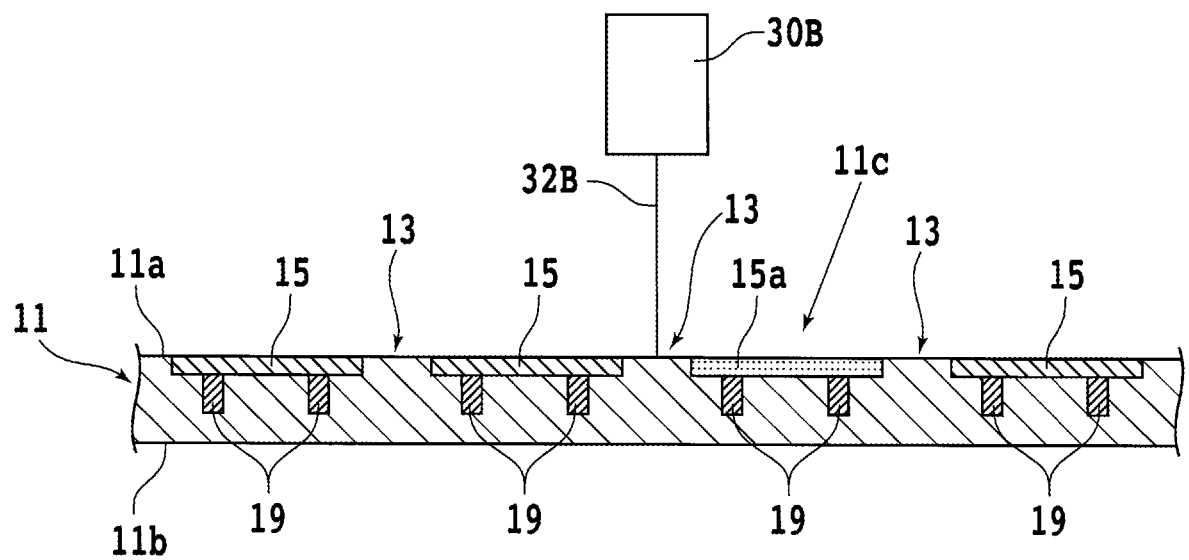
FIG. 10A is a fragmentary cross-sectional view of the wafer to which a laser beam is applied.

FIG. 10A illustrates in fragmentary cross section the wafer 11 to which a laser beam 32B is applied. For performing ablation on the wafer 11, a laser applying unit 30B for applying the laser beam 32B to the wafer 11 is used. The laser applying unit 30B is structurally identical to the laser applying unit 30A (see FIG. 4A).

However, the laser beam 32B is applied to a region of the wafer 11 under beam applying conditions that are established to remove the region of the wafer 11 by way of ablation. Specifically, the laser beam 32B has a wavelength that is selected such that at least part of the laser beam 32B is absorbed by the wafer 11. In other words, the laser applying unit 30B applies the laser beam 32B whose wavelength is absorbable by the wafer 11. Other beam applying conditions under which the laser beam 32B is applied to the wafer 11 are also established to perform ablation appropriately on the wafer 11.

For example, the laser beam 32B is applied to the face side 11a of the wafer 11. Specifically, the wafer 11 is held on the chuck table, not illustrated, of the laser processing apparatus such that the face side 11a of the wafer 11 is exposed. While a focused spot of the laser beam 32B is being positioned on one at a time of the streets 13, the laser beam 32B is applied to the wafer 11 and scanned along four streets 13 that surround the defective device 15a. The laser beam 32B as it is swept is not limited to any scanning routes.

For example, the laser beam 32B is applied and scanned along the scanning route 34A illustrated in FIG. 5A or the scanning route 34B illustrated in FIG. 5B.

Figure 10B:
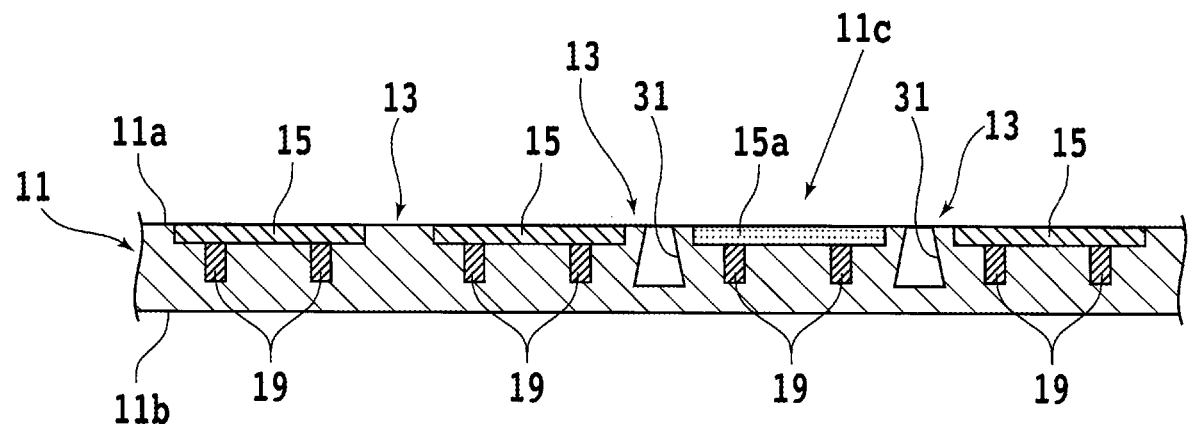
FIG. 10B is a fragmentary cross-sectional view of the wafer in which grooves are formed.

FIG. 10B illustrates in fragmentary cross section the wafer 11 in which grooves 31 are formed. When the laser beam 32B is applied to the wafer 11 and swept along the four streets 13 that surround the defective device 15a, regions of the face side 11a of the wafer 11 that extend along the streets 13 are removed by way of ablation. As a result, the grooves 31, each of a rectangular shape as viewed in plan, are formed in the face side 11a of the wafer 11 along the streets 13.

The grooves 31 are not limited to any shapes. For example, the grooves 31 may be of a constant width in the thicknesswise directions of the wafer 11, or may be progressively wider toward the reverse side 11b of the wafer 11, as illustrated in FIG. 10B.

For forming the grooves 31, the face side 11a of the wafer 11 may be covered with a protective film, and the laser beam 32B may be applied to the wafer 11 through the protective film. For example, the protective film may be a tape made of a resin or a film made of a water-soluble resin such as polyvinyl alcohol (PVA) or polyethylene glycol (PEG). If the protective film is formed on the face side 11a of the wafer 11, then it can prevent swarf or debris produced by ablation from being deposited on the face side 11a of the wafer 11, thereby avoiding contamination of the wafer 11 and the semiconductor devices 15.

The processed regions, i.e., the grooves 31, processed by the applied laser beam 32B may be supplied with a plasmatized gas or an etching solution to thereby perform an etching process on the wafer 11. The etching process thus performed on the wafer 11 enlarges the grooves 31 and removes minute surface irregularities formed on inner wall surfaces of the grooves 31 by ablation.

For performing the etching process on the wafer 11, it is preferable to form a mask covering the face side 11a of the wafer 11. The mask has openings through which the regions of the wafer 11 where the grooves 31 have been formed are exposed. The plasmatized gas or the etching solution is supplied to the wafer 11 through the openings in the mask. Therefore, the mask protects the semiconductor devices 15 on the face side 11a of the wafer 11 from the plasmatized gas or the etching solution.

The mask used in the etching process is not limited to any particular materials. For example, the mask may be a resist made of a photosensitive resin, or the protective film made of PVA, PEG, or the like formed on the face side 11a of the wafer 11 at the time the laser beam 32B is applied may be used as the mask.

Then, the reverse side 11b of the wafer 11 is ground to expose the processed regions, i.e., the grooves 31, processed by the applied laser beam 32B on the ground reverse side 11b. For grinding the wafer 11, the wafer 11 is first fixed to the support board 23. FIG. 11A illustrates in fragmentary cross section the wafer 11 that has been fixed to the support board 23. For grinding the reverse side 11b of the wafer 11, the face side 11a of the wafer 11 is fixed to the support board 23 with the adhesive layer 25 interposed therebetween.

Then, the grinding apparatus 2 (see FIG. 2) grinds the wafer 11. Specifically, the grindstones 16 are brought into abrasive contact with the reverse side 11b of the wafer 11, thereby grinding the reverse side 11b of the wafer 11. The wafer 11 is ground and thinned down until the grooves 31 are exposed on the reverse side 11b of the wafer 11.

FIG. 11B illustrates in fragmentary cross section the wafer 11 after it has been ground. When the grooves 31 are exposed on the reverse side 11b of the wafer 11, the defective device region 11c is divided from the wafer 11. Thereafter, the defective device region 11c is separated from the wafer 11, leaving the through hole 11d in the wafer 11 (see FIGS. 8A, 8B, and 9).

In the removing step, the wafer 11 may be cut by a laser beam applied thereto. Specifically, kerfs, i.e., slits, extending from the face side 11a to the reverse side 11b of the wafer 11 are formed along the streets 13 by way of ablation.

Figure 12A:
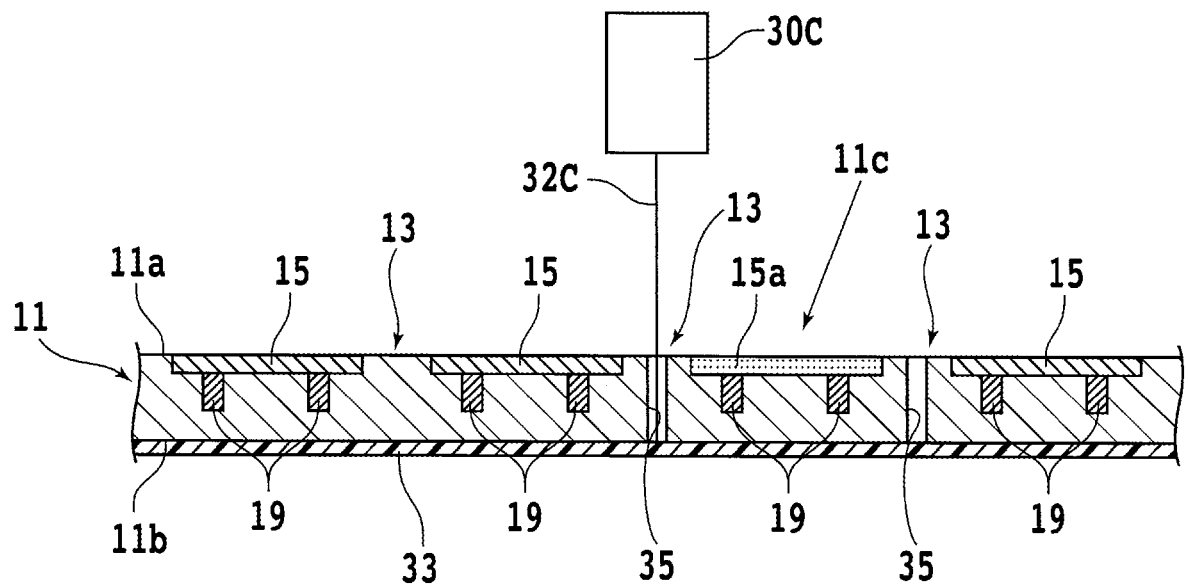
FIG. 12A is a fragmentary cross-sectional view of the wafer to which a laser beam is applied.

FIG. 12A illustrates in fragmentary cross section the wafer 11 to which a laser beam 32C is applied. For cutting the wafer 11, a laser applying unit 30C for applying the laser beam 32C to the wafer 11 is used. The laser applying unit 30C is structurally identical to the laser applying unit 30A (see FIG. 4A).

However, the laser beam 32C is applied to regions of the wafer 11 under beam applying conditions that are established to remove the regions of the wafer 11 that extend from the face side 11a to the reverse side 11b thereof by way of ablation. Specifically, the laser beam 32C has a wavelength that is selected such that at least part of the laser beam 32C is absorbed by the wafer 11. In other words, the laser applying unit 30C applies the laser beam 32C whose wavelength is absorbable by the wafer 11. Other beam applying conditions under which the laser beam 32C is applied to the wafer 11 are also established to remove the regions of the wafer 11 that extend from the face side 11a to the reverse side 11b.

For applying the laser beam 32C to the wafer 11, a protective member 33 such as a tape is first affixed to the wafer 11. For example, for applying the laser beam 32C to the face side 11a of the wafer 11, a tape is affixed as the protective member 33 to the reverse side 11b of the wafer 11.

Then, the laser beam 32C is applied to the face side 11a of the wafer 11. Specifically, while a focused spot of the laser beam 32C is being positioned on one at a time of the streets 13, the laser beam 32C is applied to the wafer 11 and scanned along four streets 13 that surround the defective device 15a. The laser beam 32C as it is swept is not limited to any scanning routes. For example, the laser beam 32C is applied and scanned along the scanning route 34A illustrated in FIG. 5A or the scanning route 34B illustrated in FIG. 5B.

When the laser beam 32C is applied and scanned along the streets 13 that surround the defective device 15a, a portion of the wafer 11 is removed along the streets 13. As a result, kerfs, i.e., slits, 35 extending from the face side 11a to the reverse side 11b of the wafer 11 are formed along the streets 13. As a result, the defective device region 11c is divided from the wafer 11.

If it is difficult to form kerfs 35 extending to the reverse side 11b of the wafer 11 by scanning the laser beam 32C along the streets 13 only once, then the laser beam 32C may be scanned a plurality of times along each of the streets 13. Thereafter, as described above, the defective device region 11c is separated from the wafer 11, leaving the through hole 11d in the wafer 11 (see FIGS. 8A, 8B, and 9).

Figure 12B:
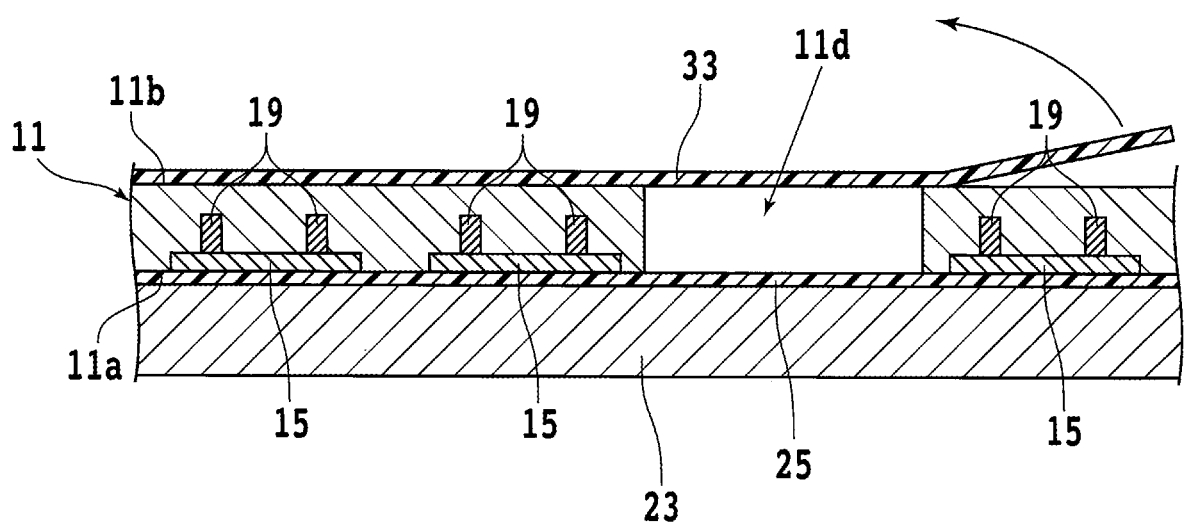
FIG. 12B is a fragmentary cross-sectional view of the wafer that has been fixed to the support board.

After the defective device region 11c has been separated from the wafer 11, the wafer 11 is fixed to the support board 23. FIG. 12B illustrates in fragmentary cross section the wafer 11 that has been fixed to the support board 23. After the kerfs 35 have been formed in the wafer 11 and the defective device region 11c has been separated from the wafer 11, the support board 23 is fixed to the face side 11a of the wafer 11 with the adhesive layer 25 interposed therebetween. Thereafter, the protective member 33 is peeled off from the reverse side 11b of the wafer 11 and removed.

Figure 13A:
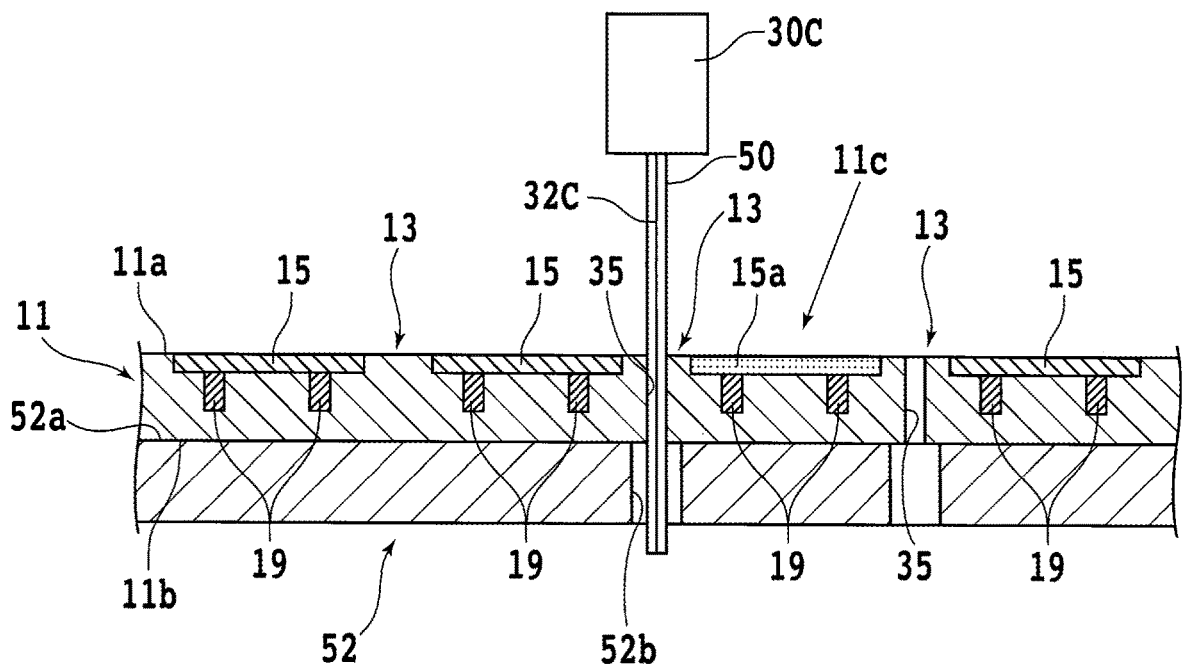
FIG. 13A is a fragmentary cross-sectional view of the wafer to which a laser beam is applied through a liquid column.

In the removing step, the wafer 11 may be processed by a laser beam applied through a liquid, i.e., aqua laser. FIG. 13A illustrates in fragmentary cross section the wafer 11 to which the laser beam 32C is applied through a liquid column 50.

The laser applying unit 30C may incorporate an ejection unit, i.e., a nozzle, for ejecting a liquid toward the wafer 11. When a liquid is continuously supplied from the ejection unit to the wafer 11, the liquid column 50 is formed as extending from the laser applying unit 30C to the wafer 11. The liquid column 50 is a column made of the flowing liquid and functions as a light guide path for propagating the laser beam 32C therethrough. For example, the ejection unit ejects water, forming a water column.

The wafer 11 is held on a holding table 52. The holding table 52 has an upper surface that provides a flat holding surface 52a for holding the wafer 11 thereon. The holding table 52 has an opening 52b defined therein that extends vertically through the holding table 52. The opening 52b is of a rectangular shape as viewed in plan so as to be commensurate with the four streets 13 surrounding the semiconductor devices 15. The wafer 11 is placed on the holding table 52 such that the four streets 13 surrounding the defective device 15a overlie the opening 52b.

The laser applying unit 30C ejects the liquid to form the liquid column 50 and applies the laser beam 32C to the liquid column 50. At this time, the laser beam 32C has its focused spot positioned within the liquid column 50 and is applied through the liquid column 50 to the wafer 11.

When the laser beam 32C is applied to the liquid column 50, the laser beam 32C can be guided to one at a time of the streets 13 of the wafer 11 without having to control the heightwise position of the focused spot of the laser beam 32C in a rigorous manner. In addition, swarf or debris produced by laser processing is washed away by the liquid from the liquid column 50.

The laser beam 32C as well as the liquid column 50 is scanned along the streets 13. The applied laser beam 32C forms the kerfs 35 in the wafer 11 along the streets 13, dividing the defective device region 11c from the wafer 11. The liquid ejected from the laser applying unit 30C is discharged through the opening 52b defined in the holding table 52.

Figure 13B:
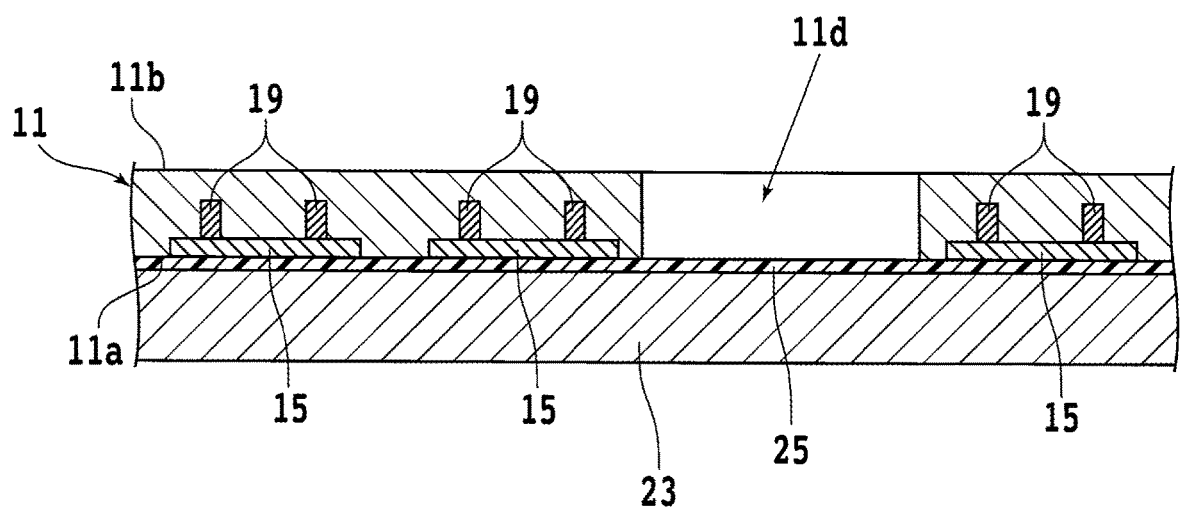
FIG. 13B is a fragmentary cross-sectional view of the wafer that has been fixed to the support board.

Thereafter, the wafer 11 is fixed to the support board 23. FIG. 13B illustrates in fragmentary cross section the wafer 11 that has been fixed to the support board 23. After the kerfs 35 have been formed in the wafer 11 and the defective device region 11c has been separated from the wafer 11, the support board 23 is fixed to the face side 11a of the wafer 11 with the adhesive layer 25 interposed therebetween.

The processed regions, i.e., the kerfs 35, processed by the applied laser beam 32C may be supplied with a plasmatized gas or an etching solution to thereby perform an etching process on the wafer 11. The etching process thus performed on the wafer 11 enlarges the kerfs 35 and removes minute surface irregularities formed on inner wall surfaces of the kerfs 35 by ablation.

The process of separating the defective device region 11c from the wafer 11 by laser processing has been described above. However, other processes than laser processing may be used to separate the defective device region 11c from the wafer 11. For example, a process of performing plasma etching on the wafer 11 to cut the wafer 11, i.e., what is generally called plasma dicing, can be used.

For performing plasma dicing, the support board 23 is fixed to the face side 11a of the wafer 11 (see FIG. 4A). Thereafter, a mask for plasma etching is formed on the reverse side 11b of the wafer 11.

Figure 14A:
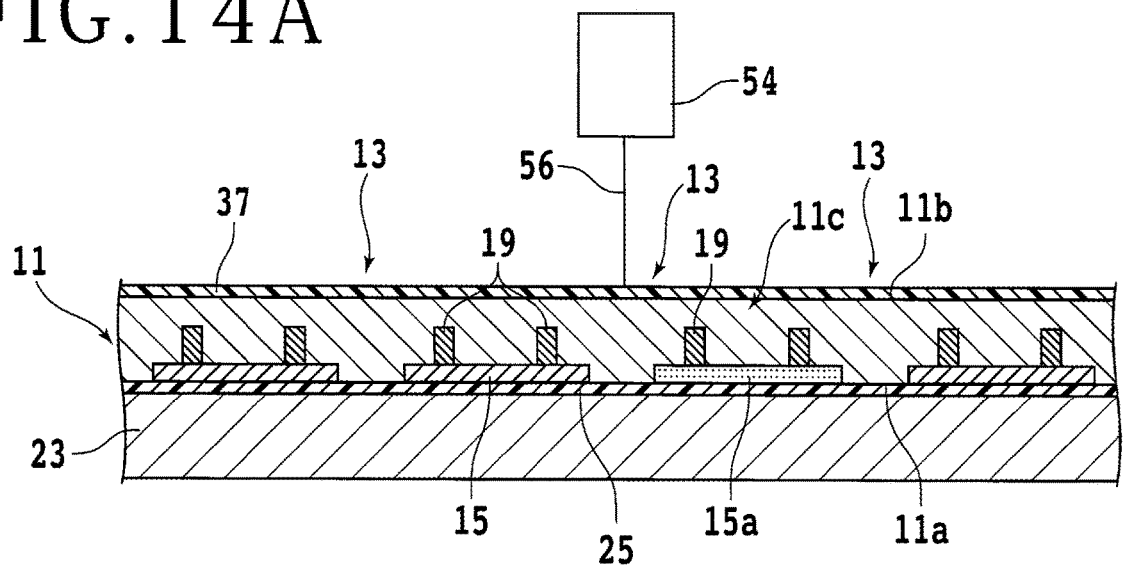
FIG. 14A is a fragmentary cross-sectional view of the wafer on which a mask layer is formed.

FIG. 14A illustrates in fragmentary cross section the wafer 11 on which a mask layer 37 is formed. The mask layer 37 is made of a material that functions as a mask for plasma etching and formed to cover the entire reverse side 11b of the wafer 11. For example, the mask layer 37 may be a resist made of a photosensitive resin or a film made of a water-soluble resin such as PVA or PEG.

Then, regions of the mask layer 37 that overlie the four streets 13 that surround the defective device 15a are removed. For example, a laser applying unit 54 applies a laser beam 56 to the mask layer 37 to remove the regions of the mask layer 37 along the streets 13. The laser beam 56 is applied to the regions of the mask layer 37 under beam applying conditions that are established to remove the regions of the mask layer 37 by way of ablation when the laser beam 56 is applied to the mask layer 37.

When the laser beam 56 is applied to the mask layer 37 and scanned along the four streets 13 that surround the defective device 15a, the laser beam 56 forms rectangular openings in the mask layer 37 through which the four streets 13 are exposed. The mask layer 37 is thus patterned, producing a mask 39 (see FIG. 14B) for plasma etching.

Then, plasma etching is performed on the wafer 11 using the mask 39. For example, plasma etching is performed on the wafer 11 by using the plasma processing apparatus described above.

Figure 14B:
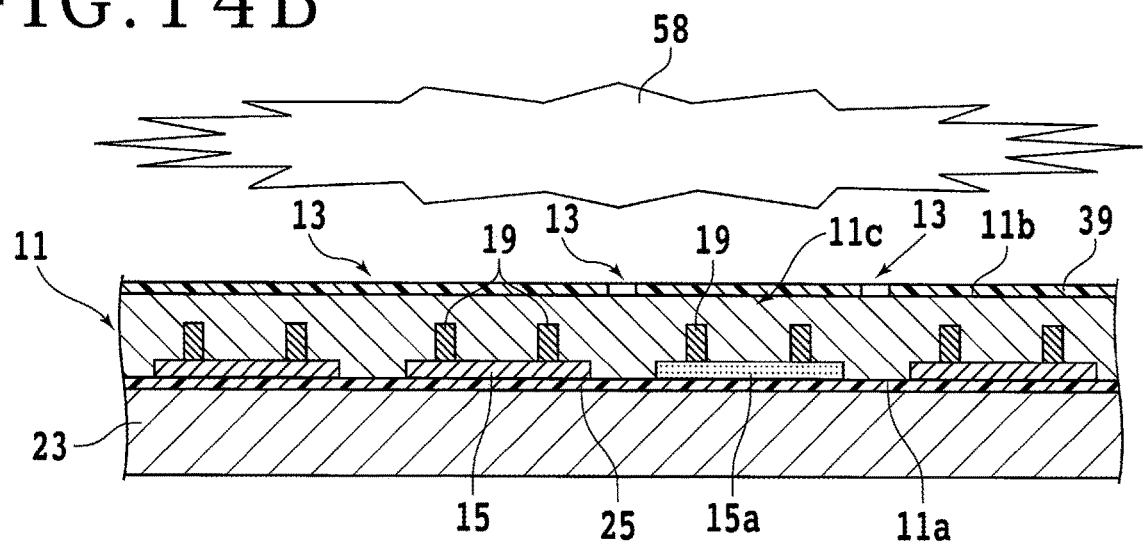
FIG. 14B is a fragmentary cross-sectional view of the wafer when it is processed by plasma etching.

FIG. 14B illustrates in fragmentary cross section the wafer 11 when it is processed by plasma etching. When plasma etching is performed on the wafer 11, a plasmatized gas for etching, i.e., an etching gas, 58 is supplied to the wafer 11 through the openings in the mask 39. The etching gas 58 thus supplied etches regions of the wafer 11 that extend along the streets 13 surrounding the defective device 15a, forming grooves in the reverse side 11b of the wafer 11.

Figure 14C:
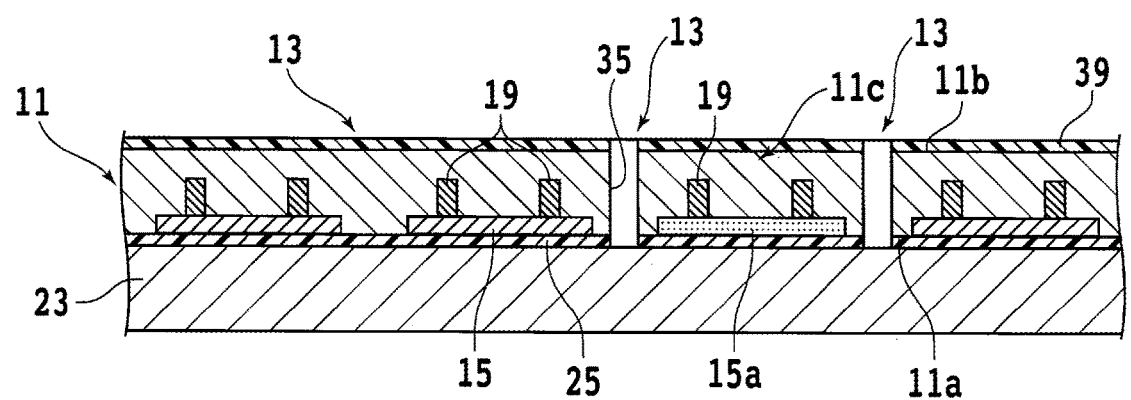
FIG. 14C is a fragmentary cross-sectional view of the wafer after it has been processed by plasma etching.

FIG. 14C illustrates in fragmentary cross section the wafer 11 after it has been processed by plasma etching. As the wafer 11 is progressively etched, the grooves formed in the reverse side 11b of the wafer 11 develop and reach the face side 11a thereof, thereby forming kerfs 35 in the wafer 11 along the streets 13, whereupon the defective device region 11c is divided from the wafer 11. Thereafter, the defective device region 11c is separated from the wafer 11, leaving the through hole 11d in the wafer 11 (see FIGS. 8A, 8B, and 9).

Plasma etching may be carried out by supplying the plasmatized gas 58 to the face side 11a of the wafer 11. In this case, before the wafer 11 is fixed to the support board 23, the mask 39 is formed on the face side 11a of the wafer 11. The plasmatized gas 58 is supplied through the openings in the mask 39 to the wafer 11, forming grooves in the face side 11a of the wafer 11. When the grooves reach the reverse side 11b of the wafer 11, the kerfs 35 are formed in the wafer 11, dividing the defective device region 11c from the wafer 11. Thereafter, the support board 23 is fixed to the face side 11a of the wafer 11.

Through the above process, the defective device region 11c is separated from the wafer 11, leaving the through hole 11d in the wafer 11. As a result, as illustrated in FIG. 3B, the wafer 11 becomes free of the defective device 15a.

Figure 15A:
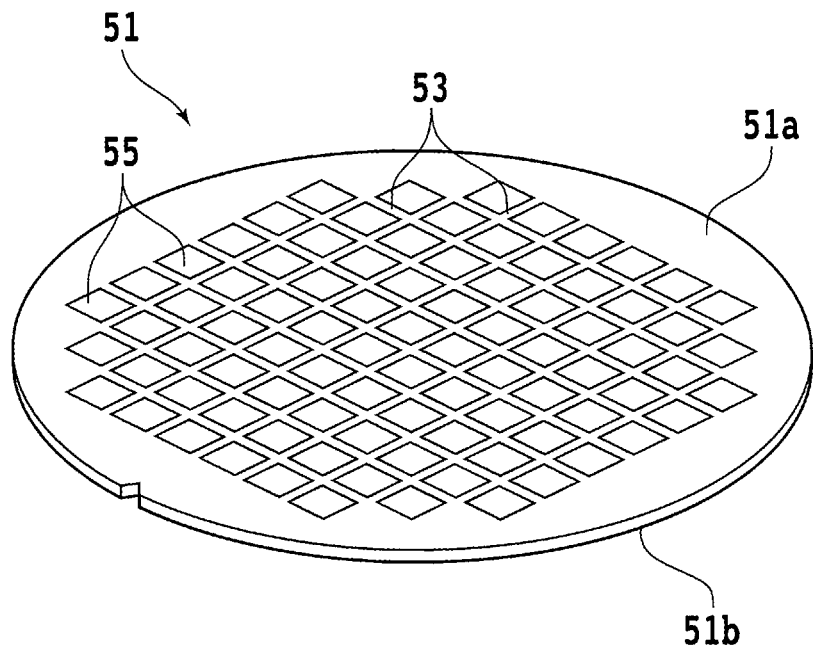
FIG. 15A is a perspective view of a wafer for preparing device chips.

Next, there is prepared a device chip that includes a non-defective semiconductor device 15 of the same kind as the semiconductor device 15 that is determined as a defective product, i.e., the defective device 15a, and that can be inlaid in the through hole 11d. Such a device chip is produced from a wafer that is identical in structure to the wafer 11, for example. FIG. 15A illustrates in perspective a wafer 51 for preparing device chips.

The wafer 51 is made of the same material as the wafer 11 and has a face side, i.e., a first surface, 51a and a reverse side, i.e., a second surface, 51b that is opposite the face side 51a. The wafer 51 has a plurality of rectangular areas demarcated on the face side 51a by a plurality of streets or projected dicing lines 53 arranged in a grid pattern where two groups of streets 53 intersect with each other. The areas demarcated on the face side 51a by the streets 53 include respective semiconductor devices 55 formed therein.

The semiconductor devices 55 have the same functions as those of the semiconductor devices 15 illustrated in FIG. 1A, etc. The semiconductor devices 55 are structurally identical to the semiconductor devices 15. A plurality of electrodes, i.e., via electrodes or through electrodes, 57 (see FIG. 18A) are connected to the semiconductor devices 55. The electrodes 57 are of the same structure and material as the electrodes 19 illustrated in FIG. 1B, etc.

A plurality of device chips each including one of the semiconductor devices 55 are manufactured by dividing the wafer 51 along the streets 53. The wafer 51 is divided into the device chips according to the laser processing or plasma etching described above.

The wafer 51 may be divided into the device chips by a cutting apparatus. The cutting apparatus includes a chuck table for holding the wafer 51 thereon and a cutting unit for cutting the wafer 51 held on the chuck table. The cutting unit includes an annular cutting blade. When the cutting blade is rotated about its central axis and caused to cut into the wafer 51 along the streets 53, the cutting blade divides the wafer 51 along the streets 53. As a result, a plurality of device chips each including one of the semiconductor devices 55 are manufactured from the wafer 51.

Figure 15B:
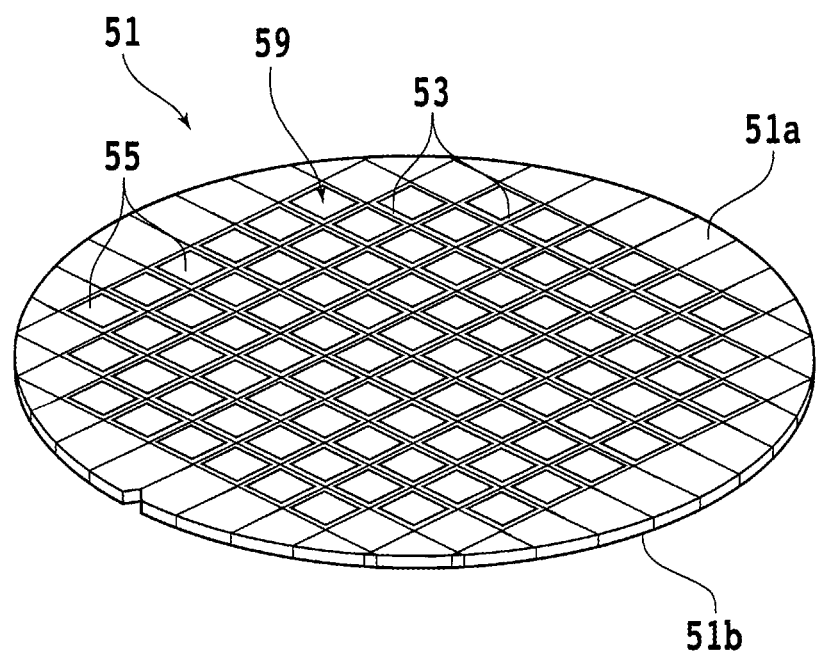
FIG. 15B is a perspective view of the wafer that has been divided into a plurality of device chips.

FIG. 15B illustrates in perspective the wafer 51 that has been divided into a plurality of device chips 59. Before or after the wafer 11 is divided, an inspection is carried out to determine whether each of the semiconductor devices 55 included in the wafer 51 is non-defective or defective. Those device chips 59 that include semiconductor devices 55 determined as defective products are excluded from the device chips 59 obtained by dividing the wafer 51.

In this manner, there are obtained device chips 59 that include the semiconductor devices 55 same as the non-defective semiconductor devices 15 (see FIG. 1A, etc.) in the wafer 11. Specifically, each of the device chips 59 thus obtained includes a non-defective semiconductor device 55 having the same functions as those to be provided by the defective devices 15a (see FIG. 1A, etc.), i.e., a semiconductor device 55 having the functions that the defective devices 15a is originally expected to have.

There is no limitation on the timing of the preparation of the device chips 59. For example, the wafer 51 may be prepared and the semiconductor devices 55 may be inspected at the same time that the wafer 11 is prepared and the semiconductor devices 15 are inspected, and thereafter the device chips 59 may be manufactured by dividing the wafer 51.

Then, the through hole 11d in the wafer 11 is enlarged (enlarging step). In the enlarging step, for example, the wafer 11 is heated and expanded to enlarge the through hole 11d. The enlarged through hole 11d allows the device chip 59 to be inlaid easily therein in a subsequent inlaying step.

Figure 16A:
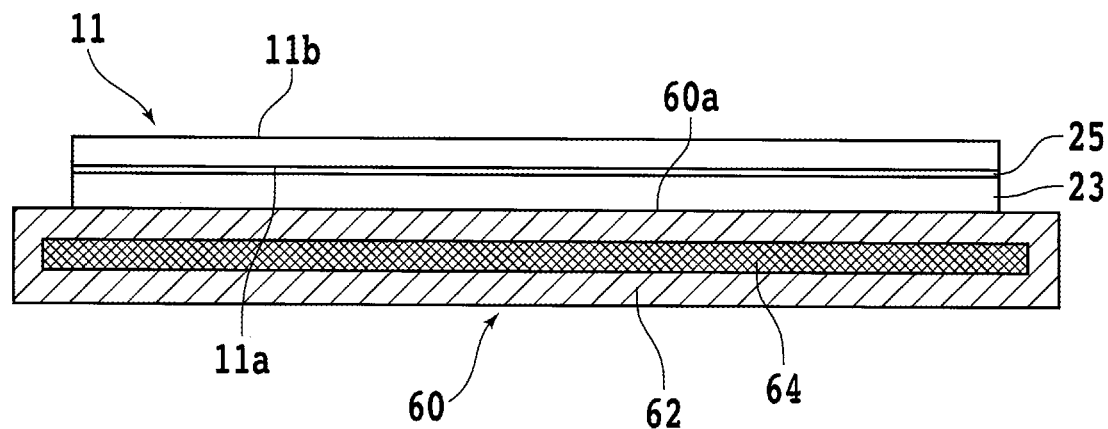
FIG. 16A is a cross-sectional view of a heating unit.

FIG. 16A illustrates a heating unit 60 in cross section. In the enlarging step, for example, the heating unit 60 heats the wafer 11. The heating unit 60 may be a hot plate or the like that is capable of heating the wafer 11. Specifically, the heating unit 60 includes a cylindrical plate 62 made of metal, etc. The plate 62 has a flat upper surface extending horizontally that provides a holding surface 60a of the heating unit 60. The plate 62 houses therein a heat source, i.e., a heater, 64. When the heat source 64 is energized, it generates heat to heat the plate 62.

The wafer 11 is placed on the holding surface 60a of the heating unit 60 with the support board 23 interposed therebetween, for example. When the heat source 64 is then energized, the heat from the heat source 64 is transmitted through the plate 62, heating the holding surface 60a. As a consequence, the wafer 11 and the support board 23 are heated and expanded. If the wafer 11 and the support board 23 are made of silicon, then the heating temperature, i.e., the temperature of the heat source 64, may be set to a value in the range from 50° C. inclusive to 200° C. inclusive, and the heating period of time during which the heat source 64 heats the wafer 11 and the support board 23 may be set to a value in the range from 10 seconds inclusive to 10 minutes inclusive.

Figure 16B:
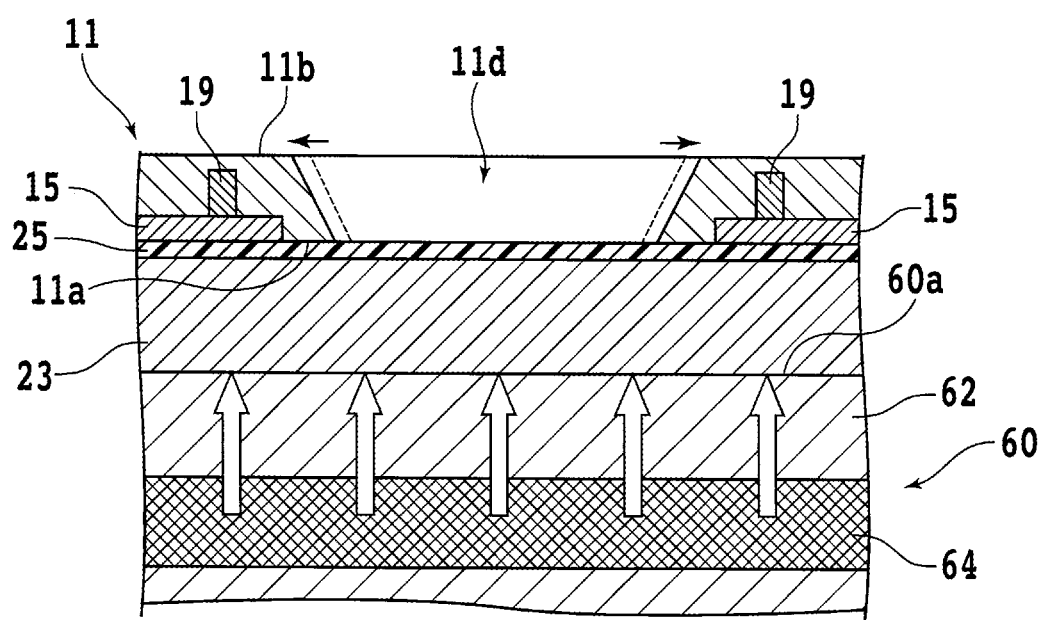
FIG. 16B is a fragmentary cross-sectional view of the wafer in an expanding step.

FIG. 16B illustrates in fragmentary cross section the wafer 11 in the enlarging step. When the heating unit 60 heats and expands the wafer 11 and the support board 23, inner wall surfaces of the through hole 11d are moved outwardly of the through hole 11d as the wafer 11 is expanded, enlarging the through hole 11d. The wafer 11 is continuously heated until the through hole 11d is enlarged to a desired size. The dimensions of the expanded through hole 11d can be controlled by adjusting the heating temperature and the heating period of time.

There is no limitation on how to heat the wafer 11. For example, hot air may be applied to the wafer 11 to heat the wafer 11. Hot air may be applied by a heat gun. The heat gun includes a heat source, i.e., a heat generating mechanism such as an electric heating wire and an air blowing mechanism such as a fan, and heats and ejects air. Alternatively, an infrared lamp may apply infrared rays to the wafer 11 to heat the wafer 11. Further alternatively, the wafer 11 may be placed in an oven and heated by the oven.

In the enlarging step, the through hole 11d may be enlarged by a process other than heating the wafer 11. For example, a plasmatized gas (see the gas 36 in FIG. 7A) may be supplied to the through hole 11d to perform plasma etching on the inner wall surfaces of the through hole 11d for enlarging the through hole 11d. If the wafer 11 is a silicon wafer, for example, then a fluorine gas such as $CF_4$ or $SF_6$ is used for plasma etching. Conditions for plasma etching, e.g., an etching time, etc. are appropriately established to enlarge the through hole 11d to a desired size. Alternatively, an etching solution may be supplied to the through hole 11d to perform wet etching on the inner wall surfaces of the through hole 11d to enlarge the through hole 11d. If the wafer 11 is a silicon wafer, for example, then an etching solution containing KOH, TMAH, or the like is used for wet etching. Conditions for wet etching, e.g., an etching time, etc. are appropriately established to enlarge the through hole 11d to a desired size.

Figure 17:
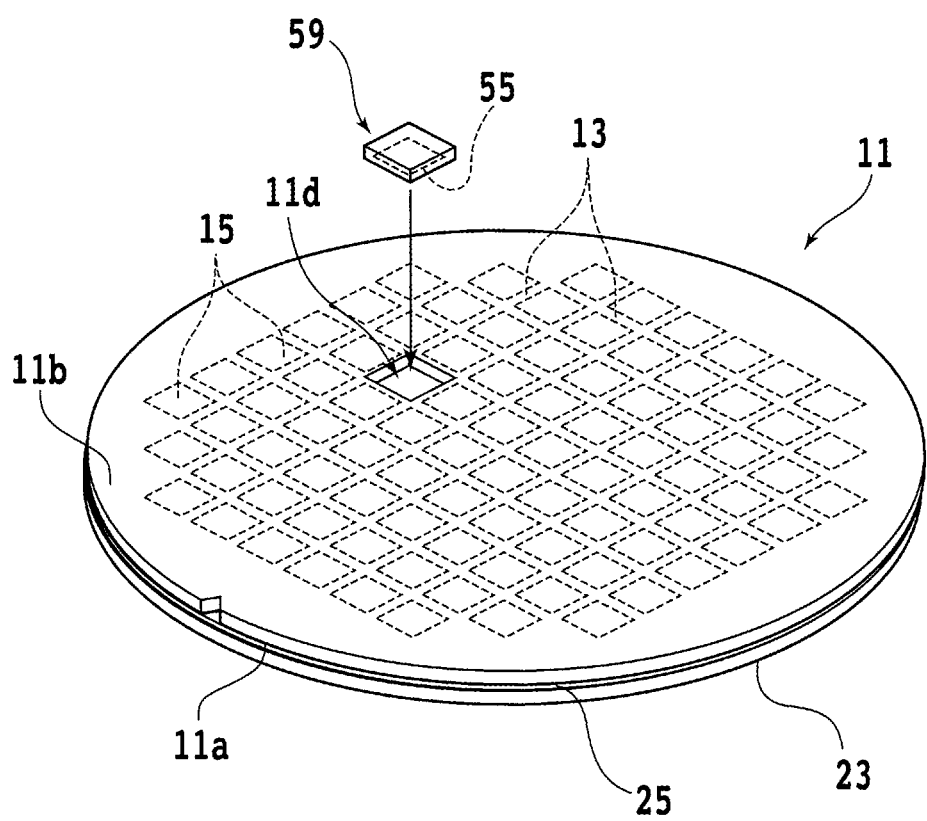
FIG. 17 is a perspective view of the wafer in an inlaying step.

Next, a device chip 59 is inlaid in the enlarged through hole 11d (inlaying step). FIG. 17 illustrates in perspective the wafer 11 in the inlaying step.

In the case where the face side 11a, i.e., the semiconductor device 15 side, of the wafer 11 is fixed to the support board 23, the device chip 59 is positioned such that the surface, i.e., the face side, of the device chip 59 where the semiconductor device 55 is disposed faces the support board 23. Then, the device chip 59 is inlaid in the through hole 11d in the wafer 11.

Figure 18A:
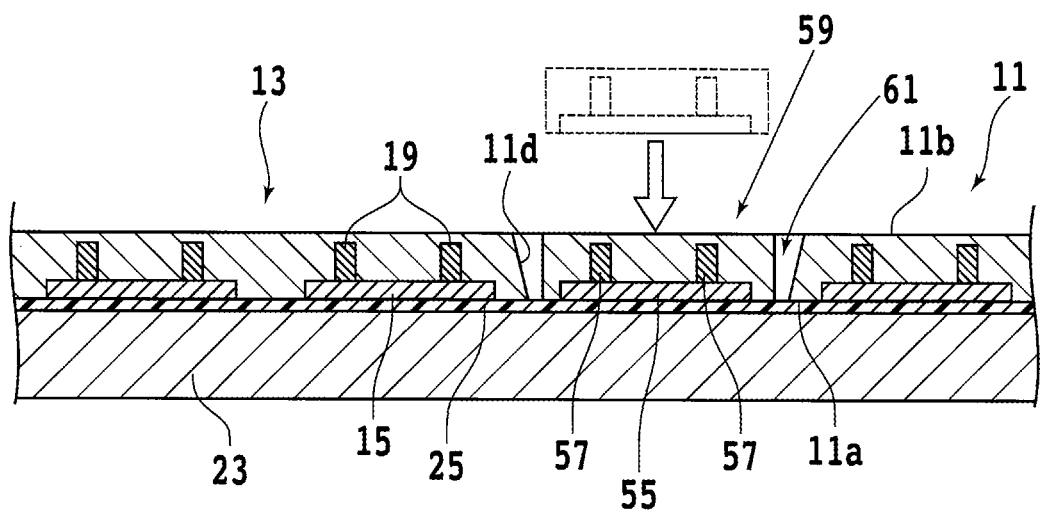
FIG. 18A is a fragmentary cross-sectional view of the wafer with a device chip inlaid therein.

FIG. 18A illustrates in fragmentary cross section the wafer 11 with the device chip 59 inlaid therein. The device chip 59 is inlaid in the through hole 11d in contact with the adhesive layer 25 that is exposed in the through hole 11d. The device chip 59 is thus fixed to the support board 23 with the adhesive layer 25 interposed therebetween.

The device chip 59 is inlaid in the through hole 11d that has been enlarged in the enlarging step described above. Consequently, even in the case where the through hole 11d is smaller than the device chip 59 immediately after the defective device region 11c has been separated from the wafer 11 (see FIG. 8B), the device chip 59 can reliably be inlaid in the through hole 11d in the inlaying step. Therefore, it is not necessary to adjust the dimensions of the device chip 59 and remake the device chip 59. The device chip 59 may be inlaid in the through hole 11d while the wafer 11 is being continuously heated in the enlarging step.

In the case where the wafer 11 is secured temporarily to the support board 23 by the adhesive layer 25 and the bonding between the wafer 11 and the support board 23 is weak, a process of firmly fixing the wafer 11 to the support board 23, i.e., a fully fixing process, is performed after the device chip 59 has been inlaid in the through hole 11d. According to the fully fixing process, the wafer 11 and the device chip 59 are firmly fixed to the support board 23 with the adhesive layer 25 interposed therebetween.

For example, if the adhesive layer 25 is an adhesive made of a thermosetting resin, then the assembly is heated at a higher temperature or for a longer period of time than when the wafer 11 is secured temporarily to the support board 23, thereby hardening the thermosetting resin to strengthen the bonding between the wafer 11 and the support board 23. If the adhesive layer 25 is an adhesive made of an ultraviolet-curable resin, then a heating process is performed on the ultraviolet-curable resin to strengthen the bonding between the wafer 11 and the support board 23. If the adhesive layer 25 is a thermocompression bonding sheet, then the wafer 11 and the support board 23 are pressed against the thermocompression bonding sheet while the assembly is being heated at a higher temperature or for a longer period of time than when the wafer 11 is secured temporarily to the support board 23, thereby strengthening the bonding between the wafer 11 and the support board 23.

In the removing step, if the wafer 11 is temporarily secured to the support board 23 by using the adhesive layer 25 whose adhesive power is relatively weak, then the wafer 11 and the support board 23 may be separated from each other prior to the inlaying step, and the wafer 11 may be fixed again to the support board 23 by using another adhesive layer whose adhesive power is higher than the adhesive layer 25.

Figure 18B:
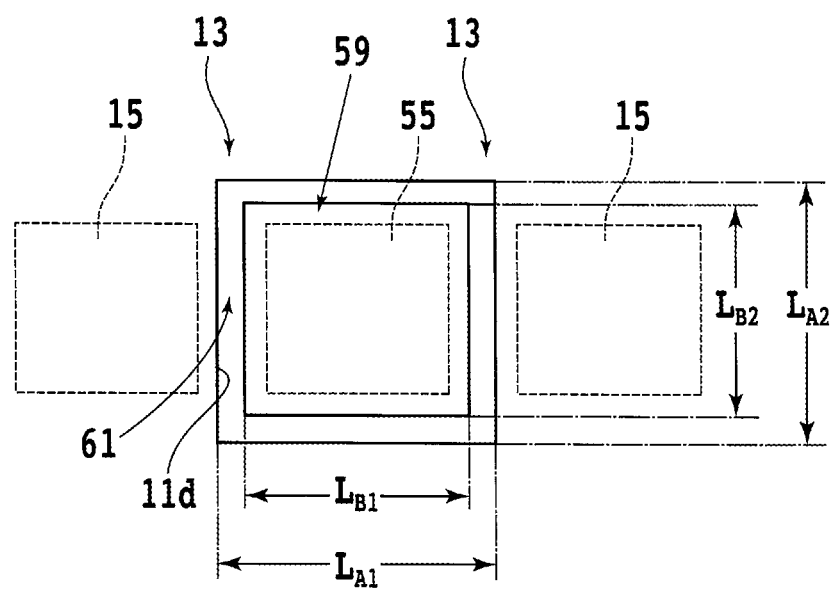
FIG. 18B is a plan view illustrating a through hole.

FIG. 18B illustrates the through hole 11d in plan. In the enlarging step, the through hole 11d is enlarged to a size larger than the device chip 59. Specifically, the length $L_{A1}$ of the through hole 11d in first directions, i.e., leftward and rightward directions in FIG. 18B, is larger than the length $L_{B1}$ of the device chip 59 in the first directions. Moreover, the length $L_{A2}$ of the through hole 11d in second directions perpendicular to the first directions, i.e., upward and downward directions in FIG. 18B, is larger than the length $L_{B2}$ of the device chip 59 in the second directions. Therefore, when the device chip 59 is inlaid in the through hole 11d, a gap 61 is created between the wafer 11 and the device chip 59 in surrounding relation to the device chip 59.

In a subsequent step, i.e., a resin filling step to be described later, the gap 61 is filled with a resin. Therefore, it is preferable that the gap 61 have at least a certain width, i.e., a certain distance between the inner wall surfaces of the through hole 11d and side surfaces of the device chip 59. For example, the size of the through hole 11d or the device chip 59 is adjusted such that the width of the gap 61 is equal to or larger than 2 μm, preferably 5 μm, or more preferably 10 μm.

Specific dimensions of the through hole 11d are appropriately established in view of the positions of the semiconductor devices 15 and 55, etc. For example, on the face side 11a of the wafer 11, the distance between ends, i.e., the inner wall surfaces, of the through hole 11d and ends of the semiconductor device 15 is equal to or larger than 2 μm or preferably 5 μm. Furthermore, on the face side 11a of the wafer 11, the ends of the through hole 11d may be positioned closer to the semiconductor device 15 than centers of the streets 13 in the widthwise directions thereof. In the case where the inner wall surfaces of the through holes 11d are inclined to the thicknesswise directions of the wafer 11, as illustrated in FIG. 18A, part of the region of the through hole 11d on the reverse side 11b of the wafer 11 may overlap part of the semiconductor device 15 included in the wafer 11.

The device chip 59 is not limited to any particular dimensions as long as it can be inlaid in the through hole 11d. For example, on the face side of the device chip 59, the distance between ends of the semiconductor device 55 and ends of the device chip 59 is set to at most ½ of the width of the streets 13 established on the wafer 11.

In the inlaying step, instead of fixing the device chip 59 to the adhesive layer 25, the device chip 59 with an adhesive layer attached thereto may be inlaid in the through hole 11d. Specifically, the adhesive layer 25 exposed in the through hole 11d may be removed by a process such as plasma etching or wet etching, i.e., a chemical solution process, after which the device chip 59 with an adhesive layer attached thereto may be fixed to the support board 23 with the adhesive layer interposed therebetween.

Figure 19A:
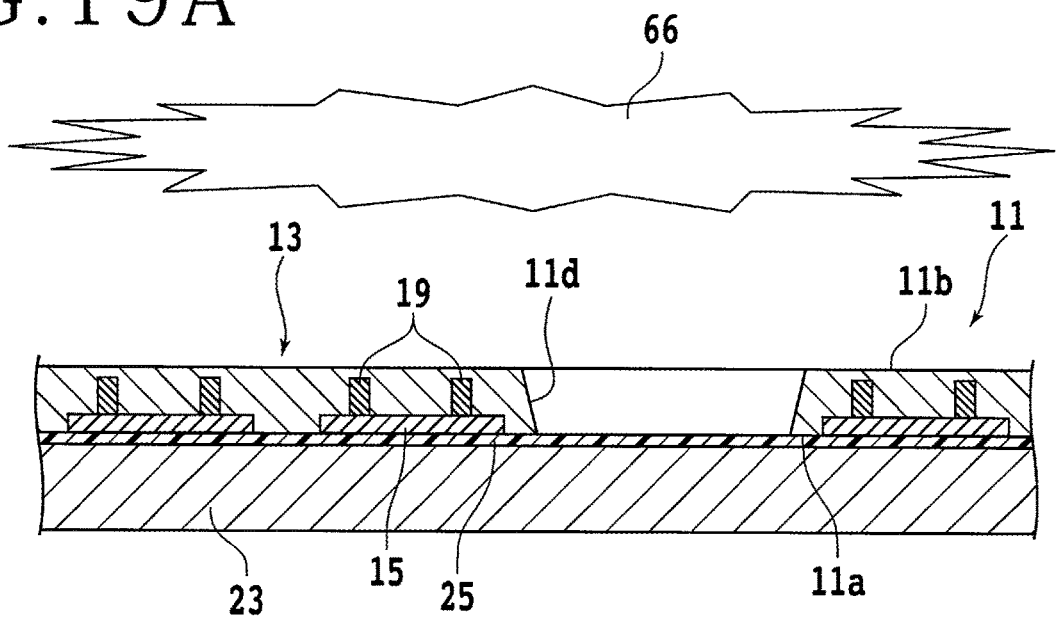
FIG. 19A is a fragmentary cross-sectional view of the wafer in which an adhesive layer is processed by plasma etching.

FIG. 19A illustrates in fragmentary cross section the wafer 11 in which the adhesive layer 25 is processed by plasma etching. For example, a plasmatized gas, i.e., an etching gas, 66 is supplied to the reverse side 11b of the wafer 11, thereby removing the region of the adhesive layer 25 that overlaps the through hole 11d. In the case where plasma etching is performed on the wafer 11 in the enlarging step, the through hole 11d may be enlarged and the adhesive layer 25 may be removed at the same time by plasma etching.

Figure 19B:
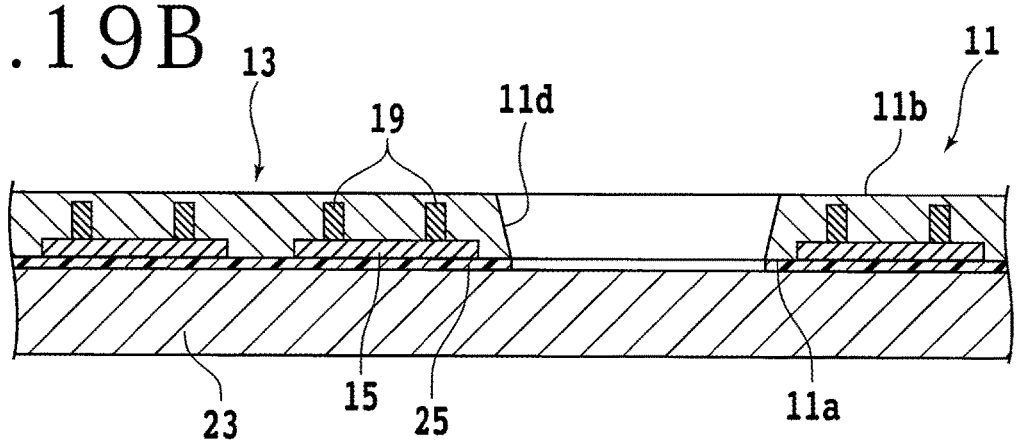
FIG. 19B is a fragmentary cross-sectional view of the wafer from which a portion of the adhesive layer has been removed.

FIG. 19B illustrates in fragmentary cross section the wafer 11 from which a portion of the adhesive layer 25 has been removed. When the region of the adhesive layer 25 that overlaps the through hole 11d is removed, the region of the upper surface of the support board 23 that overlaps the through hole 11d is exposed. In the case where plasma etching is performed on the wafer 11, a mask for exposing the through hole 11d therethrough may be formed on the reverse side 11b of the wafer 11.

Figure 19C:
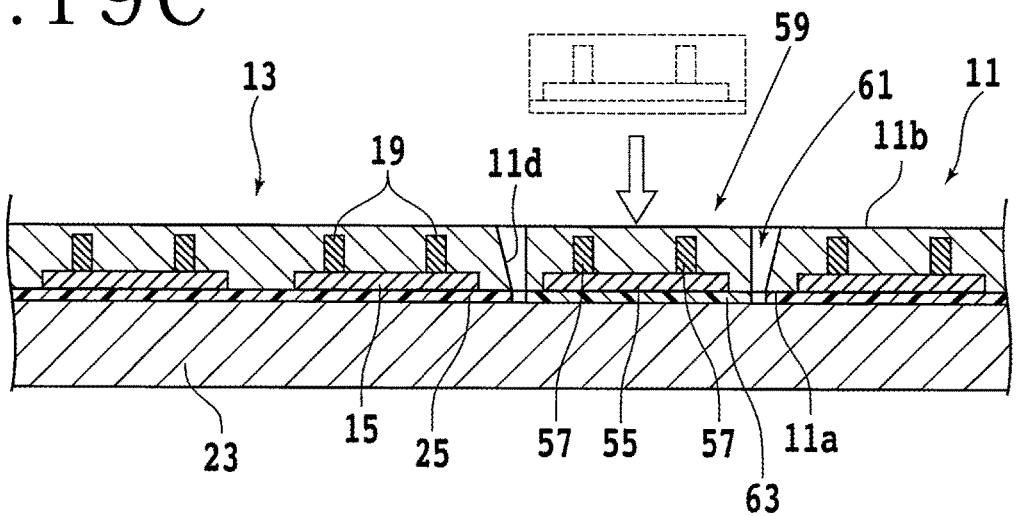
FIG. 19C is a fragmentary cross-sectional view of the wafer in which a device chip with an adhesive layer attached thereto has been inlaid.

Then, the device chip 59 with an adhesive layer attached thereto is inlaid in the through hole 11d. FIG. 19C illustrates in fragmentary cross section the wafer 11 in which the device chip 59 with an adhesive layer 63 attached thereto has been inlaid. The adhesive layer 63 is disposed on the face side of the device chip 59, i.e., on the semiconductor device 55 side of the device chip 59. The adhesive layer 63 is made of the same material as the adhesive layer 25 by way of example. The device chip 59 is fixed to the upper surface of the support board 23 that is exposed in the through hole 11d, with the adhesive layer 63 interposed therebetween.

After the device chip 59 has been inlaid in the through hole 11*d*, a fully fixing process is performed on the adhesive layers 25 and 63, if necessary. The wafer 11 and the device chip 59 are now firmly fixed to the support board 23 with the adhesive layers 25 and 63 interposed therebetween.

Figure 20A:
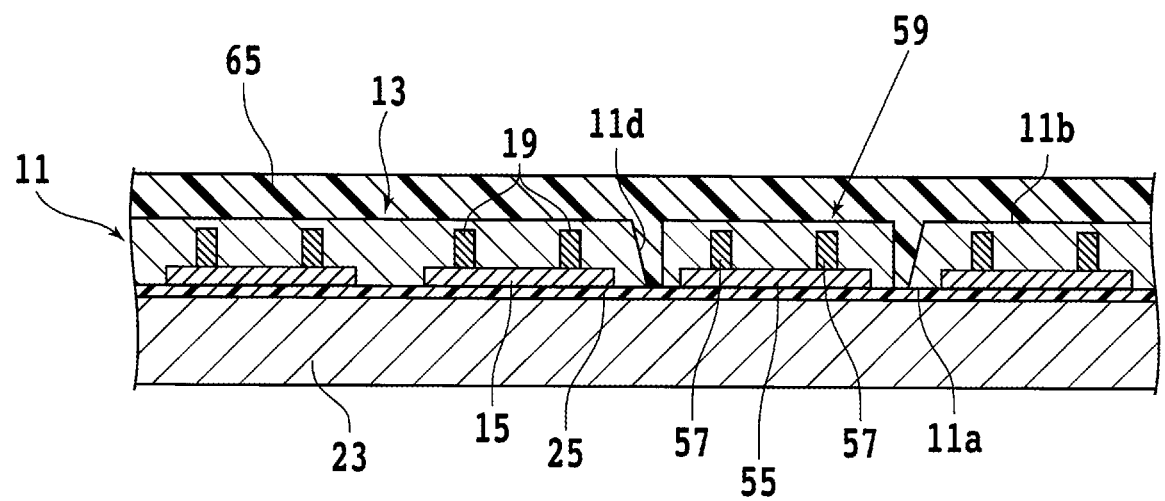
FIG. 20A is a fragmentary cross-sectional view of the wafer in a resin filling step.

Next, the gap 61 between the wafer 11 and the device chip 59 is filled with a resin (resin filling step). FIG. 20A illustrates in fragmentary cross section the wafer 11 in the resin filling step.

In the resin filling step, a resin 65 is formed on the reverse side 11*b* of the wafer 11. For example, the resin 65 is formed on the reverse side 11*b* of the wafer 11 by applying a liquid resin such as an epoxy resin to the reverse side 11*b* and then hardening the applied liquid resin. However, the resin 65 is not limited to any particular materials.

When the liquid resin is applied to the reverse side 11*b* of the wafer 11, part of the liquid resin flows into the gap 61 (see FIGS. 18A, 18B, etc.) between the wafer 11 and the device chip 59, filling the gap 61. Then, when the liquid resin is hardened, the wafer 11 and the device chip 59 are interconnected by the hardened liquid resin, i.e., the resin 65, so that the device chip 59 is fixed to the wafer 11.

Then, the resin 65 formed outside of the gap 61 is ground (resin grinding step). In the resin grinding step, the resin 65 formed on the reverse side 11*b* of the wafer 11 is removed by a grinding process. The resin 65 is ground using the grinding apparatus 2 (see FIG. 2), for example.

Figure 20B:
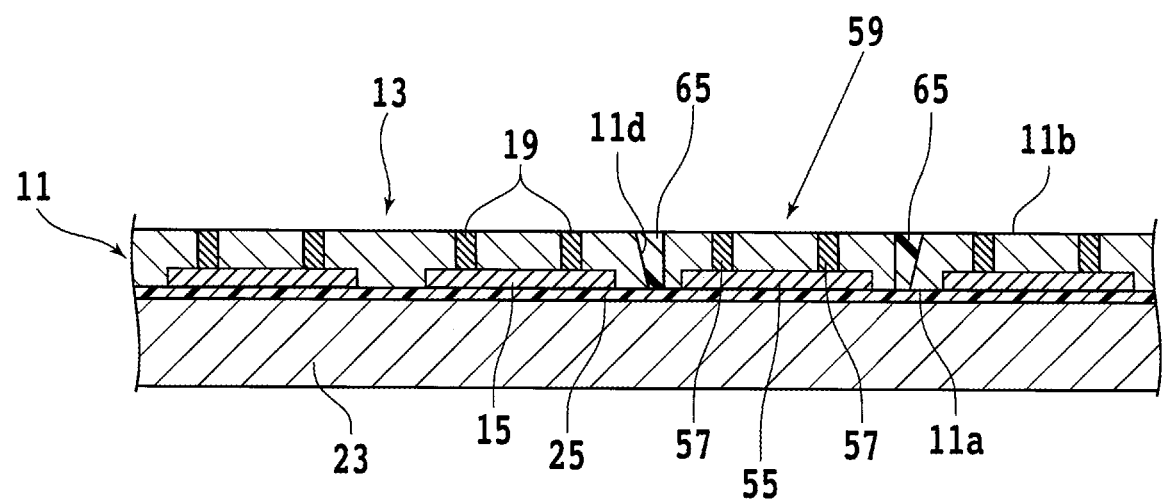
FIG. 20B is a fragmentary cross-sectional view of the wafer in a resin grinding step.

FIG. 20B illustrates in fragmentary cross section the wafer 11 in the resin grinding step. In the resin grinding step, for example, the resin 65 formed outside of the gap 61 is removed by being ground, and the reverse side 11*b* of the wafer 11 is ground. The wafer 11 is thinned down until the electrodes 19 and 57 are exposed on the reverse side 11*b* of the wafer 11.

There is no limitation on how to expose the electrodes 19 and 57. For example, after the resin 65 has been ground until the reverse side 11*b* of the wafer 11 is exposed in the resin grinding step, an etching process such as plasma etching or wet etching may be performed on the reverse side 11*b* of the wafer 11 to expose the electrodes 19 and 57. In this case, the grindstones 16 (see FIG. 2) are prevented from contacting the electrodes 19 and 57 and scattering around metal contained in the electrodes 19 and 57.

According to the above process, there is obtained a wafer 11 including electrodes 19 and 57 exposed on the reverse side 11*b* thereof. It is thus possible to connect the semiconductor devices 15 and 55 to semiconductor devices (not illustrated) included in another wafer stacked on the reverse side 11*b* of the wafer 11 through the electrodes 19 and 57. In other words, a wafer 11 that can be used to fabricate a stacked wafer can be manufactured by the method of manufacturing a wafer according to the present embodiment.

Figure 21:
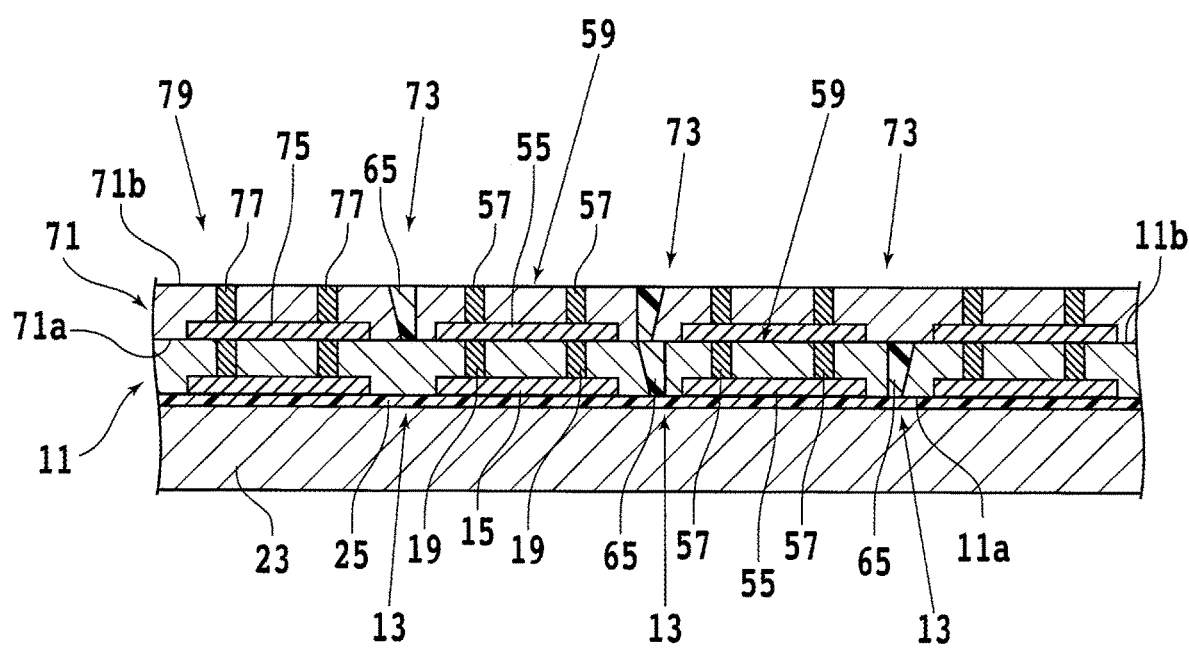
FIG. 21 is a fragmentary cross-sectional view of a stacked wafer.

A specific example of a method of manufacturing a device chip, i.e., a stacked device chip, including a plurality of stacked semiconductor devices by using the above wafer 11 will be described below. For manufacturing a stacked device chip, a stacked wafer having a plurality of stacked wafers is formed (wafer stacking step). FIG. 21 illustrates a stacked wafer 79 in fragmentary cross section.

In the wafer stacking step, a wafer 11 after the resin grinding step, i.e., a first wafer, and another wafer 71 prepared in the wafer preparing step described above, i.e., a second wafer, are used. The wafer 71 is structurally identical to the wafer 11.

Specifically, the wafer 71 is made of the same material as the wafer 11 and has a face side, i.e., a first surface, 71*a* and a reverse side, i.e., a second surface, 71*b* that is opposite the face side 71*a*. The wafer 71 has a plurality of rectangular areas demarcated on the face side 71*a* by a plurality of streets or projected dicing lines 73 arranged in a grid pattern where two groups of streets 73 intersect with each other. The areas demarcated on the face side 71*a* by the streets 73 include respective semiconductor devices 75 formed therein.

The semiconductor devices 75 are structurally identical to the semiconductor devices 15. A plurality of electrodes, i.e., via electrodes or through electrodes, 77 are connected to the semiconductor devices 75. The electrodes 77 are of the same structure and material as the electrodes 19.

The wafer 71 is stacked on the wafer 11. For example, the wafer 71 is bonded to the wafer 11 such that the face side 71*a* of the wafer 71 faces the reverse side 11*b* of the wafer 11. There is no limitation on how to bond the wafer 11 and the wafer 71 to each other. For example, the wafer 11 and the wafer 71 may be bonded to each other by direct bonding. Specifically, the reverse side 11*b* of the wafer 11 and the face side 71*a* of the wafer 71 are bonded to each other by surface activated bonding.

However, the wafer 11 and the wafer 71 may be bonded to each other by indirect bonding. For example, the wafer 11 and the wafer 71 may be bonded to each other by stacking the wafer 71 on the wafer 11 with a permanent adhesive interposed therebetween.

If a defective device is included among the semiconductor devices 75 formed in the wafer 71, then the grinding step, the removing step, the enlarging step, the inlaying step, the resin filling step, and the resin grinding step are performed on the wafer 71 before or after the wafer 71 is stacked on the wafer 11. As a result, the defective device is removed from the wafer 71, and a device chip 59 including a non-defective semiconductor device 55 is inlaid in the wafer 71.

The wafer 11 and the wafer 71 are bonded to each other such that the streets 13 and the streets 73 overlap each other and the semiconductor devices 15 and 55 included in the wafer 11 and the semiconductor devices 75 and 55 included in the wafer 71 overlap each other. As a consequence, the semiconductor devices 15 and 55 included in the wafer 11 and the semiconductor devices 75 and 55 included in the wafer 71 are interconnected by the electrodes 19 and 57.

In this manner, the stacked wafer 79 that includes the wafer 11 and the wafer 71 that are stacked one on the other is produced. In the wafer stacking step, a plurality of wafers 71 may be stacked on the wafer 11. For example, still another wafer or other wafers 71 may be stacked on the wafer 71 that has been stacked on the wafer 11. In this case, the grinding step, the removing step, the enlarging step, the inlaying step, the resin filling step, and the resin grinding step are performed on each of the wafers 71 stacked on the wafer 11. In this fashion, there is obtained a stacked wafer 79 including a plurality of wafers as three or more layers.

Figure 22A:
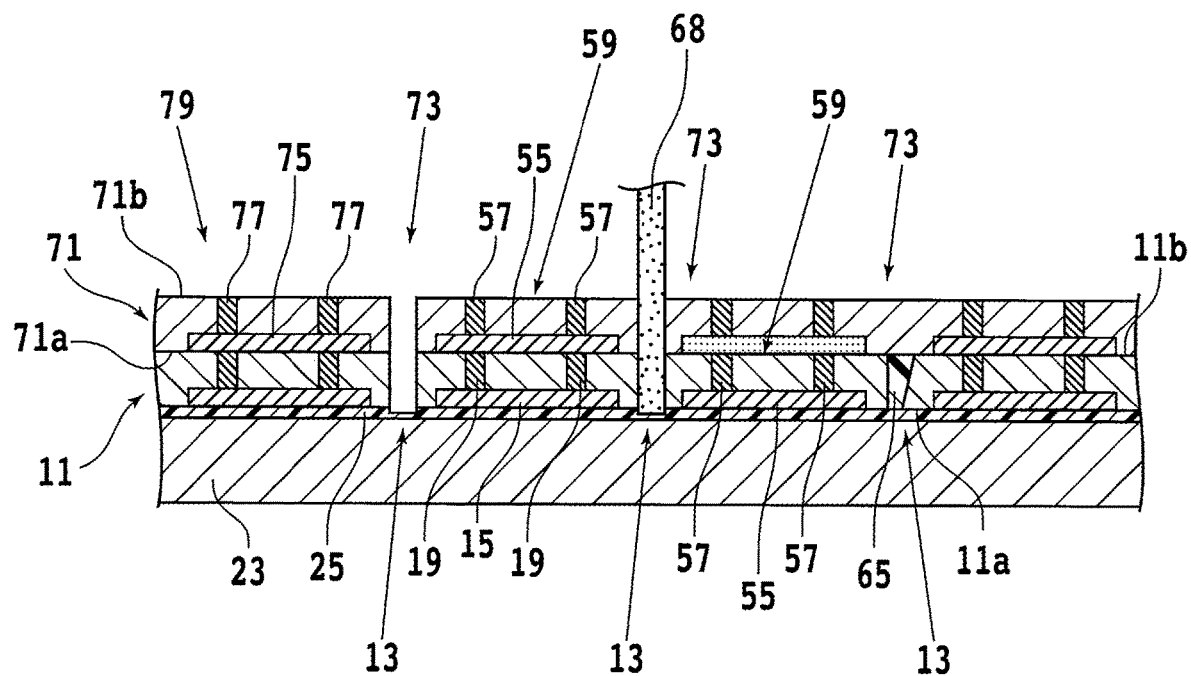
FIG. 22A is a fragmentary cross-sectional view of the stacked wafer in a dividing step.

Then, the stacked wafer 79 is divided along the streets 13 and 73 to form stacked device chips each including a plurality of stacked semiconductor devices (dividing step). FIG. 22A illustrates in fragmentary cross section the stacked wafer 79 in the dividing step.

In the dividing step, the stacked wafer 79 is cut by a cutting apparatus, for example. The cutting apparatus includes a chuck table for holding the stacked wafer 79 thereon and a cutting unit for cutting the stacked wafer 79 held on the chuck table. The cutting unit includes a hollow cylindrical spindle rotatable about its central axis by a rotary actuator such as an electric motor. The cutting unit also includes an annular cutting blade 68 mounted on a distal end of the spindle for cutting the stacked wafer 79.

The cutting blade 68 is a hub-type cutting blade, i.e., a hub blade, for example. The hub blade includes an annular base made of metal, etc. and an annular cutting edge disposed on and extending along an outer circumferential edge portion of the annular base. The cutting edge includes an electroformed grindstone where abrasive grains of diamond or the like are bound together by a binding material such as nickel plating.

Alternatively, the cutting blade 68 may be a washer-type cutting blade, i.e., a washer blade. The washer blade includes an annular cutting edge where abrasive grains are bound together by a binder made of metal, ceramic, resin, or the like.

When the cutting apparatus is in operation, the cutting blade 68 is rotated about its central axis and caused to cut into the stacked wafer 79, dividing the stacked wafer 79. Specifically, the cutting blade 68 is located radially outwardly of the stacked wafer 79 and has its lower end positioned below the face side 11a of the wafer 11, i.e., the upper surface of the adhesive layer 25. Then, the cutting blade 68 is rotated about its central axis, and the cutting blade 68 and the stacked wafer 79 are relatively moved horizontally to cause the cutting blade 68 to cut into the stacked wafer 79 along one aligned set of the streets 13 and 73. When the cutting blade 68 cuts the stacked wafer 79 along all the streets 13 and 73, the stacked wafer 79 is divided into a plurality of stacked device chips.

Figure 22B:
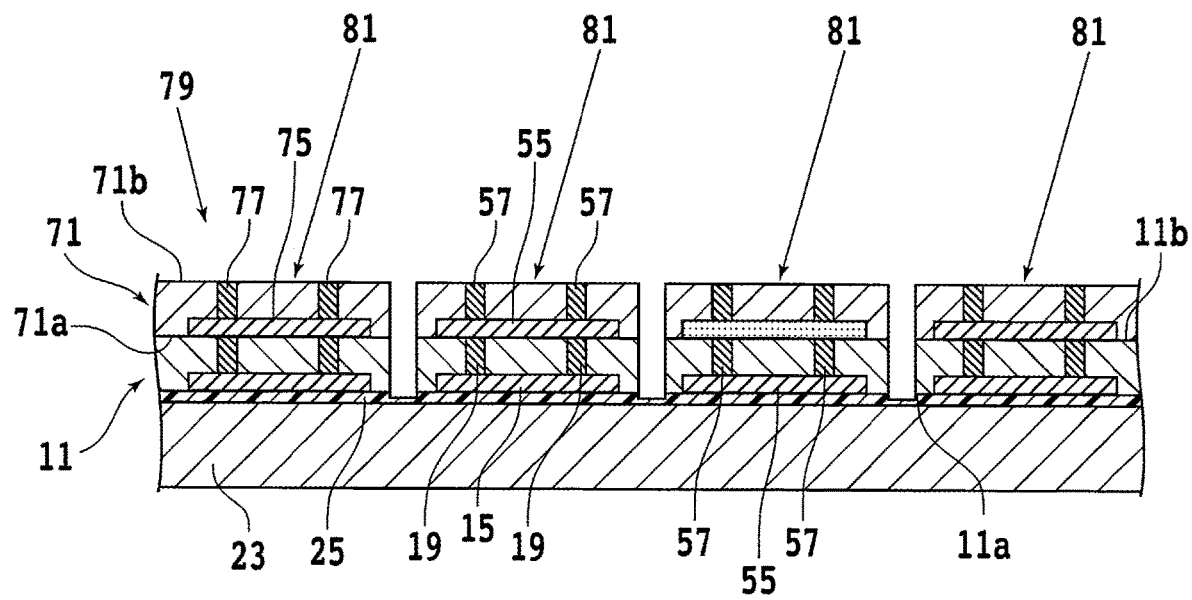
FIG. 22B is a fragmentary cross-sectional view of the stacked wafer that has been divided into a plurality of stacked device chips.

FIG. 22B illustrates in fragmentary cross section the stacked wafer 79 that has been divided into a plurality of stacked device chips 81. Each of the stacked device chips 81 includes one of the semiconductor devices 15 or the semiconductor device 55, i.e., a first semiconductor device, included in the wafer 11 and one of the semiconductor devices 75 or the semiconductor device 55, i.e., a second semiconductor device, included in the wafer 71. The first semiconductor device and the second semiconductor device are stacked one on the other and interconnected by the electrodes 19 or the electrodes 57.

In the method of manufacturing a wafer according to the present embodiment as described above, a defective device region 11c is removed from a wafer 11, and a device chip 59 including a non-defective semiconductor device 15 is inlaid in a space left in the wafer 11 by the removal of the defective device region 11c therefrom, i.e., a removed region. In this fashion, a wafer 11 free of defective devices 15a is manufactured. Wafers 11 free of defective devices 15a are stacked into a stacked wafer 79, and the stacked wafer 79 is divided into stacked device chips 81 that are free of defective devices 15a. As a result, the yield of stacked device chips 81 is prevented from being reduced.

In the method of manufacturing a wafer according to the present embodiment, furthermore, before the device chip 59 is inlaid in a through hole 11d left in the wafer 11 by the removal of the defective device region 11c, the through hole 11d is enlarged by heating the wafer 11, etc. Therefore, even in the case where the through hole 11d is not sufficiently large at the time the defective device region 11c is removed, the device chip 59 can reliably be inlaid in the through hole 11d. Therefore, it is not necessary to adjust the dimensions of the device chip 59 and remake the device chip 59, making it possible to efficiently manufacture a wafer 11 free of defective devices 15a.

Second Embodiment

In the first embodiment, it has been described by way of example that the defective device region 11c is separated from the wafer 11 by the laser beam applied thereto in the removing step. In the present embodiment, there will be described a process of separating a defective device region 11c from a wafer 11 by performing a fracturing process of fracturing the wafer 11 in the removing step after the wafer preparing step and the grinding step (see FIG. 2) has been carried out.

The fracturing process according to the present embodiment is not limited to any particular process insofar as it can process the wafer 11. Examples of the fracturing process for processing the wafer 11 include a sandblasting process, a water jetting process, a drilling process, and so on.

Figure 23A:
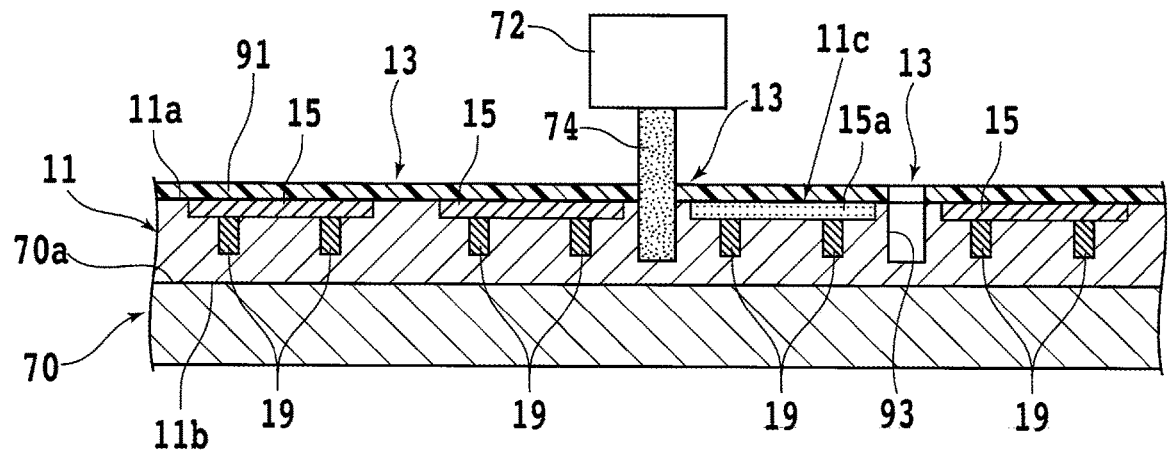
FIG. 23A is a fragmentary cross-sectional view of the wafer in which a groove is formed by a sandblasting process.

FIG. 23A illustrates in fragmentary cross section the wafer 11 in which a groove 93 is formed by a sandblasting process. The sandblasting process is carried out using a sandblasting unit 72 for ejecting an abrasive agent 74. For example, the sandblasting unit 72 includes a compressor for compressing a gas such as air and delivering the compressed gas and a blast gun for ejecting the abrasive agent 74 together with the compressed gas. When the abrasive agent 74 ejected from the sandblasting unit 72 impinges upon the wafer 11, the wafer 11 is processed thereby.

For performing the fracturing process, a protective layer 91 is first formed on the wafer 11. In the case where the face side 11a of the wafer 11 is to be processed, for example, the face side 11a of the wafer 11 is covered with the protective layer 91, protecting the semiconductor devices 15. The protective layer 91 is not limited to any particular materials and may be made of a water-soluble resin such as PVA or PEG, for example. If it is unlikely for the fracturing process to damage the semiconductor devices 15, then the formation of the protective layer 91 may be omitted.

Then, the wafer 11 is held on a holding table 70. The holding table 70 has an upper surface that provides a flat holding surface 70a for holding the wafer 11 thereon. For example, the wafer 11 is placed on the holding table 70 such that the face side 11a of the wafer 11 is exposed upwardly and the reverse side 11b thereof faces the holding surface 70a.

Then, the abrasive agent 74 is ejected from the sandblasting unit 72 to the wafer 11 along the four streets 13 that surround the defective device 15a. As a result, a strip-shaped groove 93 is formed in the face side 11a of the wafer 11 along the streets 13. The groove 93 is of a rectangular shape surrounding the defective device 15a as viewed in plan.

Figure 23B:
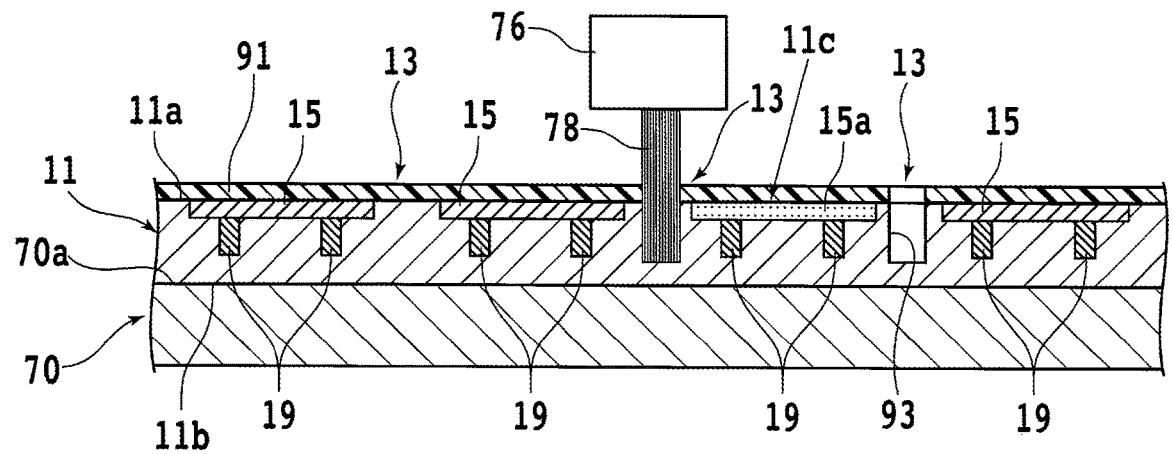
FIG. 23B is a fragmentary cross-sectional view of the wafer in which a groove is formed by a water jetting process.

FIG. 23B illustrates in fragmentary cross section the wafer 11 in which a groove 93 is formed by a water jetting process. The water jetting process is carried out using a water jetting unit 76 for ejecting a liquid 78 such as water. The water jetting unit 76 includes a nozzle for ejecting the liquid 78 pressurized by a pump. The liquid 78 may contain abrasive grains. When the liquid 78 ejected from the water jetting unit 76 impinges upon the wafer 11, the wafer 11 is processed thereby.

Specifically, the liquid 78 ejected from the water jetting unit 76 is applied to the wafer 11 along the four streets 13 that surround the defective device 15a. As a result, a strip-shaped groove 93 is formed in the face side 11a of the wafer 11 along the streets 13. The groove 93 is of a rectangular shape surrounding the defective device 15a as viewed in plan.

Figure 23C:
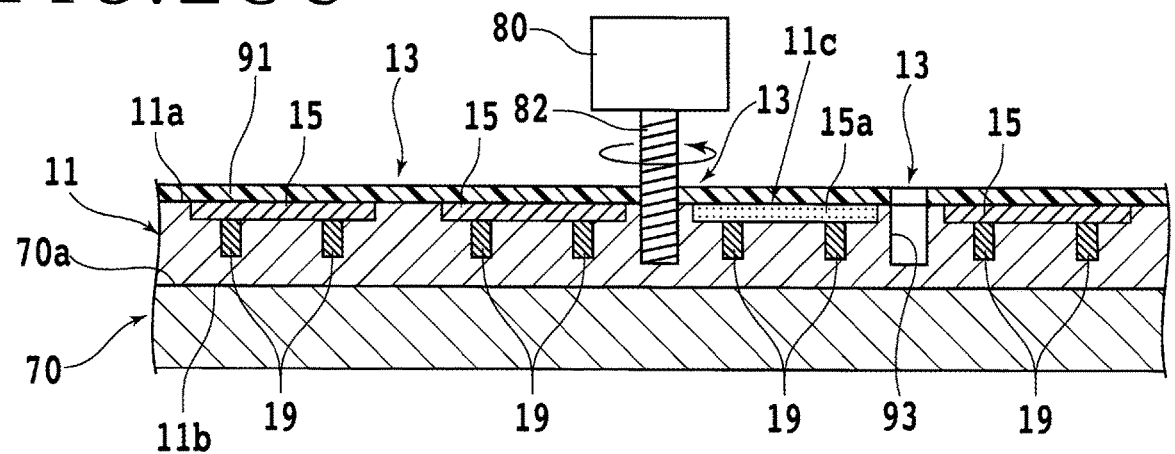
FIG. 23C is a fragmentary cross-sectional view of the wafer in which a groove is formed by a drilling process.

FIG. 23C illustrates in fragmentary cross section the wafer 11 in which a groove 93 is formed by a drilling process. The drilling process is carried out using a drilling unit 80 with a rod-shaped drill bit 82 mounted thereon. The drilling unit 80 includes a rotary actuator such as an electric motor for rotating the drill bit 82 about its central axis. When the drill bit 82 is rotated about its central axis and at the same time the tip end of the drill bit 82 is brought into contact with the wafer 11, the wafer 11 is processed.

Specifically, the rotating drill bit 82 is brought into contact with the region of the wafer 11 that overlaps one of the streets 13 on the wafer 11 and pressed into the wafer 11 to form a cylindrical groove in the wafer 11. Then, the holding table 70 or the drill bit 82 is moved along the street 13 for a distance smaller than the diameter of the cylindrical groove formed in the wafer 11. Thereafter, the drill bit 82 is pulled out, repositioned, lowered, and pressed into the wafer 11 to form a new cylindrical groove in the wafer 11 adjacent to the groove that has already been formed therein. As a result, the already formed groove and the newly formed cylindrical groove are joined to each other.

The above procedure is repeated to form a plurality of grooves in the wafer 11 along the four streets 13 that surround the defective device 15a. Consequently, a strip-shaped groove 93 is formed in the face side 11a of the wafer 11 along the four streets 13. The groove 93 is formed from the cylindrical grooves that have been formed in the wafer 11 and joined together by being laterally enlarged along the streets 13.

As described above, the groove 93 is formed in the wafer 11 by performing the fracturing process on the wafer 11 along the streets 13 that surround the defective device 15a. Thereafter, the reverse side 11b of the wafer 11 is ground until the region processed by the fracturing process, i.e., the groove 93, is exposed on the reverse side 11b of the wafer 11.

Figure 24A:
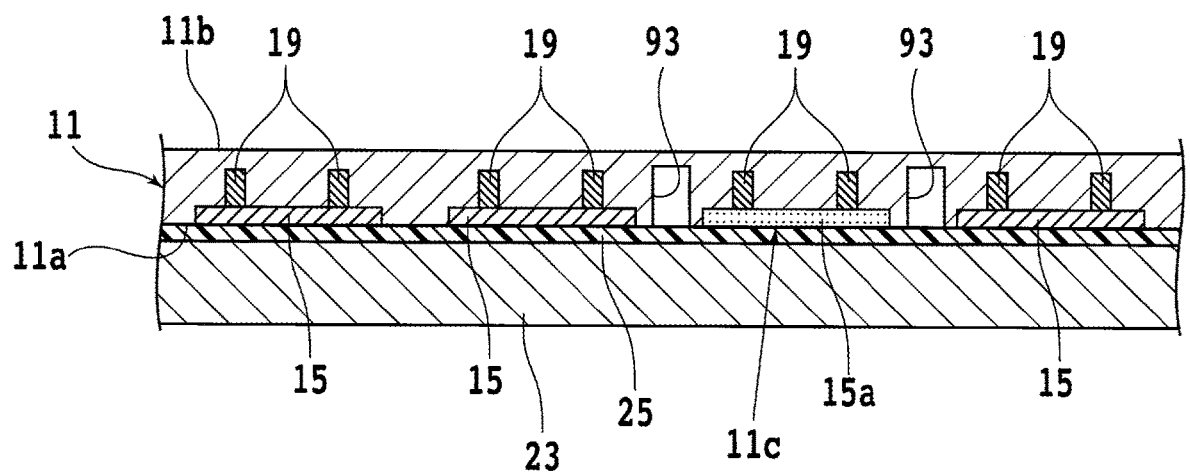
FIG. 24A is a fragmentary cross-sectional view of the wafer that has been fixed to the support board.

For grinding the wafer 11, the wafer 11 is fixed to the support board 23. FIG. 24A illustrates in fragmentary cross section the wafer 11 that has been fixed to the support board 23. For grinding the reverse side 11b of the wafer 11, the face side 11a of the wafer 11 is fixed to the support board 23 with the adhesive layer 25 interposed therebetween.

Then, the grinding apparatus 2 (see FIG. 2) grinds the wafer 11. Specifically, the grindstones 16 are brought into abrasive contact with the reverse side 11b of the wafer 11, thereby grinding the reverse side 11b of the wafer 11. The wafer 11 is ground and thinned down until the grooves 93 are exposed on the reverse side 11b of the wafer 11.

Figure 24B:
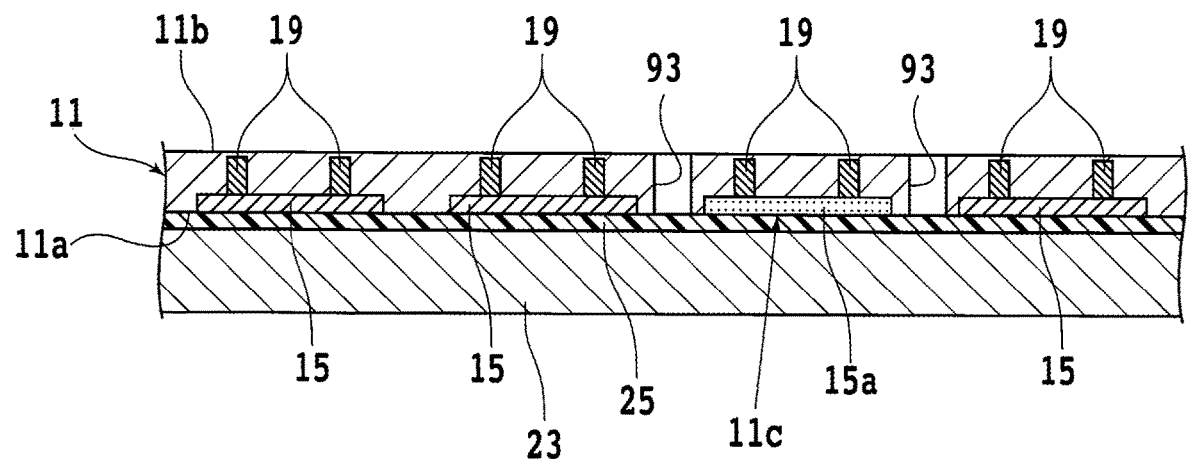
FIG. 24B is a fragmentary cross-sectional view of the wafer after it has been ground.

FIG. 24B illustrates in fragmentary cross section the wafer 11 after it has been ground. When the groove 93 is exposed on the reverse side 11b of the wafer 11, the defective device region 11c is divided from the wafer 11. Thereafter, according to the same procedure as with the first embodiment, the defective device region 11c is separated from the wafer 11, leaving the through hole 11d in the wafer 11 (see FIGS. 8A, 8B, and 9).

In the removing step, the defective device region 11c may be separated from the wafer 11 by forming a through hole extending through the wafer 11 according to the fracturing process. Specifically, a through hole extending from the face side 11a to the reverse side 11b of the wafer 11 is formed in the wafer 11 along the streets 13 by the fracturing process.

Figure 25A:
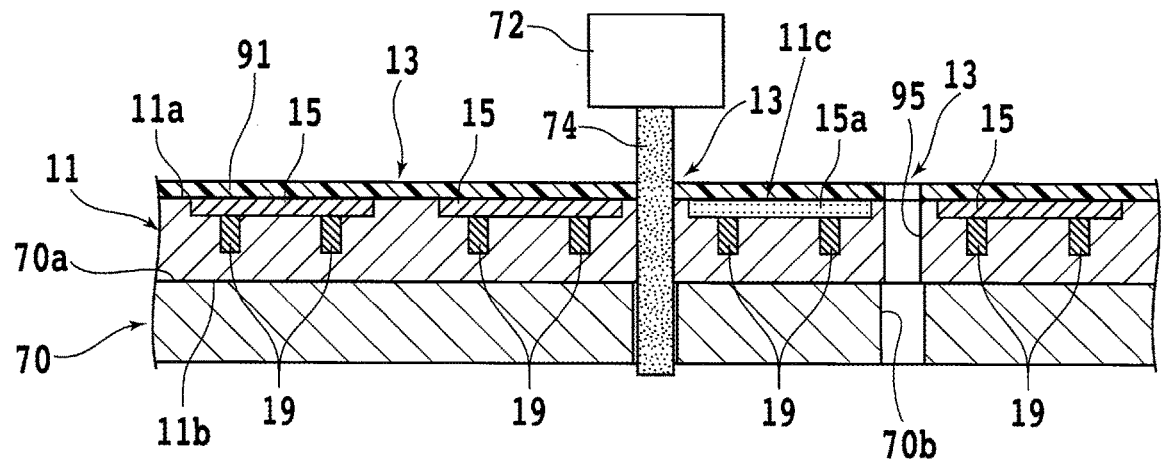
FIG. 25A is a fragmentary cross-sectional view of the wafer in which a through hole is formed by a sandblasting process.

FIG. 25A illustrates in fragmentary cross section the wafer 11 in which a through hole 95 is formed by a sandblasting process. For forming the through hole 95 in the wafer 11 according to the fracturing process, the holding table 70 has an opening 70b defined therein that extends vertically through the holding table 70. The opening 70b is of a rectangular shape as viewed in plan so as to be commensurate with the four streets 13 surrounding the semiconductor device 15. The wafer 11 is placed on the holding table 70 such that the four streets 13 surrounding the defective device 15a overlie the opening 70b.

Then, the abrasive agent 74 is ejected from the sandblasting unit 72 to the wafer 11 along the four streets 13 that surround the defective device 15a. The abrasive agent 74 is ejected under ejecting conditions that are established to form a hole extending through the wafer 11 from the face side 11a to the reverse side 11b thereof in the region of the wafer 11 upon which the abrasive agent 74 impinges.

Therefore, when the abrasive agent 74 is ejected to the wafer 11 along the streets 13, a strip-shaped through hole 95 extending from the face side 11a to the reverse side 11b of the wafer 11 is formed in the wafer 11 along the streets 13. The through hole 95 is of a rectangular shape surrounding the defective device 15a as viewed in plan. As a result, the defective device region 11c is divided from the wafer 11.

Figure 25B:
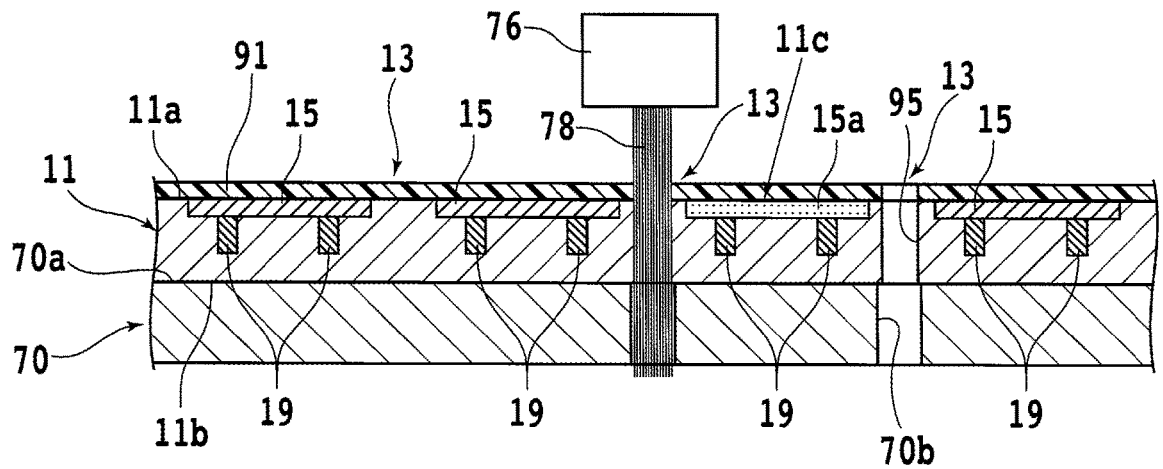
FIG. 25B is a fragmentary cross-sectional view of the wafer in which a through hole is formed by a water jetting process.

FIG. 25B illustrates in fragmentary cross section the wafer 11 in which a through hole 95 is formed by a water jetting process. For forming the through hole 95 in the wafer 11 according to the water jetting process, the liquid 78 ejected from the water jetting unit 76 is applied to the wafer 11 along the four streets 13 that surround the defective device 15a. The liquid 78 is ejected from the water jetting unit 76 under ejecting conditions that are established to form a hole extending through the wafer 11 from the face side 11a to the reverse side 11b thereof in the region of the wafer 11 upon which the liquid 78 impinges.

Therefore, when the liquid 78 is ejected to the wafer 11 along the streets 13, a strip-shaped through hole 95 extending from the face side 11a to the reverse side 11b of the wafer 11 is formed in the wafer 11 along the streets 13. The through hole 95 is of a rectangular shape surrounding the defective device 15a as viewed in plan. As a result, the defective device region 11c is divided from the wafer 11.

Figure 25C:
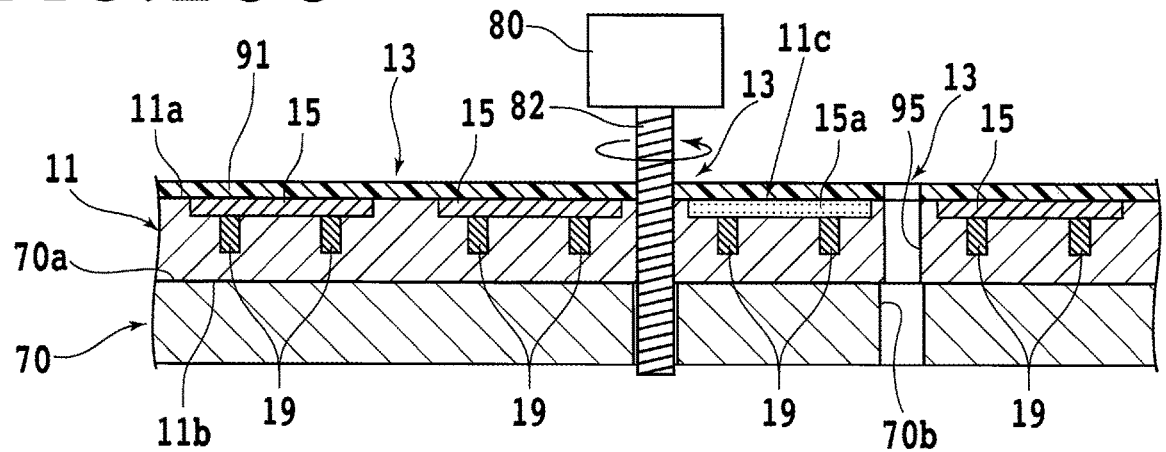
FIG. 25C is a fragmentary cross-sectional view of the wafer in which a through hole is formed by a drilling process.

FIG. 25C illustrates in fragmentary cross section the wafer 11 in which a through hole 95 is formed by a drilling process. For forming the through hole 95 in the wafer 11 according to the drilling process, the drill bit 82 is rotated about its central axis and at the same time the drill bit 82 is brought into contact with and pressed into the wafer 11, thereby forming a cylindrical hole in the wafer 11 that extends from the face side 11a to the reverse side 11b thereof.

The above procedure is repeated to form a plurality of holes in the wafer 11 along the four streets 13 that surround the defective device 15a. Each of the holes is formed so as to be joined to one of those holes that have already been formed in the wafer 11. As a result, a strip-shaped through hole 95 extending from the face side 11a to the reverse side 11b of the wafer 11 is formed in the wafer 11 along the streets 13, thereby dividing the defective device region 11c from the wafer 11.

When the sandblasting process (see FIG. 25A) is carried out, the abrasive agent 74 that has passed through the through hole 95 in the wafer 11 is discharged through the openings 70b in the holding table 70. Similarly, when the water jetting process (see FIG. 25B) is carried out, the liquid 78 that has passed through the through hole 95 in the wafer 11 is discharged through the openings 70b in the holding table 70. Consequently, the abrasive agent 74 or the liquid 78 is prevented from impinging upon the holding surface 70a of the holding table 70 and from damaging the holding table 70.

When the drilling process (see FIG. 25C) is carried out, the drill bit 82 has its tip end portion inserted in the opening 70b in the holding table 70. Therefore, the drill bit 82 is prevented from contacting the holding table 70 and from damaging the holding table 70.

In FIGS. 25A, 25B, and 25C, the wafer 11 is illustrated as being processed from the face side 11a thereof. However, the wafer 11 may be processed from the reverse side 11b thereof. Specifically, the abrasive agent 74 or the liquid 78 may be supplied to impinge upon the reverse side 11b of the wafer 11, and the drill bit 82 may be brought into contact with the reverse side 11b of the wafer 11.

Figure 26:
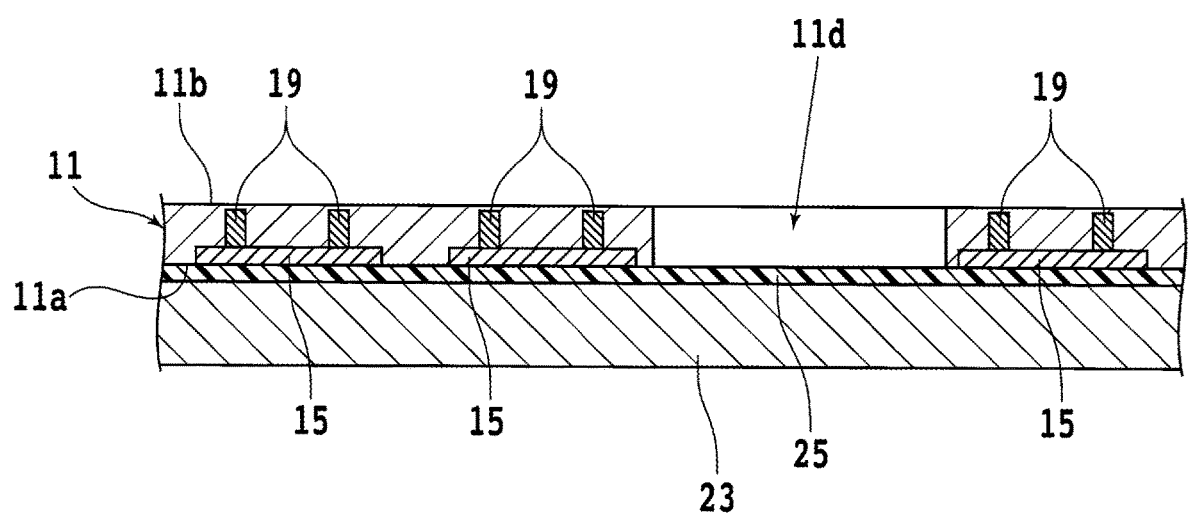
FIG. 26 is a fragmentary cross-sectional view of the wafer that has been fixed to the support board.

Then, the protective layer 91 is removed from the wafer 11, and the defective device region 11c is separated from the wafer 11. Thereafter, the wafer 11 is fixed to the support board 23. FIG. 26 illustrates in fragmentary cross section the wafer 11 that has been fixed to the support board 23. For example, the face side 11a of the wafer 11 is fixed to the support board 23 with the adhesive layer 25 interposed therebetween.

The wafer 11 that has the through hole 11d formed therein by the fracturing process may be etched. For example, a gas in a plasma state may be supplied to the through hole 11d in the wafer 11 to perform plasma etching in the through hole 11d. Furthermore, an etching solution may be supplied to the through hole 11d in the wafer 11 to perform wet etching in the through hole 11d.

Figure 27:
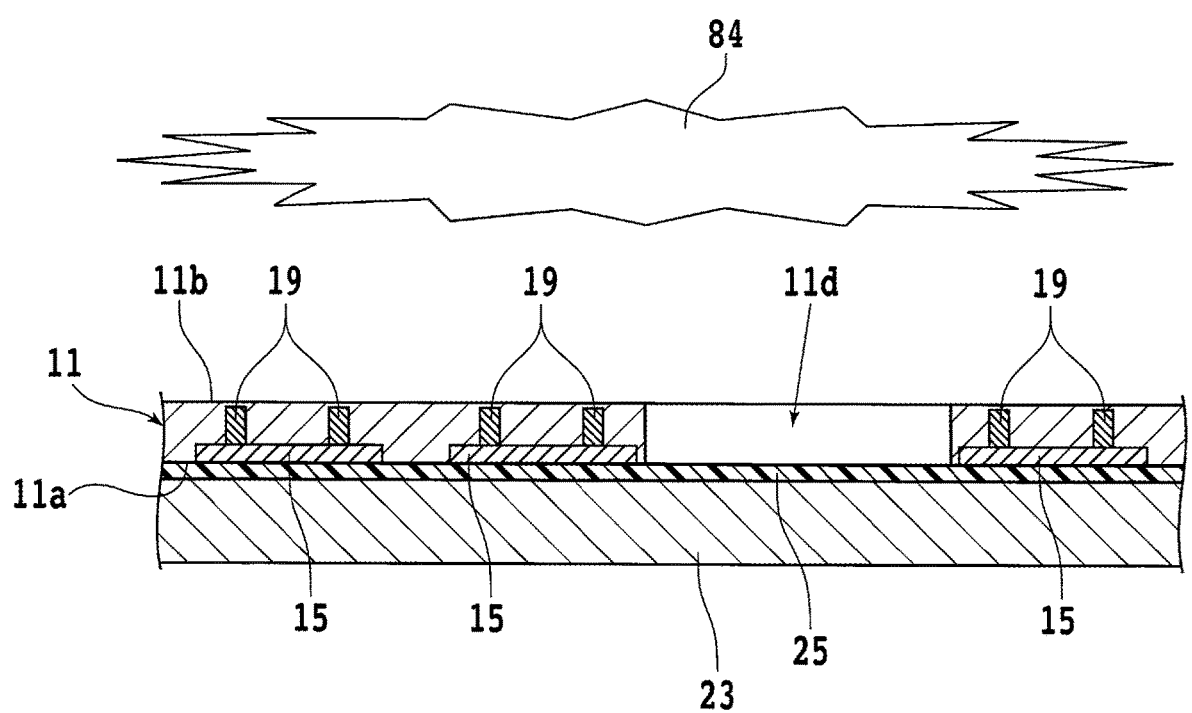
FIG. 27 is a fragmentary cross-sectional view of the wafer when it is processed by plasma etching.

FIG. 27 illustrates in fragmentary cross section the wafer 11 when it is processed by plasma etching. When a plasmatized gas 84 for etching, i.e., an etching gas, is supplied to the wafer 11, plasma etching is performed on the inner wall surface of the through hole 11d, thereby increasing the size of the through hole 11d. Moreover, minute surface irregularities formed on the inner wall surface of the through hole 11d by the fracturing process are removed by plasma etching.

Figure 28A:
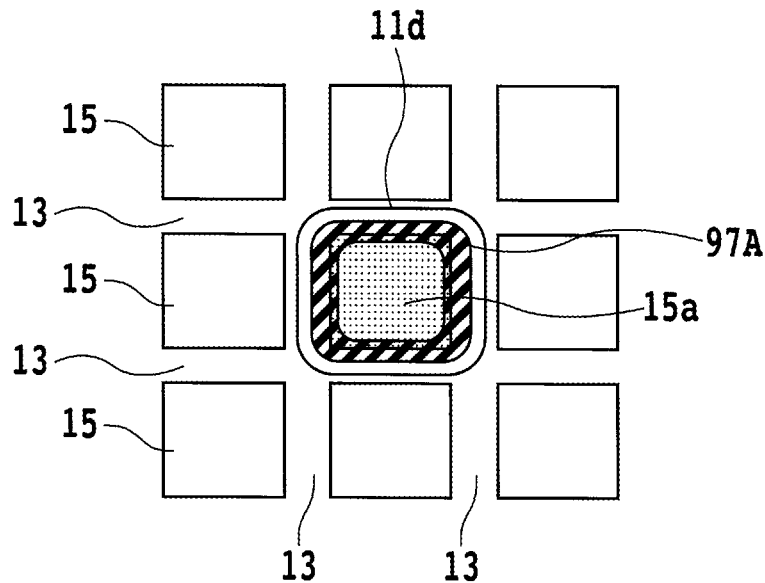
FIG. 28A is a plan view illustrating a region that is to be processed by a sandblasting process or a water jetting process.
Figure 28B:
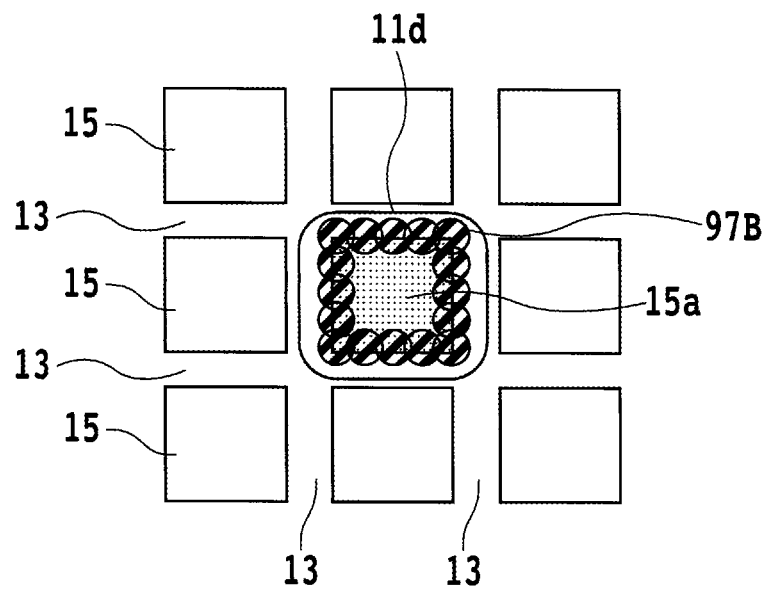
FIG. 28B is a plan view illustrating a region that is to be processed by a drilling process.

FIG. 28A illustrates in plan a region, i.e., a to-be-processed region, 97A that is to be processed by a sandblasting process or a water jetting process. FIG. 28B illustrates in plan a region, i.e., a to-be-processed region, 97B that is to be processed by a drilling process. In FIGS. 28A and 28B, the regions 97A and 97B are illustrated patterned.

For processing the wafer 11 according to the sandblasting process, the abrasive agent 74 is ejected to the region 97A along an outer peripheral edge of the defective device 15a, for example. Similarly, for processing the wafer 11 according to the water jetting process, the liquid 78 is ejected to the region 97A along an outer peripheral edge of the defective device 15a, for example. In this fashion, the groove 93 (see FIGS. 23A and 23B) or the through hole 95 (see FIGS. 25A and 25B) is formed in the wafer 11 in surrounding relation to the defective device 15a. The abrasive agent 74 and the liquid 78 may be ejected to impinge upon part of the defective device 15a or may be ejected only to the streets 13 so as not to impinge upon the defective device 15a.

For processing the wafer 11 according to the drilling process, the drill bit 82 successively processes a plurality of regions 97B along an outer peripheral edge of the defective device 15a. Each of the regions 97B is set to overlap part of another adjacent region 97B, thereby forming the groove 93 (see FIG. 23C) or the through hole 95 (see FIG. 25C) that surrounds the defective device 15a. The drill bit 82 may contact part of the defective device 15a or may contact only the streets 13 so as not to contact the defective device 15a.

For processing the wafer 11 according to the drilling process, moreover, while the drill bit 82 is present in the wafer 11 (see FIGS. 23C and 25C), the drill bit 82 may be rotated about its central axis and moved horizontally along the streets 13 to form the groove 93 or the through hole 95. In this case, it is not necessary to lift and lower the drill bit 82 a number of times on the streets 13.

Then, the enlarging step (see FIG. 16B) is performed on the wafer 11 in which the through hole 11d has been formed. The through hole 11d thus has an increased width, so that the enlarged through hole 11d is formed in the wafer 11 as illustrated in FIGS. 28A and 28B. In the enlarging step, an etching process, i.e., plasma etching, wet etching, or the like, may be performed on the wafer 11 to remove minute surface irregularities remaining in the regions 97A and 97B on which the fracturing process has been performed.

As described above, the defective device region 11c can be separated from the wafer 11 by the fracturing process in the removing step. Those steps included in the removing step that have been omitted from description according to the present embodiment are identical to those according to the first embodiment. According to the present embodiment, moreover, the steps other than the removing step, i.e., the wafer preparing step, the grinding step, the enlarging step, the inlaying step, the resin filling step, the resin grinding step, the wafer stacking step, the dividing step, etc., can be carried out in the same manner as with the first embodiment. Furthermore, the present embodiment can appropriately be combined with the other embodiments.

Third Embodiment

In the first embodiment and the second embodiment, it has been described by way of example that the defective device region 11c is separated from the wafer 11 by processing the wafer 11 along the streets 13 in the removing step. However, there is no limitation on how to remove the defective device region 11c from the wafer 11. In the present embodiment, there will be described a process of breaking and removing the defective device region 11c by applying a laser beam thereto in the removing step after the wafer preparing step and the grinding step (see FIG. 2) have been carried out.

Figure 29A:
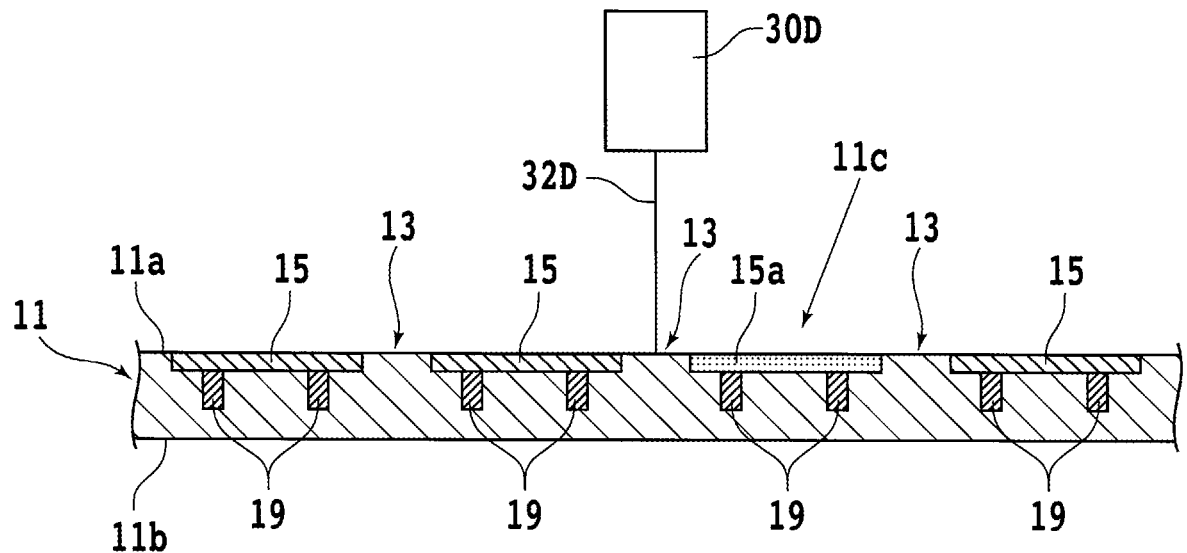
FIG. 29A is a fragmentary cross-sectional view of the wafer to which a laser beam is applied.

FIG. 29A illustrates in fragmentary cross section the wafer 11 to which a laser beam 32D is applied. For breaking the defective device region 11c by applying a laser beam thereto, a laser applying unit 30D for applying the laser beam 32D to the wafer 11 is used. The laser applying unit 30D is structurally identical to the laser applying unit 30A (see FIG. 4A).

However, the laser beam 32D is applied to a region of the wafer 11 under beam applying conditions that are established to remove the region of the wafer 11 by way of ablation. Specifically, the laser beam 32D has a wavelength that is selected such that at least part of the laser beam 32D is absorbed by the wafer 11. In other words, the laser applying unit 30D applies the laser beam 32D whose wavelength is absorbable by the wafer 11. Other beam applying conditions under which the laser beam 32D is applied to the wafer 11 are also established to perform ablation appropriately on the wafer 11.

For example, the laser beam 32D is applied to the face side 11a of the wafer 11. Specifically, while a focused spot of the laser beam 32D is being positioned inwardly of the four streets 13 surrounding the defective device 15a, the laser beam 32D is applied to the wafer 11. The defective device region 11c is thus processed by ablation and hence broken. As a result, a groove, i.e., a recess, is formed in the face side 11a of the wafer 11.

Figure 29B:
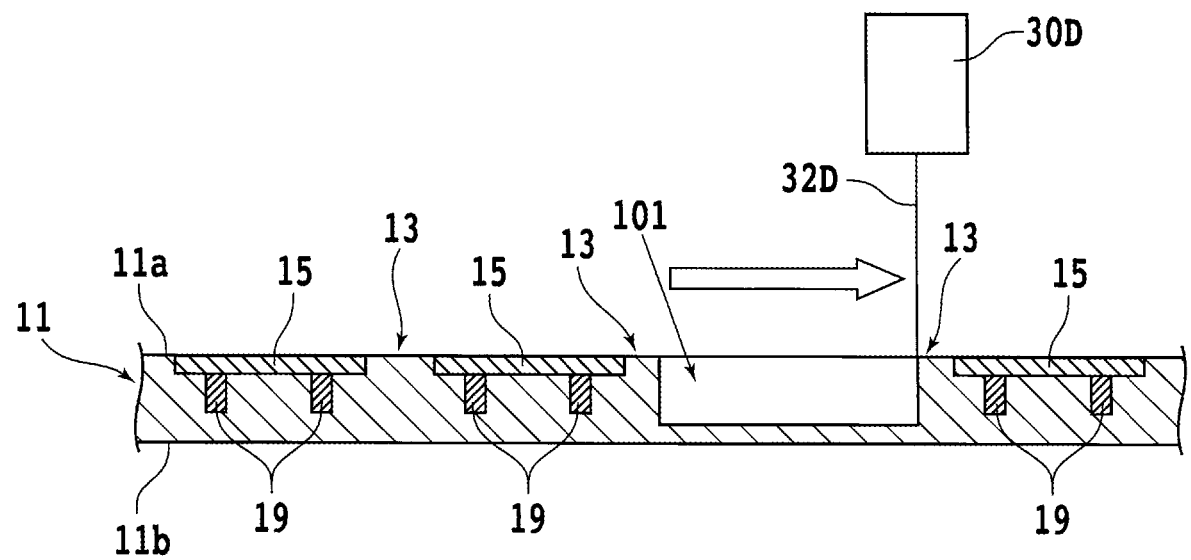
FIG. 29B is a fragmentary cross-sectional view of the wafer in which a groove is formed.

FIG. 29B illustrates in fragmentary cross section the wafer 11 in which a groove, i.e., a removed region, 101 is formed. For example, the laser beam 32D is scanned so as to be applied to an entire region of a rectangular shape as viewed in plan that is positioned inwardly of the four streets 13 surrounding the defective device 15a. As a consequence, the groove 101, shaped as a rectangular parallelepiped, is formed in the face side 11a of the wafer 11 by way of ablation. The depth of the groove 101 is adjusted so as to position the bottom surface of the groove 101 below the lower ends of the electrodes 19. As a result, the defective device 15a and the electrodes 19 connected thereto are removed.

Figure 30:
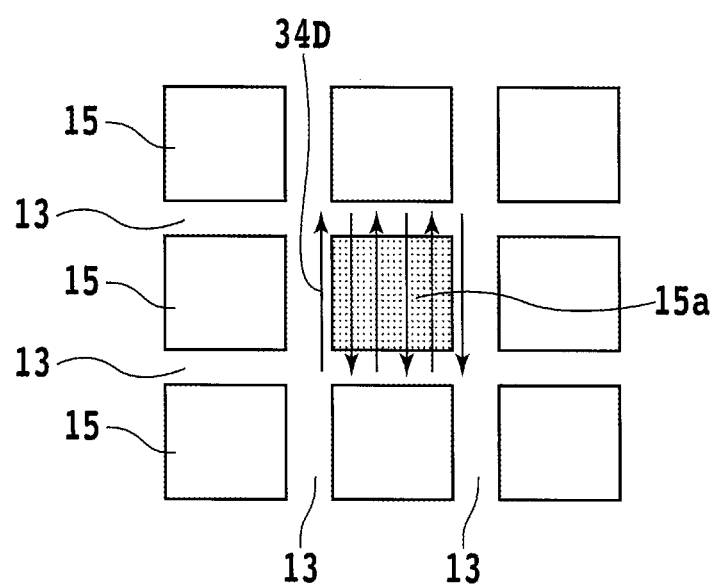
FIG. 30 is a plan view illustrating scanning routes along which a laser beam is scanned.

FIG. 30 illustrates in plan scanning routes 34D along which the laser beam 32D is scanned. For example, a plurality of scanning routes 34A are established that extend from one end of the defective device region 11c toward the other end thereof. The laser beam 32D is scanned along the scanning routes 34D in reciprocating strokes between one end and the other end of the defective device region 11c. In this manner, the laser beam 32D is applied to the defective device region 11c in its entirety, removing the defective device region 11c from the wafer 11. However, insofar as the laser beam 32D is able to remove the defective device region 11c, the laser beam 32D is not limited to any scanning routes.

For forming the groove 101 in the wafer 11, the face side 11a of the wafer 11 may be covered with a protective film and the laser beam 32D may be applied to the wafer 11 through the protective film. For example, the protective film may be a resin tape or a film made of a water-soluble resin such as PVA or PEG. If the protective film is formed on the face side 11a of the wafer 11, it can prevent swarf or debris produced by ablation from being deposited on the face side 11a of the wafer 11, thereby avoiding contamination of the wafer 11 and the semiconductor devices 15.

Figure 31A:
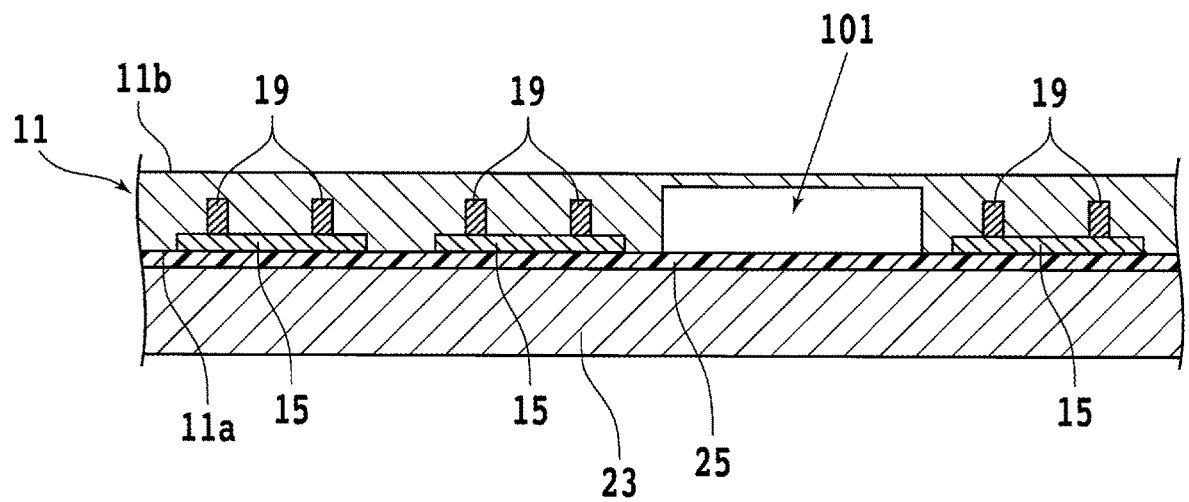
FIG. 31A is a fragmentary cross-sectional view of the wafer that has been fixed to the support board.

Then, the reverse side 11b of the wafer 11 is ground to expose the processed region, i.e., the groove 101, processed by the applied laser beam 32D on the reverse side 11b of the wafer 11. For grinding the wafer 11, the wafer 11 is first fixed to a support board. FIG. 31A illustrates in fragmentary cross section the wafer 11 that has been fixed to the support board 23. For grinding the reverse side 11b of the wafer 11, the face side 11a of the wafer 11 is fixed to the support board 23 with the adhesive layer 25 interposed therebetween.

Then, the wafer 11 is ground by the grinding apparatus 2 (see FIG. 2). Specifically, the grinding apparatus 2 grinds the reverse side 11b of the wafer 11 by holding the grindstones 16 in abrasive contact with the reverse side 11b of the wafer 11. The wafer 11 is ground and thinned down until the groove 101 is exposed on the ground reverse side 11b of the wafer 11.

Figure 31B:
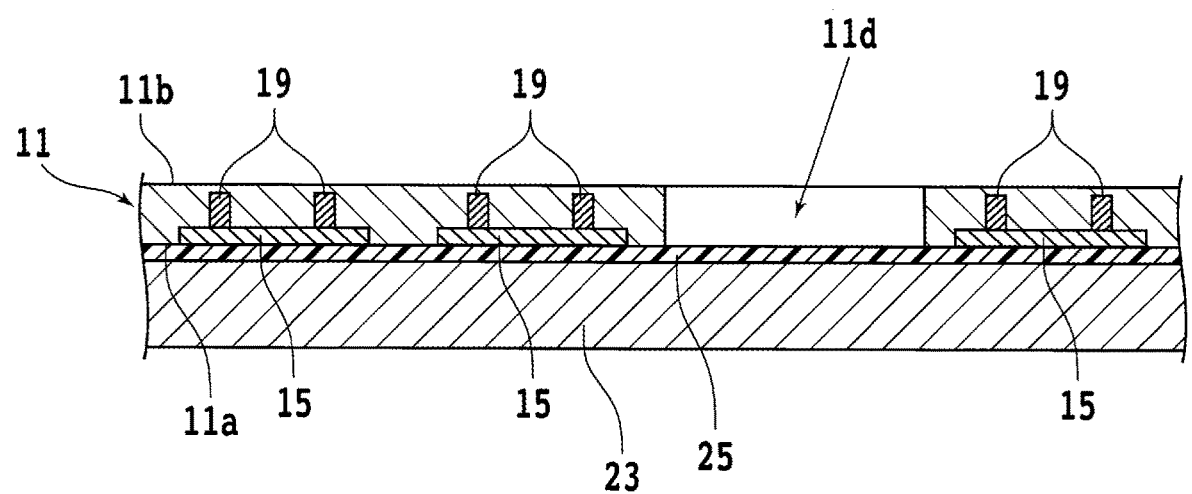
FIG. 31B is a fragmentary cross-sectional view of the wafer after it has been ground.

FIG. 31B illustrates in fragmentary cross section the wafer 11 after it has been ground. When the groove 101 is exposed on the reverse side 11b of the wafer 11, the through hole 11d that extends from the face side 11a to the reverse side 11b is formed in the wafer 11.

In the removing step, the through hole 11d may directly be formed in the wafer 11 by the laser beam 32D applied thereto. Specifically, the through hole 11d that extends from the face side 11a to the reverse side 11b of the wafer 11 is formed in the wafer 11 by ablation.

Figure 32A:
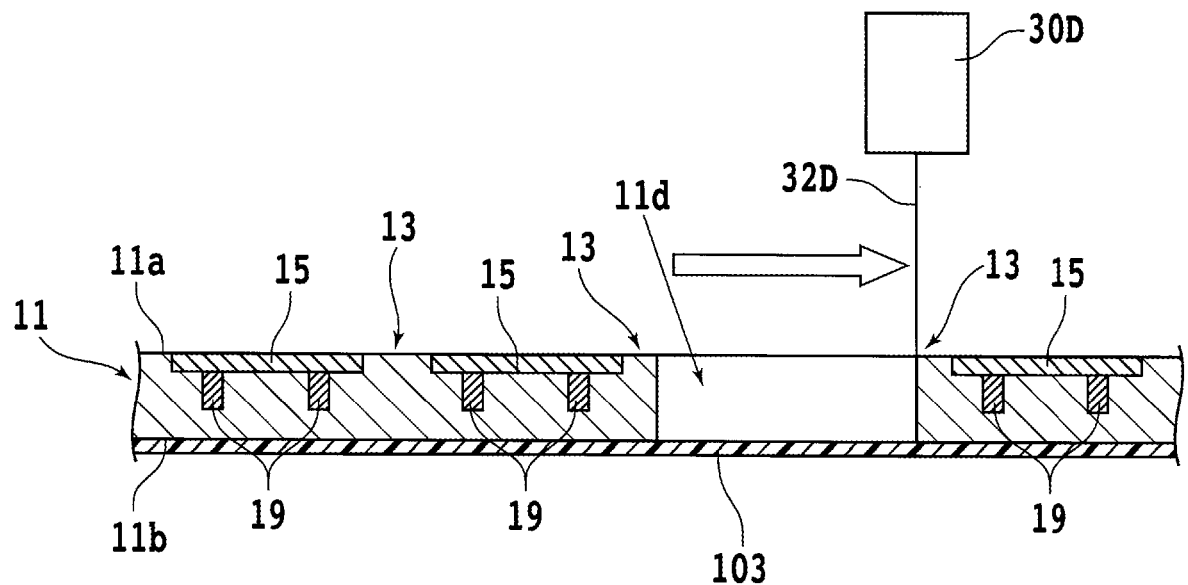
FIG. 32A is a fragmentary cross-sectional view of the wafer to which a laser beam is applied.

FIG. 32A illustrates in fragmentary cross section the wafer 11 to which the laser beam 32D is applied. First, a protective member 103 such as a tape is affixed to the wafer 11. When the laser beam 32D is to be applied to the face side 11a of the wafer 11, for example, the protective member 103 is affixed to the reverse side 11b of the wafer 11. The protective member 103 is made of the same material as the protective member (see FIG. 2) by way of example.

Then, while a focused spot of the laser beam 32D is being positioned inwardly of the four streets 13 surrounding the defective device 15a, the laser beam 32D is applied to the wafer 11. The laser beam 32D is not limited to any particular scanning routes. For example, the laser beam 32D is scanned along the scanning routes 34D illustrated in FIG. 30.

The laser beam 32D is applied under beam applying conditions that are established to remove a region of the wafer 11 that extends from the face side 11a to the reverse side 11b thereof by way of ablation. Therefore, when the application of the laser beam 32D to the wafer 11 is completed, the through hole 11d that extends through the wafer 11 from the face side 11a to the reverse side 11b thereof is formed in the wafer 11.

Figure 32B:
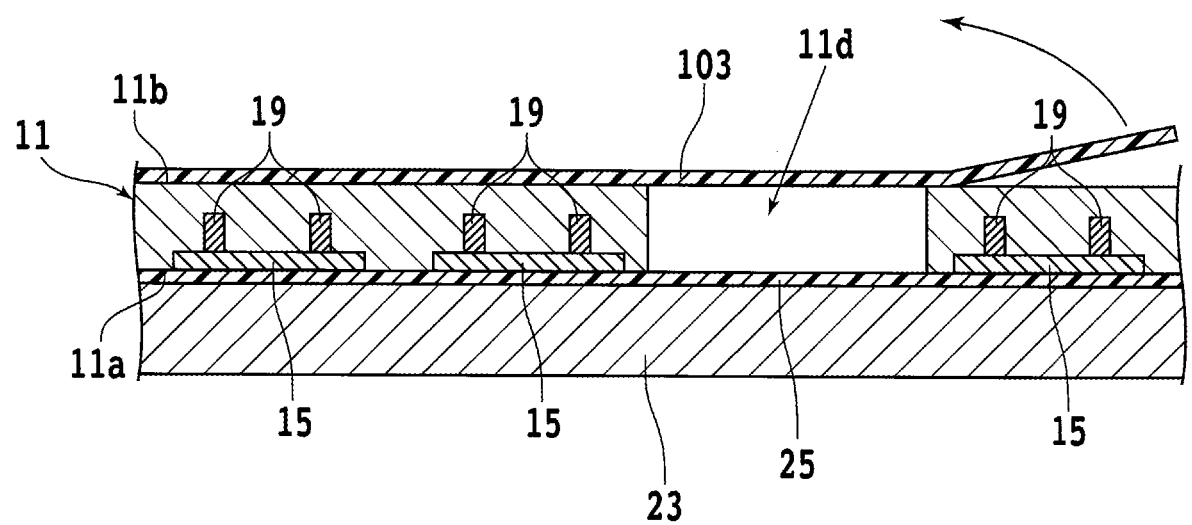
FIG. 32B is a fragmentary cross-sectional view of the wafer that has been fixed to the support board.

Thereafter, the wafer 11 is fixed to a support board. FIG. 32B illustrates in fragmentary cross section the wafer 11 that has been fixed to the support board 23. After the through hole 11d has been formed in the wafer 11, the support board 23 is fixed to the face side 11a of the wafer 11 with the adhesive layer 25 interposed therebetween. Thereafter, the protective member 103 is peeled off from the reverse side 11b of the wafer 11.

For forming the through hole 11d, a laser beam applied through a liquid, i.e., aqua laser, may be used. In this case, the laser applying unit 30D may incorporate an ejection unit for ejecting a liquid toward the wafer 11. The laser applying unit 30D ejects a liquid to form the liquid column 50 (see FIG. 13A) and also applies the laser beam 32D to the wafer 11. At this time, the laser beam 32D has its focused spot positioned within the liquid column 50. The laser beam 32D is applied through the liquid column 50 to the defective device region 11c, thereby removing the defective device region 11c.

An etching process may be performed on the wafer 11 in which the through hole 11d has been formed by breaking the defective device region 11c (see FIGS. 31B and 32A). For example, a gas in a plasma state may be supplied to the through hole 11d in the wafer 11 to perform plasma etching in the through hole 11d. Furthermore, an etching solution may be supplied to the through hole 11d in the wafer 11 to perform wet etching in the through hole 11d.

In the removing step, as described above, the defective device region 11c can be removed from the wafer 11 by applying the laser beam to break the defective device region 11c. Those steps included in the removing step that have been omitted from description according to the present embodiment are identical to those according to the first embodiment. According to the present embodiment, moreover, the steps other than the removing step, i.e., the wafer preparing step, the grinding step, the enlarging step, the inlaying step, the resin filling step, the resin grinding step, the wafer stacking step, the dividing step, etc., can be carried out in the same manner as with the first embodiment. Furthermore, the present embodiment can appropriately be combined with the other embodiments.

Fourth Embodiment

In the third embodiment, it has been described by way of example that the defective device region 11c is broken by the applied laser beam in the removing step. However, there is no limitation on how to break the defective device region 11c. In the present embodiment, there will be described a process of breaking and removing the defective device region 11c according to a fracturing process in the removing step after the wafer preparing step and the grinding step (see FIG. 2) have been carried out.

The fracturing process according to the present embodiment is not limited to any types as long as it can process the wafer 11. A sandblasting process using the sandblasting unit 72 (see FIG. 23A, etc.), a water jetting process using the water jetting unit 76 (see FIG. 23B, etc.), and a drilling process using the drilling unit 80 (see FIG. 23C, etc.) will be described below as specific examples of the fracturing process.

Figure 33:
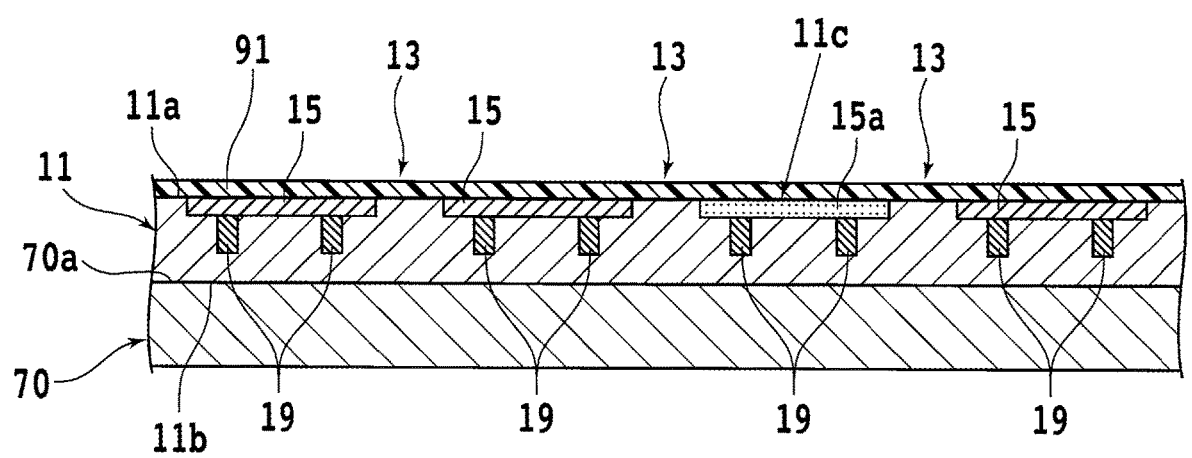
FIG. 33 is a fragmentary cross-sectional view of the wafer that has been held on a holding table.

FIG. 33 illustrates in fragmentary cross section the wafer 11 that has been held on the holding table 70. For performing the fracturing process, a protective layer 91 is first formed on the wafer 11. In the case where the face side 11a of the wafer 11 is to be processed, for example, the face side 11a of the wafer 11 is covered with the protective layer 91, protecting the semiconductor devices 15. If it is unlikely for the fracturing process to damage the semiconductor devices 15, then the formation of the protective layer 91 may be omitted.

Then, the wafer 11 is held on the holding table 70. For example, the wafer 11 is placed on the holding table 70 such that the face side 11a of the wafer 11 is exposed upwardly and the reverse side 11b thereof faces the holding surface 70a. Then, the fracturing process is performed on the wafer 11 held on the holding table 70.

Figure 34A:
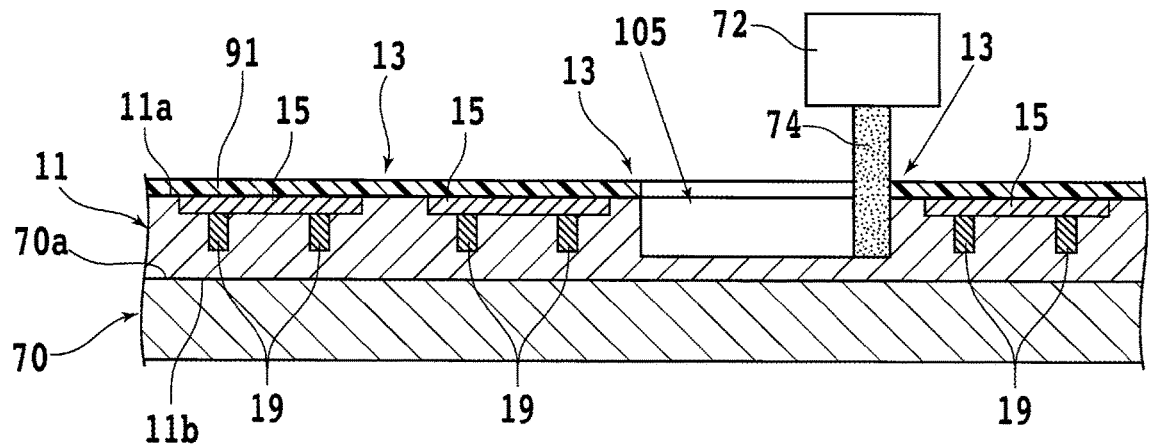
FIG. 34A is a fragmentary cross-sectional view of the wafer from which a defective device region is removed by a sandblasting process.

FIG. 34A illustrates in fragmentary cross section the wafer 11 from which the defective device region 11c is removed by a sandblasting process. When the sandblasting process is carried out, the abrasive agent 74 is ejected from the sandblasting unit 72 to the wafer 11 inwardly of the four streets 13 that surround the defective device 15a (see FIG. 33). As a result, the region of the wafer 11 upon which the abrasive agent 74 has impinged is broken, forming a groove, i.e., a removed region, 105 shaped as a rectangular parallelepiped in the face side 11a of the wafer 11.

Figure 34B:
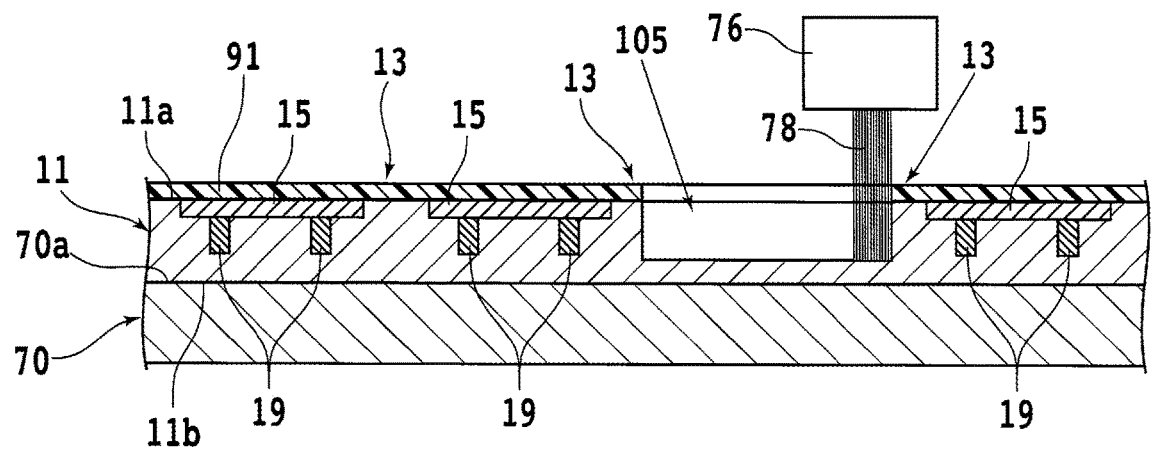
FIG. 34B is a fragmentary cross-sectional view of the wafer from which a defective device region is removed by a water jetting process.

FIG. 34B illustrates in fragmentary cross section the wafer 11 from which the defective device region 11c is removed by a water jetting process. When the water jetting process is carried out, the pressurized liquid 78 is ejected from the water jetting unit 76 to the wafer 11 inwardly of the four streets 13 that surround the defective device 15a (see FIG. 33). As a result, the region of the wafer 11 upon which the liquid 78 has impinged is broken, forming a groove 105 shaped as a rectangular parallelepiped in the face side 11a of the wafer 11.

The groove 105 is formed in the entire region where at least the defective device 15a is formed. The depth of the groove 105 is adjusted so as to position the bottom surface of the groove 105 below the lower ends of the electrodes 19. As a result, the defective device 15a and the electrodes 19 connected thereto are removed.

Figure 34C:
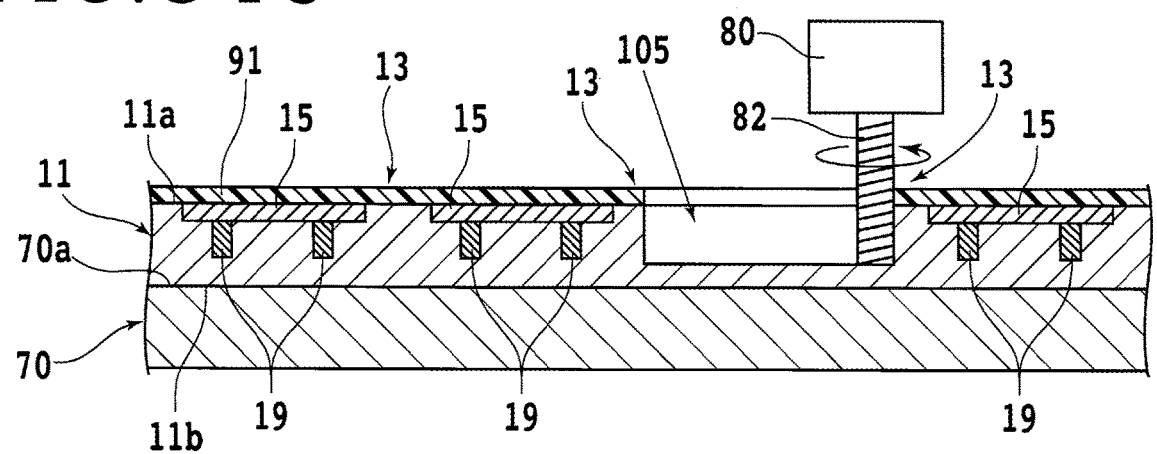
FIG. 34C is a fragmentary cross-sectional view of the wafer from which a defective device region is removed by a drilling process.

FIG. 34C illustrates in fragmentary cross section the wafer 11 from which the defective device region 11c is removed by a drilling process. When the drilling process is carried out, the rotating drill bit 82 is brought into contact with the wafer 11 inwardly of the four streets 13 that surround the defective device 15a (see FIG. 33) and pressed into the wafer 11 to form a plurality of columnar grooves in the wafer 11. The columnar grooves are formed so as to be interconnected in the entire region where the defective device 15a is formed. The depth of the grooves is adjusted so as to position the bottom surfaces of the grooves 105 below the lower ends of the electrodes 19. As a result, a groove 105 is formed in face side 11a of the wafer 11 from the joined grooves, so that the defective device 15a and the electrodes 19 connected thereto are removed.

As described above, the defective device 15a is broken by performing the fracturing process on the wafer 11 inwardly of the streets 13 that surround the defective device 15a. The defective device 15a is thus removed from the wafer 11.

Figure 35A:
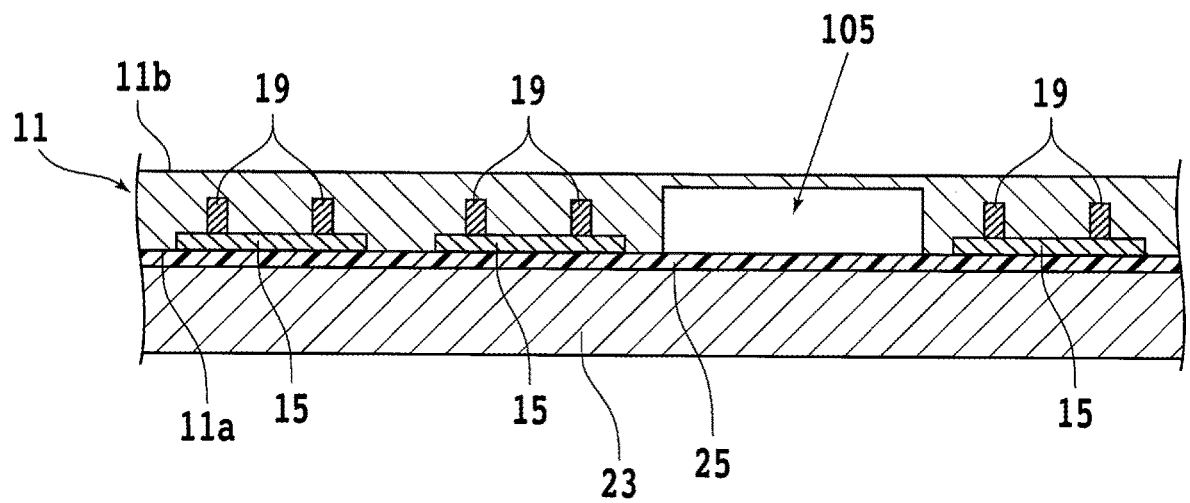
FIG. 35A is a fragmentary cross-sectional view of the wafer that has been fixed to the support board.

Then, the reverse side 11b of the wafer 11 is ground until the processed region, i.e., the groove 105, processed by the fracturing process is exposed on the ground reverse side 11b of the wafer 11. For grinding the wafer 11, the wafer 11 is first fixed to the support board 23. FIG. 35A illustrates in fragmentary cross section the wafer 11 that has been fixed to the support board 23. For grinding the reverse side 11b of the wafer 11, the face side 11a of the wafer 11 is fixed to the support board 23 with the adhesive layer 25 interposed therebetween.

Then, the grinding apparatus 2 (see FIG. 2) grinds the wafer 11. Specifically, the grindstones 16 are brought into abrasive contact with the reverse side 11b of the wafer 11, thereby grinding the reverse side 11b of the wafer 11. The wafer 11 is ground and thinned down until the groove 105 is exposed on the reverse side 11b of the wafer 11.

Figure 35B:
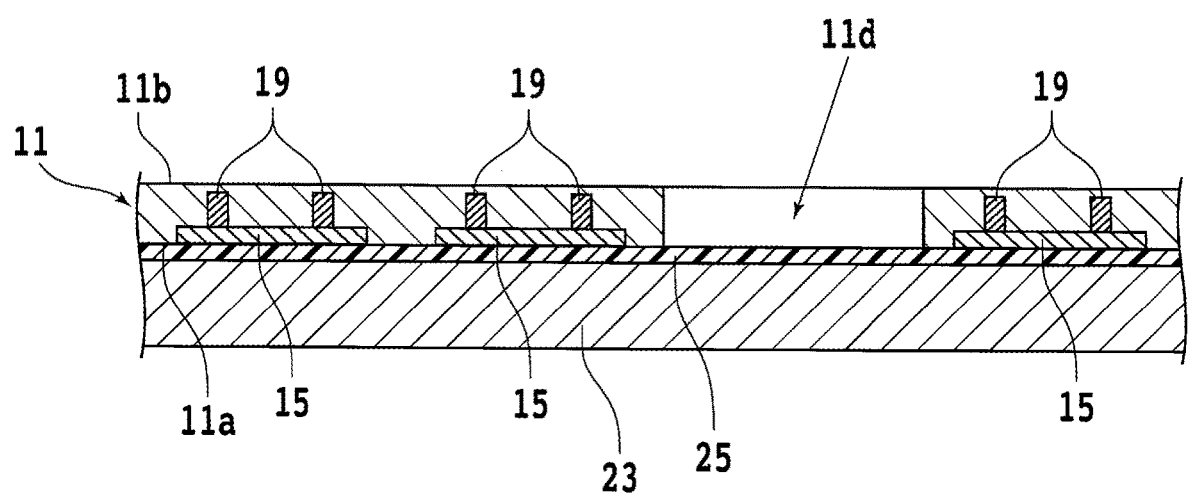
FIG. 35B is a fragmentary cross-sectional view of the wafer after it has been ground.

FIG. 35B illustrates in fragmentary cross section the wafer 11 after it has been ground. When the groove 105 is exposed on the reverse side 11b of the wafer 11, a through hole 11d shaped as a rectangular parallelepiped extending from the face side 11a to the reverse side 11b of the wafer 11 is formed in the wafer 11.

In the removing step, the through hole 11d may directly be formed in the wafer 11 by the fracturing process. Specifically, the through hole 11d that extends from the face side 11a to the reverse side 11b of the wafer 11 is formed in the wafer 11 by the fracturing process.

Figure 36A:
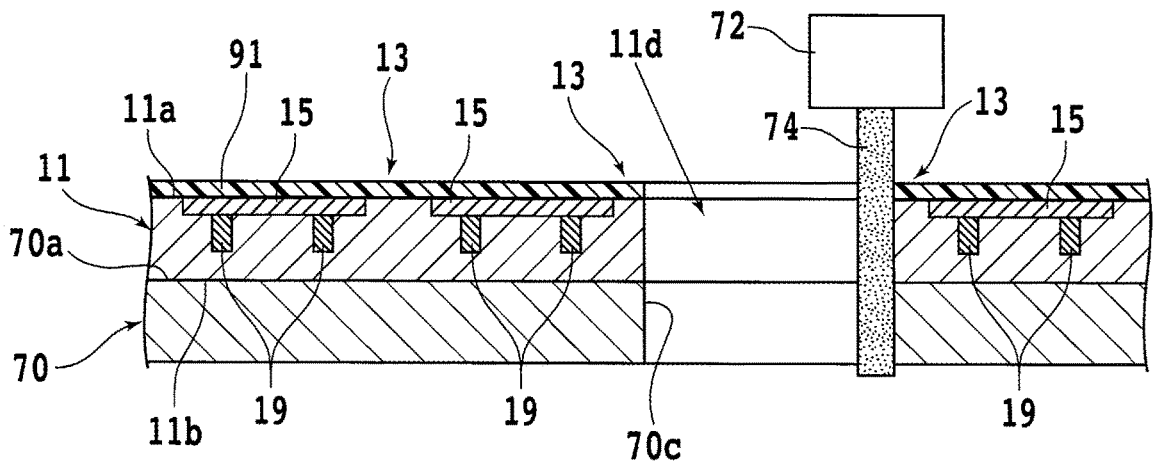
FIG. 36A is a fragmentary cross-sectional view of the wafer in which a through hole is formed by a sandblasting process.

FIG. 36A illustrates in fragmentary cross section the wafer 11 in which the through hole 11d is formed by a sandblasting process. For forming the through hole 11d in the wafer 11 according to the fracturing process, the holding table 70 has an opening 70c defined therein that extends vertically through the holding table 70. The wafer 11 is placed on the holding table 70 such that an inner region of the four streets 13 surrounding the defective device 15a overlies the opening 70c.

Then, the abrasive agent 74 is ejected from the sandblasting unit 72 to the entire region of the wafer 11 that lies inwardly of the four streets 13 that surround the defective device 15a (see FIG. 33). The abrasive agent 74 is ejected under ejecting conditions that are established to remove the region of the wafer 11 upon which the abrasive agent 74 has impinged from the face side 11a to the reverse side 11b of the wafer 11. As a result, the defective device region 11c is removed, leaving the through hole 11d in the wafer 11.

Figure 36B:
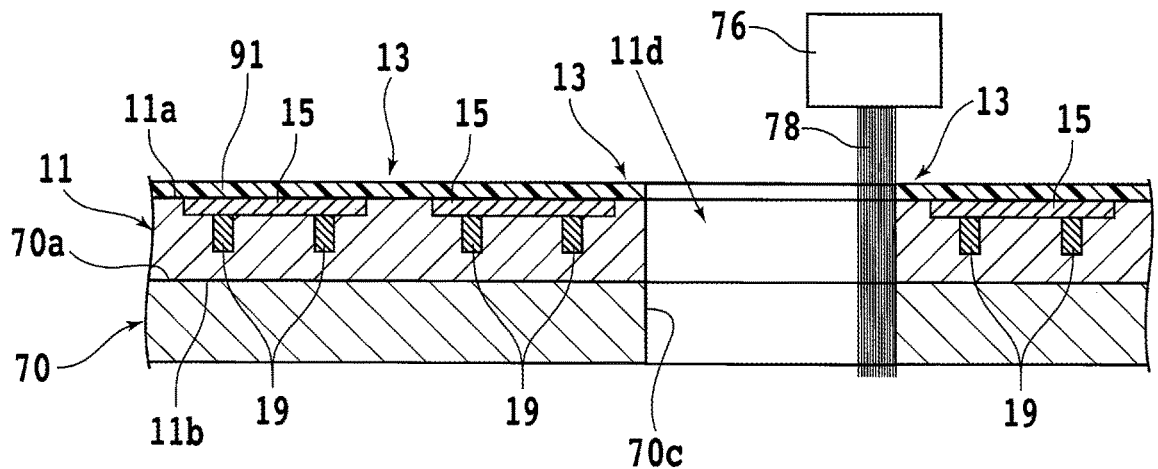
FIG. 36B is a fragmentary cross-sectional view of the wafer in which a through hole is formed by a water jetting process.

FIG. 36B illustrates in fragmentary cross section the wafer 11 in which the through hole 11d is formed by a water jetting process. For performing the water jetting process, the liquid 78 ejected from the water jetting unit 76 is applied to the entire region of the wafer 11 that lies inwardly of the four streets 13 that surround the defective device 15a (see FIG. 33). The liquid 78 is ejected under ejecting conditions that are established to remove the region of the wafer 11 upon which the liquid 78 has impinged from the face side 11a to the reverse side 11b of the wafer 11. As a result, the defective device region 11c is removed, leaving the through hole 11d in the wafer 11.

Figure 36C:
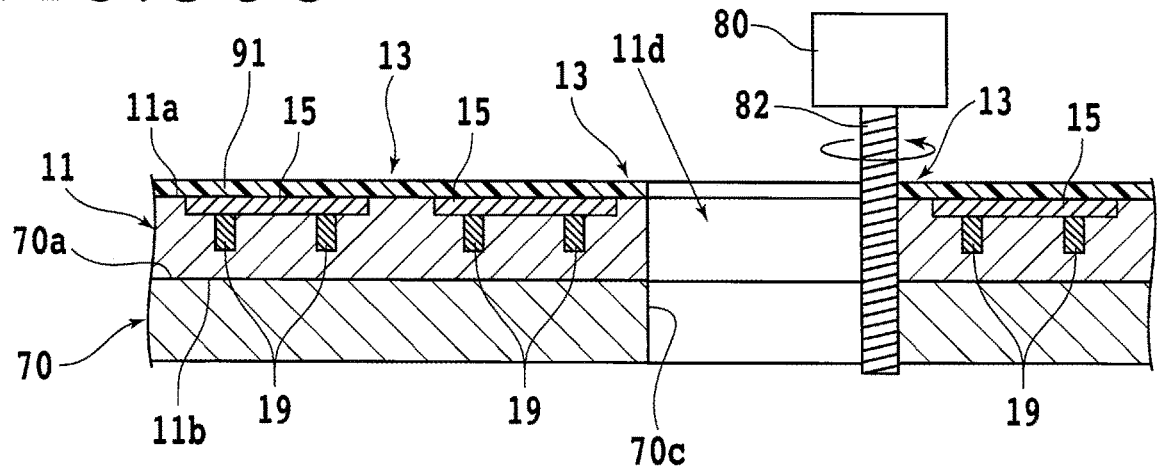
FIG. 36C is a fragmentary cross-sectional view of the wafer in which a through hole is formed by a drilling process.

FIG. 36C illustrates in fragmentary cross section the wafer 11 in which the through hole 11d is formed by a drilling process. For performing the drilling process, the rotating drill bit 82 is brought into contact with the region of the wafer 11 that lies inwardly of the four streets 13 that surround the defective device 15a (see FIG. 33) and pressed into the wafer 11 to form a plurality of columnar grooves in the wafer 11.

The drill bit 82 processes the wafer 11 until the lower end of the drill bit 82 reaches the reverse side 11b of the wafer 11. As a result, each of the grooves is formed in the wafer 11 so as to extend from the face side 11a to the reverse side 11b thereof. The grooves are formed so as to be joined together in the entire region where at least the defective device 15a is formed. As a consequence, a through hole 11d is formed in the wafer 11 from the joined grooves.

When the sandblasting process (see FIG. 36A) is performed, the abrasive agent 74 that has passed through the through hole 11d in the wafer 11 is discharged through the openings 70c in the holding table 70. Similarly, when the water jetting process (see FIG. 36B) is carried out, the liquid 78 that has passed through the through hole 11d in the wafer 11 is discharged through the openings 70c in the holding table 70. Consequently, the abrasive agent 74 or the liquid 78 is prevented from impinging upon the holding surface 70a of the holding table 70 and from damaging the holding table 70.

When the drilling process (see FIG. 36C) is carried out, the drill bit 82 has its tip end portion inserted in the opening 70c in the holding table 70. Therefore, the drill bit 82 is prevented from contacting the holding table 70 and from damaging the holding table 70.

In FIGS. 36A, 36B, and 36C, the wafer 11 is illustrated as being processed from the face side 11a thereof. However, the wafer 11 may be processed from the reverse side 11b thereof. Specifically, the abrasive agent 74 or the liquid 78 may be applied to impinge upon the reverse side 11b of the wafer 11, and the drill bit 82 may be brought into contact with the reverse side 11b of the wafer 11.

Figure 37:
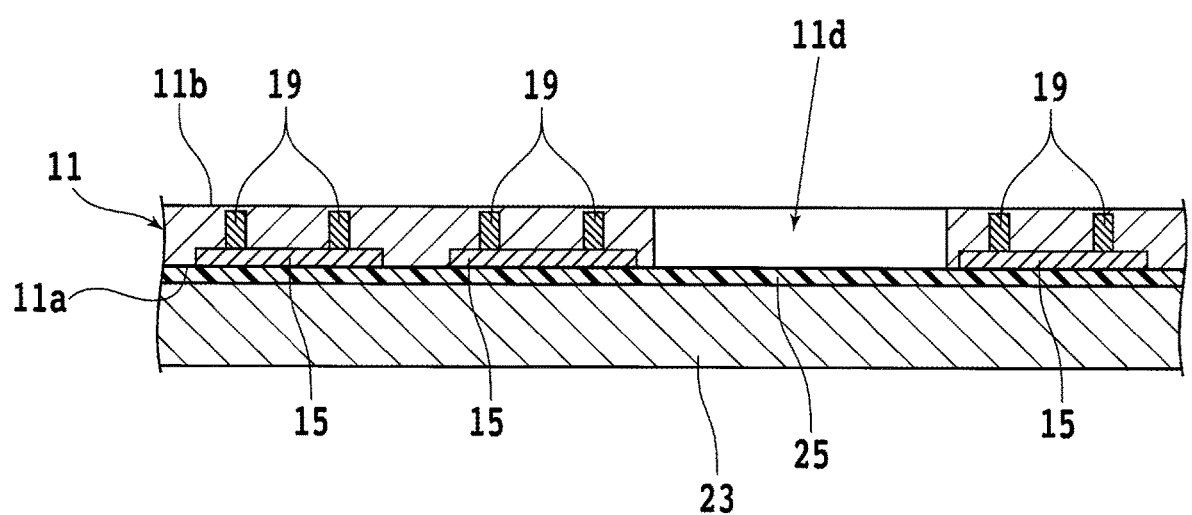
FIG. 37 is a fragmentary cross-sectional view of the wafer that has been fixed to the support board.

Thereafter, the wafer 11 from which the defective device region 11c has been removed, leaving the through hole 11d therein, is fixed to the support board 23. FIG. 37 illustrates in fragmentary cross section the wafer 11 that has been fixed to the support board 23. For example, the face side 11a of the wafer 11 is fixed to the support board 23 with the adhesive layer 25 interposed therebetween.

An etching process may be performed on the wafer 11 in which the through hole 11d has been formed by the fracturing process. For example, a gas in a plasma state may be supplied to the through hole 11d in the wafer 11 to perform plasma etching in the through hole 11d (see FIG. 27). Furthermore, an etching solution may be supplied to the through hole 11d in the wafer 11 to perform wet etching in the through hole 11d. The etching process thus performed on the wafer 11 enlarges the through hole 11d and removes minute surface irregularities formed on the inner wall surfaces of the through hole 11d by the fracturing process.

Figure 38A:
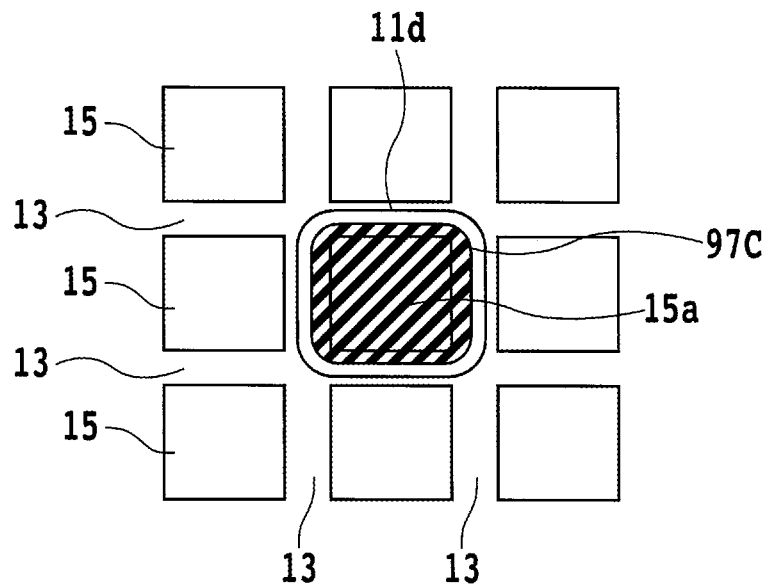
FIG. 38A is a plan view illustrating a region that is to be processed by a sandblasting process or a water jetting process.
Figure 38B:
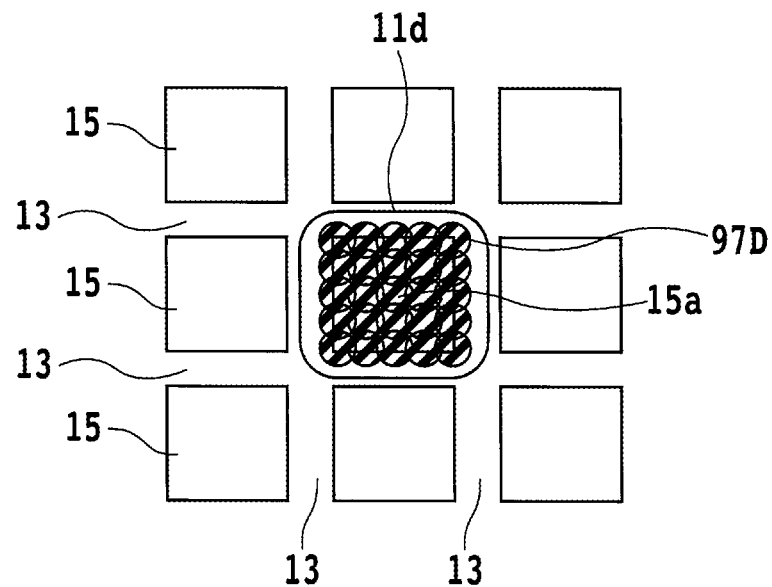
FIG. 38B is a plan view illustrating a region that is to be processed by a drilling process.

The region of the wafer 11 on which the fracturing process is to be performed is appropriately set such that the through hole 11d is formed inwardly of the fourth streets 13 that surround at least the defective device 15a (see FIG. 33). FIG. 38A illustrates in plan a region, i.e., a to-be-processed region, 97C that is to be processed by a sandblasting process or a water jetting process. FIG. 38B illustrates in plan a region, i.e., a to-be-processed region, 97D that is to be processed by a drilling process. In FIGS. 38A and 38B, the regions 97C and 97D are illustrated patterned.

For processing the wafer 11 according to the sandblasting process, the abrasive agent 74 is ejected to the region 97C including the defective device 15a in its entirety. Similarly, for processing the wafer 11 according to the water jetting process, the liquid 78 is ejected to the region 97C including the defective device 15a in its entirety. In this fashion, the groove 105 (see FIGS. 34A and 34B) or the through hole 11d (see FIGS. 36A and 36B) is formed in the wafer 11 in order to remove the defective device 15a. The abrasive agent 74 and the liquid 78 may be ejected to impinge upon part of the streets 13 surrounding the defective device 15a.

For processing the wafer 11 according to the drilling process, the drill bit 82 successively processes a plurality of regions 97D overlapping the defective device 15a. Each of the regions 97D is set to overlap part of another adjacent region 97D, thereby forming the groove 105 (see FIG. 34C) or the through hole 11d (see FIG. 36C) in order to remove the defective device 15a. The drill bit 82 may contact part of the streets 13 surrounding the defective device 15a.

For processing the wafer 11 according to the drilling process, moreover, while the drill bit 82 is present in the wafer 11 (see FIGS. 34C and 36C), the drill bit 82 may be rotated about its central axis and moved horizontally to form the groove 105 or the through hole 11d. In this case, it is not necessary to lift and lower the drill bit 82 a number of times.

Then, the enlarging step is performed on the wafer 11 in which the through hole 11d has been formed. The through hole 11d thus has an increased width, so that the enlarged through hole 11d is formed in the wafer 11 as illustrated in FIGS. 38A and 38B. In the enlarging step, an etching process, i.e., plasma etching, wet etching, or the like, may be performed on the wafer 11 to remove minute surface irregularities remaining in the regions 97C and 97D on which the fracturing process has been performed.

As described above, the defective device region 11c can be separated from the wafer 11 in the removing step by breaking the defective device region 11c by the fracturing process. Those steps included in the removing step that have been omitted from description according to the present embodiment are identical to those according to the first embodiment. According to the present embodiment, moreover, the steps other than the removing step, i.e., the wafer preparing step, the grinding step, the enlarging step, the inlaying step, the resin filling step, the resin grinding step, the wafer stacking step, the dividing step, etc., can be carried out in the same manner as with the first embodiment. Furthermore, the present embodiment can appropriately be combined with the other embodiments.

Fifth Embodiment

In the present embodiment, the relation between the step of removing the defective device region 11c from the wafer 11, i.e., the removing step, and the step of fixing the wafer 11 to the support board 23, i.e., a support board fixing step, will be described below. In the present embodiment, specifically, a process of fixing the wafer 11 to the support board 23 after the defective device region 11c has been removed from the wafer 11 will be described in detail below.

First, the grinding process (see FIG. 2) is performed, if necessary, on the wafer 11 prepared in the wafer preparing step (grinding step). Then, laser processing, the fracturing process, or the like is carried out on the wafer 11 to remove the defective device region 11c from the wafer 11 (removing step). Thereafter, the wafer 11 from which the defective device region 11c has been removed, leaving the through hole 11d in the wafer 11, is fixed to the support board 23 (support board fixing step).

Laser processing can be used to remove the defective device region 11c. For example, the defective device region 11c is removed from the wafer 11 by laser processing (see FIGS. 12A, 13A, etc.), and thereafter the wafer 11 is fixed to the support board 23 (see FIGS. 12B, 13B, etc.). Alternatively, for example, the defective device region 11c is broken by laser processing (see FIG. 32A, etc.), and thereafter the wafer 11 is fixed to the support board 23 (see FIG. 32B, etc.).

The fracturing process can be used to remove the defective device region 11c. For example, the defective device region 11c is removed from the wafer 11 by the fracturing process (see FIGS. 25A, 25B, 25C, etc.), and thereafter the wafer 11 is fixed to the support board 23 (see FIG. 26, etc.). Alternatively, for example, the defective device region 11c is broken by the fracturing process (see FIGS. 36A, 36B, 36C, etc.), and thereafter the wafer 11 is fixed to the support board 23 (see FIG. 37, etc.).

Then, the through hole 11d in the wafer 11 fixed to the support board 23 is enlarged (enlarging step, see FIG. 16B), and the device chip 59 is inlaid in the enlarged through hole 11d (inlaying step, see FIGS. 17 through 19C, etc.). In this fashion, a wafer 11 free of defective devices 15a is manufactured.

In the case where the support base fixing step is carried out after the removing step has been performed, the defective device region 11c has already been removed from the wafer 11 at the time the wafer 11 is fixed to the support board 23. Therefore, it is not necessary to perform a process of removing the defective device region 11c after the wafer 11 has been fixed to the support board 23. Consequently, it is possible to avoid the deposition of chips, i.e., swarf, produced when the wafer 11 is processed on the support board 23, thus preventing swarf that would otherwise be deposited on the support board 23 from disrupting the inlaying of the device chip 59 in the through hole 11d.

The process of fixing the wafer 11 to the support board 23 is not limited to any particular types. For example, the wafer 11 is fixed to the support board 23 with the adhesive layer 25 interposed therebetween. As described above, the adhesive layer 25 may be made of an adhesive including a thermosetting resin, an adhesive including a thermoplastic resin, or an adhesive including an ultraviolet-curable resin, or may be a sheet that can be fixed to the wafer 11 and the support board 23 when heated and pressed and that does not contain an adhesive, i.e., a thermocompression bonding sheet, a tape including a thermally foamable layer, or the like.

Thereafter, the resin filling step (see FIG. 20A), the resin grinding step (see FIG. 20B), the wafer stacking step (see FIG. 21), and the dividing step (see FIG. 22A) are successively carried out. In this manner, stacked device chips 81 including a plurality of stacked semiconductor devices are manufactured (see FIG. 22B).

As described above, a process of preventing swarf from being deposited on the support board 23 and inlaying the device chip 59 in the wafer 11 can smoothly be carried out by performing the support board fixing step after the removing step has been carried out. Those steps included in the removing step and the support board fixing step that have been omitted from description according to the present embodiment are identical to those according to the first embodiment. According to the present embodiment, moreover, the steps other than the removing step and the support board fixing step, i.e., the wafer preparing step, the grinding step, the enlarging step, the inlaying step, the resin filling step, the resin grinding step, the wafer stacking step, the dividing step, etc., can be carried out in the same manner as with the first embodiment. Furthermore, the present embodiment can appropriately be combined with the other embodiments.

Sixth Embodiment

In the present embodiment, the relation between the step of removing the defective device region 11c from the wafer 11, i.e., the removing step, and the step of fixing the wafer 11 to the support board 23, i.e., the support board fixing step, will be described below. In the present embodiment, specifically, a process of removing the defective device region 11c from the wafer 11 after the wafer 11 has been fixed to the support board 23 will be described in detail below.

First, the grinding process (see FIG. 2) is performed, if necessary, on the wafer 11 prepared in the wafer preparing step (grinding step). Then, the wafer 11 is fixed to the support board 23 (support board fixing step). Thereafter, the laser processing, the fracturing process, or the like is carried out on the wafer 11 to remove the defective device region 11c from the wafer 11 (removing step).

Laser processing can be used to remove the defective device region 11c. For example, laser processing is performed on the wafer 11 fixed to the support board 23 (see FIG. 4A, etc.), and thereafter the defective device region 11c is separated from the wafer (see FIG. 8B, etc.). Alternatively, for example, plasma etching is performed on the wafer 11 fixed to the support board 23 (see FIG. 14B, etc.), and thereafter the defective device region 11c is removed from the wafer 11 (see FIG. 8B, etc.).

Alternatively, for example, the wafer 11 in which grooves have been formed by laser processing, the fracturing process, or the like is fixed to the support board 23 (see FIGS. 11A, 24A, etc.). Thereafter, the wafer 11 is ground (see FIGS. 11B, 24B, etc.), removing the defective device region 11c from the wafer 11.

The process of fixing the wafer 11 to the support board 23 is not limited to any particular types. For example, the wafer 11 is fixed to the support board 23 with the adhesive layer 25 interposed therebetween. As described above, the adhesive layer 25 may be made of an adhesive including a thermosetting resin, an adhesive including a thermoplastic resin, or an adhesive including an ultraviolet-curable resin, or may be a sheet that can be fixed to the wafer 11 and the support board 23 when heated and pressed and that does not contain an adhesive, i.e., a thermocompression bonding sheet, a tape including a thermally foamable layer, or the like.

Then, the through hole 11d in the wafer 11 fixed to the support board 23 is enlarged (enlarging step, see FIG. 16B), and the device chip 59 is inlaid in the enlarged through hole 11d (inlaying step, see FIGS. 17 through 19C, etc.). In this fashion, a wafer 11 free of defective devices 15a is manufactured.

In the case where the removing step is carried out after the support base fixing step has been performed, as described above, the wafer 11 has been supported on the support board 23 at the time the defective device region 11c is removed from the wafer 11. Therefore, the inlaying step can successively be performed thereafter, so that the device chip 59 can smoothly be inlaid.

Furthermore, in the case where the removing step is carried out after the support base fixing step has been performed, the grinding process for dividing the defective device region 11c from the wafer 11 (see FIGS. 11B, 24B, etc.) is carried out after the process of fixing the wafer 11 to the support board 23. Therefore, it is not necessary to deliver the wafer 11 that tends to be deformed as it has been thinned down and bond the wafer 11 to the support board 23, resulting in an increase in operation efficiency and preventing the wafer from being damaged.

Thereafter, the resin filling step (see FIG. 20A), the resin grinding step (see FIG. 20B), the wafer stacking step (see FIG. 21), and the dividing step (see FIG. 22A) are successively carried out. In this manner, stacked device chips 81 including a plurality of stacked semiconductor devices are manufactured (see FIG. 22B).

As described above, since the removing step is carried out after the support base fixing step has been performed, a smooth transition can take place from the removing step to the inlaying step to be carried out thereafter. Those steps included in the removing step and the support board fixing step that have been omitted from description according to the present embodiment are identical to those according to the first embodiment. According to the present embodiment, moreover, the steps other than the removing step and the support board fixing step, i.e., the wafer preparing step, the grinding step, the enlarging step, the inlaying step, the resin filling step, the resin grinding step, the wafer stacking step, the dividing step, etc., can be carried out in the same manner as with the first embodiment. Furthermore, the present embodiment can appropriately be combined with the other embodiments.

Structures, methods, etc., according to each of the above embodiments may appropriately be changed or modified to practice unless the changes or modifications fall outside the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a wafer, comprising:
a wafer preparing step of preparing a wafer having semiconductor devices formed in a plurality of respective areas demarcated thereon by a plurality of intersecting streets;
a removing step of removing from the wafer a defective device region including a semiconductor device determined as a defective product among the semiconductor devices formed on the wafer;
an enlarging step of enlarging a removed region formed in the wafer by removing the defective device region from the wafer; and
an inlaying step of inlaying a device chip including a non-defective semiconductor device that is functionally identical to the semiconductor device determined as the defective product, in the enlarged removed region.

2. The method of manufacturing a wafer according to claim 1, wherein the enlarging step includes a step of enlarging the removed region by heating the wafer.

3. A method of manufacturing a stacked device chip, comprising:
a wafer preparing step of preparing a first wafer and a second wafer, each having semiconductor devices formed in a plurality of respective areas demarcated thereon by a plurality of intersecting streets;
a removing step of removing from the first wafer a defective device region including a semiconductor device determined as a defective product among the semiconductor devices formed on the first wafer;
an enlarging step of enlarging a removed region formed in the first wafer by removing the defective device region from the first wafer;
an inlaying step of inlaying a device chip including a non-defective semiconductor device that is functionally identical to the semiconductor device determined as the defective product, in the enlarged removed region;
a wafer stacking step of stacking the second wafer on the first wafer, thereby forming a stacked wafer; and
a dividing step of dividing the stacked wafer along the streets to form stacked device chips including a plurality of stacked semiconductor devices.

4. The method of manufacturing a stacked device chip according to claim 3, wherein the enlarging step includes a step of enlarging the removed region by heating the first wafer.

5. The method of manufacturing a stacked device chip according to claim 3, wherein the wafer stacking step includes the removing step, the enlarging step, and the inlaying step that are carried out on the second wafer stacked on the first wafer.

* * * * *